(12) United States Patent
Champion

(10) Patent No.: US 6,791,557 B2
(45) Date of Patent: Sep. 14, 2004

(54) TWO-DIMENSIONAL BUFFER PAGES USING BIT-FIELD ADDRESSING

(75) Inventor: Mark Champion, Kenmore, WA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 311 days.

(21) Appl. No.: 10/052,074

(22) Filed: Jan. 16, 2002

(65) Prior Publication Data

US 2002/0113904 A1 Aug. 22, 2002

Related U.S. Application Data

(60) Provisional application No. 60/269,784, filed on Feb. 15, 2001, provisional application No. 60/269,783, filed on Feb. 15, 2001, and provisional application No. 60/324,498, filed on Sep. 24, 2001.

(51) Int. Cl.$^7$ ................................. G09G 5/36
(52) U.S. Cl. ............ 345/545; 345/537; 345/540; 345/546; 711/127; 711/157
(58) Field of Search .................. 345/545, 546, 345/531, 537, 540; 711/127, 157, 168

(56) References Cited

U.S. PATENT DOCUMENTS

| | | | |
|---|---|---|---|
| 4,449,199 A | 5/1984 | Daigle | |
| 5,142,276 A | 8/1992 | Moffat | |
| 5,195,182 A | 3/1993 | Sasson | |
| 5,303,341 A | 4/1994 | Rivshin | |
| 5,479,605 A | * 12/1995 | Saitoh | ................. 345/561 |
| 5,559,953 A | 9/1996 | Seiler et al. | |
| 5,561,777 A | 10/1996 | Kao et al. | |
| 5,579,473 A | 11/1996 | Schlapp et al. | |
| 5,606,650 A | 2/1997 | Kelley et al. | |
| 5,619,471 A | 4/1997 | Nunziata | |
| 5,633,726 A | 5/1997 | Timmermans | |
| 5,781,201 A | 7/1998 | McCormack et al. | |
| 5,794,016 A | 8/1998 | Kelleher | |
| 5,798,843 A | * 8/1998 | Yamamoto et al. | ......... 358/404 |
| 5,815,167 A | 9/1998 | Muthal et al. | |
| 5,815,169 A | 9/1998 | Oda | |
| 5,924,111 A | * 7/1999 | Huang et al. | .................. 711/5 |
| 5,933,154 A | * 8/1999 | Howard et al. | ............. 345/540 |

(List continued on next page.)

OTHER PUBLICATIONS

Lieberman, David; *Sony champions MEMS display technology;* EE Times, Jul. 14, 2000; http://www.eetimes.com/story/OEG20000714S0004.

(List continued on next page.)

*Primary Examiner*—Matthew C. Bella
*Assistant Examiner*—Mackly Monestime
(74) *Attorney, Agent, or Firm*—Thomas F. Lebens; Fitch, Even, Tabin & Flannery

(57) ABSTRACT

Methods and apparatus for storing data using two-dimensional arrays mapped to memory locations. In one implementation, a buffer page system includes: a data source, providing data elements in a first order; a data destination, receiving data elements in a second order; at least one memory device, each memory device having a plurality of memory pages including a plurality of memory locations, each memory location having an address; and where each data element corresponds to an entry in one of a plurality of buffer pages, where each buffer page has a plurality of entries along a first dimension corresponding to the first order and a plurality of entries along a second dimension corresponding to the second order, where data elements are stored according to the first order using blocks of buffer pages, each block having a number of buffer pages equal to a power of 2, where data elements are stored to the memory device in the first order and retrieved from the memory device in the second order, and where at least one memory page stores data elements in multiple locations according to the first order and stores data elements in multiple locations according to the second order.

35 Claims, 32 Drawing Sheets

U.S. PATENT DOCUMENTS

| | | | |
|---|---|---|---|
| 6,005,592 | A | 12/1999 | Koizumi et al. |
| 6,031,638 | A | 2/2000 | Rao et al. |
| 6,111,992 | A | 8/2000 | Likhterov et al. |
| 6,177,922 | B1 * | 1/2001 | Schiefer et al. ............ 345/698 |
| 6,226,709 | B1 | 5/2001 | Goodwin et al. |
| 6,259,459 | B1 | 7/2001 | Middleton |
| 6,278,645 | B1 | 8/2001 | Buckelew et al. |
| 6,301,649 | B1 | 10/2001 | Takasugi |
| 6,331,854 | B1 * | 12/2001 | Rogers et al. ............ 345/473 |
| 6,347,344 | B1 | 2/2002 | Baker et al. |
| 6,417,867 | B1 | 7/2002 | Hallberg |
| 6,496,192 | B1 | 12/2002 | Shreesha et al. |
| 6,549,207 | B1 | 4/2003 | Mastsumoto |
| 6,567,531 | B1 | 5/2003 | Kondo et al. |
| 6,587,112 | B1 | 7/2003 | Goeltzenleuchter et al. |
| 2002/0109692 | A1 | 8/2002 | Champion |
| 2002/0109693 | A1 | 8/2002 | Champion et al. |
| 2002/0109694 | A1 | 8/2002 | Champion et al. |
| 2002/0109695 | A1 | 8/2002 | Champion et al. |
| 2002/0109696 | A1 | 8/2002 | Champion et al. |
| 2002/0109699 | A1 | 8/2002 | Champion |
| 2002/0110030 | A1 | 8/2002 | Champion |
| 2002/0130876 | A1 | 9/2002 | Champion |
| 2002/0149596 | A1 | 10/2002 | Champion |
| 2003/0058368 | A1 | 3/2003 | Champion |
| 2003/0151609 | A1 | 8/2003 | Champion |

OTHER PUBLICATIONS

U.S. patent application Ser. No. 09/907,852, Champion et al., filed Jul. 17, 2001.

U.S. patent application Ser. No. 09/907,854, Champion et al., filed Jul. 17, 2001.

U.S. patent application Ser. No. 09/908,295, Champion et al., filed Jul. 17, 2001.

U.S. patent application Ser. No. 09/908,301, Champion et al., filed Jul. 17, 2001.

U.S. patent application Ser. No. 10/051,538, Champion, filed Jan. 16, 2002.

U.S. patent application Ser. No. 10/051,541, Champion, filed Jan. 16, 2002.

U.S. patent application Ser. No. 10/051,680, Champion, filed Jan. 16, 2002.

*SMPTE Standard for Television 1920×1080 Scanning and Analog and Parallel Digital Interfaces for Multiple Picture Rates;* SMPTE 274–1998; Copyright 1998; pp. 1–24; Revision of ANSI/SMPTE 274M–1995; The Society of Motion Picture and Television Engineers; White Plains, New York.

Bloom, D.M.; *The Grating Light Valve: revolutionizing display technology;* pp. 1–10; Silicon Light Machines (formerly Echelle, Inc.).

Corrigan, R.W., et al.; *An Alternative Architecture for High Performance Display;* Presented at the 141st SMPTE Technical Conference and Exhibition; Nov. 20, 1999, New York, New York; pp. 1–5; Silicon Machines, Sunnyvale, CA.

Hearn, D., et al.; *Computer Graphics C Version* [2d Ed.]; pp. 53–56; Prentice Hall, Upper Saddle River, New Jersey.

McCarron, D., et al.; Accelerating PC Graphics, Emerging Technologies Edition, Market Strategy and Forecast Report; 1995; pp. 2–49 through 2–93, 2–159 (labeled as pp. 1–46); Mercury Research.

* cited by examiner

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

350  FIG. 3B
(Prior Art)

| 0 | 2 | 4 | 6 |
|---|---|---|---|
| 8 | 10 | 12 | 14 |
| 16 | 18 | 20 | 22 |
| 24 | 26 | 28 | 30 |

FIG. 3C  375
(Prior Art)

| 1 | 3 | 5 | 7 |
|---|---|---|---|
| 9 | 11 | 13 | 15 |
| 17 | 19 | 21 | 23 |
| 25 | 27 | 29 | 31 |

| 0 | 1 | ... | $2^{21}$-1 |

| 0 | 1 | ... | 255 |
| 256 | 257 | ... | 511 |
| | | ... | |
| (X*(Y-1)) | | ... | (X*Y-1) |

| A20 | ... | A8 | A7 | ... | A0 |

685  680

PIXELS

ADDRESSES

FIG. 9

|  | 0 | 1 | ... | 15 |
|---|---|---|---|---|
| 0 | 0 | 1 | ... | 15 |
| 1 | 1920 | 1921 | ... | 1935 |
| ... | ... | ... | ... | ... |
| 15 | 28800 | 28801 | ... | 28815 |

| PIXEL | FRAME ROW | FRAME COLUMN | PIXEL PAGE | PIXEL PAGE ROW | PIXEL PAGE COLUMN | MEMORY PAGE | MEMORY ADDRESS |
|---|---|---|---|---|---|---|---|
| 0 | 0 | 0 | 0 | 0 | 0 | 0 | 0 |
| 1 | 0 | 1 | 0 | 0 | 1 | 0 | 1 |
| 15 | 0 | 15 | 0 | 0 | 15 | 0 | 15 |
| 16 | 0 | 16 | 1 | 0 | 0 | 1 | 256 |
| 31 | 0 | 31 | 1 | 0 | 15 | 1 | 271 |
| 1919 | 0 | 1919 | 119 | 0 | 15 | 119 | 30479 |
| 1920 | 1 | 0 | 0 | 1 | 0 | 0 | 16 |
| 1921 | 1 | 1 | 0 | 1 | 1 | 0 | 17 |
| 1935 | 1 | 15 | 0 | 1 | 15 | 0 | 31 |
| 1936 | 1 | 16 | 1 | 1 | 0 | 1 | 272 |

| PIXEL | FRAME ROW | FRAME COLUMN | PIXEL PAGE | PIXEL PAGE ROW | PIXEL PAGE COLUMN | MEMORY PAGE | MEMORY ADDRESS |
|---|---|---|---|---|---|---|---|
| 0 | 0 | 0 | 0 | 0 | 0 | 0 | 0 |
| 1 | 0 | 1 | 0 | 0 | 1 | 0 | 1 |
| 15 | 0 | 15 | 0 | 0 | 15 | 0 | 15 |
| 16 | 0 | 16 | 1 | 0 | 0 | 1 | 256 |
| 31 | 0 | 31 | 1 | 0 | 31 | 1 | 271 |
| 1919 | 0 | 1919 | 119 | 0 | 15 | 119 | 30479 |
| 1920 | 1 | 0 | 0 | 1 | 0 | 0 | 16 |
| 28800 | 15 | 0 | 0 | 15 | 0 | 0 | 240 |
| 28815 | 15 | 15 | 0 | 15 | 15 | 0 | 255 |
| 28831 | 15 | 31 | 1 | 15 | 15 | 1 | 511 |
| 30719 | 15 | 1919 | 119 | 15 | 15 | 119 | 30719 |
| XXX | XXX | XXX | 120 | 0 | 0 | 120 | 30720 |
| 30720 | 16 | 0 | 128 | 0 | 0 | 128 | 32768 |
| 2073599 | 1079 | 1919 | 8695 | 7 | 15 | 8695 | 2226047 |
| XXX | XXX | XXX | 8704 | 0 | 0 | 8704 | 2228224 |

| PIXEL | FRAME ROW | FRAME COLUMN | PIXEL PAGE | PIXEL PAGE ROW | PIXEL PAGE COLUMN | MEMORY PAGE | MEMORY ADDRESS |
|---|---|---|---|---|---|---|---|
| 0 | 0 | 0 | 0 | 0 | 0 | 0 | 0 |
| 1 | 0 | 1 | 0 | 0 | 1 | 0 | 1 |
| 15 | 0 | 15 | 0 | 0 | 15 | 0 | 15 |
| 16 | 0 | 16 | 1 | 0 | 16 | 1 | 256 |
| 31 | 0 | 31 | 1 | 0 | 31 | 1 | 271 |
| 1919 | 0 | 1919 | 119 | 0 | 15 | 119 | 30479 |
| 1920 | 1 | 0 | 0 | 1 | 0 | 0 | 16 |
| 28800 | 15 | 0 | 0 | 15 | 0 | 0 | 240 |
| 28815 | 15 | 15 | 0 | 31 | 15 | 0 | 255 |
| 28831 | 15 | 31 | 1 | 31 | 15 | 1 | 511 |
| 30719 | 15 | 1919 | 119 | 31 | 15 | 119 | 30719 |
| 30720 | 16 | 0 | 120 | 0 | 0 | 120 | 30720 |
| 30848 | 16 | 128 | 128 | 0 | 0 | 128 | 32768 |
| 2073599 | 1079 | 1919 | 8159 | 7 | 15 | 8159 | 2088831 |
| XXX | XXX | XXX | 8159 | 15 | 15 | 8159 | 2088959 |

| PIXEL | FRAME ROW | FRAME COLUMN | PIXEL PAGE | PIXEL PAGE ROW | PIXEL PAGE COLUMN | MEMORY PAGE | MEMORY ADDRESS | MEMORY DEVICE |
|---|---|---|---|---|---|---|---|---|
| 0 | 0 | 0 | 0 | 0 | 0 | 0 | 0 | 0 |
| 1 | 0 | 1 | 0 | 0 | 1 | 0 | 0 | 1 |
| 15 | 0 | 15 | 0 | 0 | 15 | 0 | 7 | 1 |
| 16 | 0 | 16 | 0 | 0 | 16 | 0 | 8 | 0 |
| 31 | 0 | 31 | 0 | 0 | 31 | 0 | 15 | 1 |
| 1919 | 0 | 1919 | 59 | 0 | 31 | 59 | 15119 | 1 |
| 1920 | 1 | 0 | 0 | 1 | 0 | 0 | 16 | 0 |
| 28800 | 15 | 0 | 0 | 15 | 0 | 0 | 240 | 0 |
| 28815 | 15 | 15 | 0 | 15 | 15 | 0 | 247 | 1 |
| 28831 | 15 | 31 | 0 | 15 | 31 | 0 | 255 | 1 |
| 30719 | 15 | 1919 | 59 | 15 | 31 | 59 | 15359 | 1 |
| XXX | XXX | XXX | 60 | 0 | 0 | 60 | 15360 | 0 |
| 30720 | 16 | 0 | 64 | 0 | 0 | 64 | 16384 | 0 |
| 2073599 | 1079 | 1919 | 4347 | 7 | 31 | 4347 | 1112959 | 1 |
| XXX | XXX | XXX | 4352 | 0 | 0 | 4352 | 1114112 | 0 |

| PIXEL | FRAME ROW | FRAME COLUMN | PIXEL PAGE | PIXEL PAGE ROW | PIXEL PAGE COLUMN | MEMORY PAGE | MEMORY ADDRESS | MEMORY DEVICE |
|---|---|---|---|---|---|---|---|---|
| 0 | 0 | 0 | 0 | 0 | 0 | 0 | 0 | 0 |
| 1 | 0 | 1 | 0 | 0 | 1 | 0 | 0 | 1 |
| 15 | 0 | 15 | 0 | 0 | 15 | 0 | 7 | 1 |
| 16 | 0 | 16 | 0 | 0 | 16 | 0 | 8 | 0 |
| 31 | 0 | 31 | 0 | 0 | 31 | 0 | 15 | 1 |
| 1919 | 0 | 1919 | 59 | 0 | 31 | 59 | 15119 | 1 |
| 1920 | 1 | 0 | 0 | 1 | 0 | 0 | 16 | 0 |
| 28800 | 15 | 0 | 0 | 15 | 0 | 0 | 240 | 0 |
| 28815 | 15 | 15 | 0 | 15 | 15 | 0 | 247 | 1 |
| 28831 | 15 | 31 | 0 | 15 | 31 | 0 | 255 | 1 |
| 30719 | 15 | 1919 | 59 | 15 | 31 | 59 | 15359 | 1 |
| 30720 | 16 | 0 | 60 | 0 | 0 | 60 | 15360 | 0 |
| 30848 | 16 | 128 | 64 | 0 | 0 | 64 | 16384 | 0 |
| 2073599 | 1079 | 1919 | 4079 | 7 | 31 | 4079 | 1044351 | 1 |
| XXX | XXX | XXX | 4079 | 15 | 31 | 4079 | 1044479 | 1 |

2805, 2810, 2815, 2820, 2825, 2830, 2835, 2840, 2845

TWO-DIMENSIONAL BUFFER PAGES USING BIT-FIELD ADDRESSING

RELATED APPLICATIONS

This application claims the benefit of U.S. Provisional Application No. 60/269,784 filed Feb. 15, 2001, of U.S. Provisional Application No. 60/269,783 filed Feb. 15, 2001, and of U.S. Provisional Application No. 60/324,498 filed Sep. 24, 2001, the disclosures of which are incorporated herein by reference.

This application is related to the following co-pending and commonly assigned patent applications: application Ser. No. 09/908,295 (filed on Jul. 17, 2001); application Ser. No. 09/907,852 (filed on Jul. 17, 2001); application Ser. No. 09/907,854 (filed on Jul. 17, 2001); application Ser. No. 09/908,301 (filed on Jul. 17, 2001); application Ser. No. 10/051,538 (filed herewith); application Ser. No. 10/051,680 (filed herewith); and application Ser. No. 10/051,541(filed herewith), the disclosures of which are incorporated herein by reference.

BACKGROUND

The present invention is related to video data storage. More particularly, the present invention is related to video display systems and frame buffers. Several related technologies are discussed below (in labeled sections for clarity).

1. Raster Scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 141$^{st}$ SMPTE Technical Conference and Exhibition, Nov. 20, 1999, in New York, N.Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional raster-scan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024) 215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in mega-pixels per second ("MP/S"). For example, according to SMPTE 274M-1998 (a specification defining, among other things, pixel rates for resolutions of 1920×1080), for HD resolution 220 the pixel rate is about 150 MP/S @ 60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32 bit wide SDRAM running at 125 MHz is approximately 500 MB/S. A frame buffer architecture using two 125 MHz SDRAM's can realize a data rate of approximately 1000 MB/S. Alternatively, a faster SDRAM, such as one running at 150 MHz, can meet 600 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. For example, frame buffer architecture 400 can be used in a typical scan converter. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and 515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-Buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

7. SDRAM

Various types of memory devices can be used in implementing a frame buffer. One common type of memory used is SDRAM (synchronous dynamic random access memory). The structure and operation of SDRAM is well known. In overview, an SDRAM has a number of addressable memory locations that depends on the total size of the SDRAM and the size of each memory location. Each addressable memory location has a corresponding memory address. For example, an 8 MB (megabyte) SDRAM where each location is 32 bits has 2,097,152 addressable locations, while an 8 MB SDRAM were each location is 8 bits has four times as many addressable locations. FIG. 6A is a representation of 2,097,152 memory locations as a one-dimensional array 605. Memory cells in a typical SDRAM are physically arranged in a two-dimensional grid and so individual cells can be identified using a combination of a row number and a column number. The memory locations within the same row are often collectively referred to as a "page." FIG. 6B is a representation of 2,097,152 memory locations as a two-dimensional array or grid 650 having X columns and Y rows. In FIG. 6B, grid 650 has 256 columns 655, from 0 to X–1, and 8192 rows or pages 660, from 0 to Y–1. Accordingly, the location in row y at column x has address (y*X+x). For example, location 665 (the first location in the last page) has address (X*(Y–1)) and location 670 (the last location in the last page) has address (X*Y–1). The sizes of the boxes representing locations in FIG. 6C are representative and not to scale, so different size boxes are not different size memory locations (e.g., locations 665 and 670).

An address for a memory cell can be viewed as a combination of a row address and a column address. FIG. 6C is a representation of an address 675 for one memory location out of 2,097,152. Address 675 has 21 bits, with A0 as the lowest order bit. The lower 8 bits, A0 to A7, are a column address 680, ranging from 0 to 255. The upper 13 bits, A8 to A20, are a row or page address 685, ranging from 0 to 8191.

Due to the nature of the construction of SDRAM, an entire page of memory cells is active at a time. Accessing cells within the same page can be accomplished relatively quickly using a series of column addresses without changing the page address. To change pages, a new page address is used and an additional delay is incurred from both the extra address cycle and a delay in the memory changing which page is active. This delay is referred to as a "page miss" and can result in a loss in speed. SRAM (static random access memory) typically does not incur the same page miss delay as SDRAM, but SRAM is typically more expensive than SDRAM.

In a conventional frame buffer using SDRAM, pixel data for horizontally neighboring pixels is typically stored in the same page of memory. Referring to FIGS. 1A and 1B, pixel data for pixels 0, 1, 2, and 3 would be stored in one page, pixel data for pixels 4, 5, 6, and 7 would be stored in another page, and so on. In a parallel architecture, such as architecture 400 in FIG. 4, a page stores pixel data for every other horizontally aligned pixel, such as the first page of memory device 350 storing pixel data for pixels 0, 2, 4, and 6 in FIGS. 3A and 3B. Storing and retrieving pixel data can be accomplished quickly with few page misses because pixel data in a conventional raster scan system is processed in row order (left to right, top to bottom) for both storing and retrieving. The pixel data for pixels in different rows are typically not stored in the same page, and so page misses occur when pixel data is to be stored or retrieved for pixels from different rows. For example, retrieving pixel data for pixels 0, 1, 2, and 3 would cause one page miss (the initial page miss in the first access), but retrieving pixel data for pixels 0, 4, 8, and 12 would cause four page misses.

SUMMARY

The present disclosure provides methods and apparatus for storing data using two-dimensional arrays mapped to memory locations. In one implementation, a buffer page system includes: a data source, providing data elements in a first order; a data destination, receiving data elements in a second order; at least one memory device, each memory device having a plurality of memory pages including a plurality of memory locations, each memory location having an address; and where each data element corresponds to an entry in one of a plurality of buffer pages, where each buffer page has a plurality of entries along a first dimension corresponding to the first order and a plurality of entries along a second dimension corresponding to the second order, where data elements are stored according to the first order using blocks of buffer pages, each block having a number of buffer pages equal to a power of 2, where data elements are stored to the memory device in the first order and retrieved from the memory device in the second order, and where at least one memory page stores data elements in multiple locations according to the first order and stores data elements in multiple locations according to the second order.

In another implementation, a pixel page system includes: a video source providing pixel data for pixels in a frame, the frame having rows of pixels and columns of pixels; a video destination; a first memory having a plurality of memory locations; a second memory having a plurality of memory locations; a memory controller connected to the first memory and the second memory; a first data bus connected to the memory controller; a second data bus connected to the memory controller; a source address line connected to the video source and the memory controller; a destination address line connected to the video destination and the memory controller; and where each pixel corresponds to an entry in one of a plurality of pixel pages, and at least one pixel page includes multiple pixels from a row in the frame and multiple pixels from a column in the frame, where pixel data is stored according to horizontal rows of pixels using blocks of pixel pages, each block having a number of pixel pages equal to a power of 2, and where each entry in a pixel page corresponds to a memory location.

In another implementation, a method of storing pixel data includes: receiving pixel data for a frame of pixels, where the frame includes multiple horizontal rows of pixels; and storing the pixel data in a memory system according to pixel pages, where each pixel page corresponds to a respective page of memory, where at least one pixel page includes pixels from multiple horizontal rows of pixels, and where pixel data is stored according to horizontal rows of pixels using blocks of pixel pages, each block having a number of pixel pages equal to a power of 2.

In another implementation, a method of retrieving pixel data includes: generating addresses for retrieving from a memory system pixel data for a frame of pixels according to pixel pages, where the frame includes multiple horizontal rows of pixels, where each pixel page corresponds to a respective page of memory, where at least one pixel page includes pixels from multiple horizontal rows of pixels, and where pixel data is stored in the memory system according to horizontal rows of pixels using blocks of pixel pages, each block having a number of pixel pages equal to a power of 2; and retrieving the pixel data from the memory system using the generated addresses.

BRIEF DESCRIPTION OF THE DRAWINGS

FIG. 3A is a representation of a frame of pixels divided between two memory devices.

FIG. 3B is a representation of a first memory device.

FIG. 3C is a representation of a second memory device.

FIG. 6A is a representation of 2,097,152 memory locations as a one-dimensional array.

FIG. 6B is a representation of 2,097,152 memory locations as a two-dimensional array or grid.

FIG. 6C is a representation of an address for one memory location out of 2,097,152.

FIG. 9 is a representation of one implementation of a pixel page of pixels in an HD resolution implementation according to the present invention.

FIG. 10 is a table showing the relationships among a pixel, a frame row, a frame column, a pixel page, a pixel page row, a pixel page column, a memory page, and a memory address for an HD resolution implementation (1920×1080) according to the present invention.

FIG. 15 is a table showing the relationships among a pixel, a frame row, a frame column, a pixel page, a pixel page row, a pixel page column, a memory page, and a memory address for an HD resolution implementation (1920×1080) according to the present invention.

FIG. 21 is a table showing the relationships among a pixel, a frame row, a frame column, a pixel page, a pixel page row, a pixel page column, a memory page, and a memory address for an HD resolution implementation (1920×1080) according to the present invention.

FIG. 26 is a table showing the relationships among a pixel, a frame row, a frame column, a pixel page, a pixel page row, a pixel page column, a memory page, a memory address, and a memory device for an HD resolution implementation (1920×1080) according to the present invention.

FIG. 28 is a table showing the relationships among a pixel, a frame row, a frame column, a pixel page, a pixel page row, a pixel page column, a memory page, a memory address, and a memory device for an HD resolution implementation (1920×1080) according to the present invention.

DETAILED DESCRIPTION

Figure 1A:
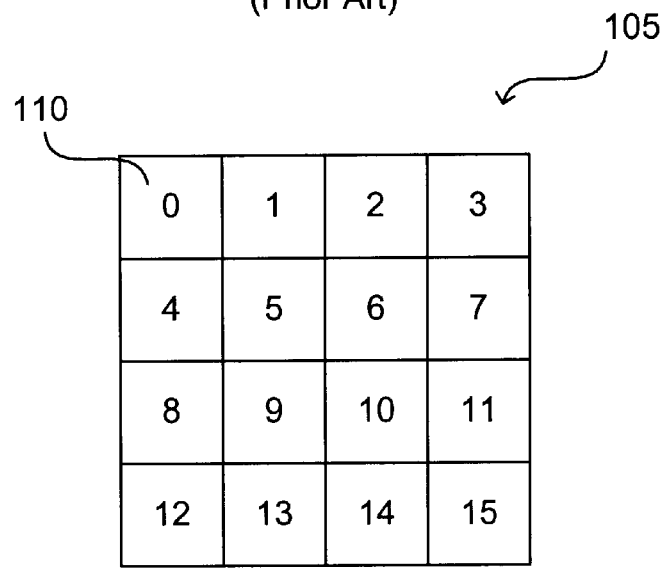
FIG. 1A is a representation of a screen as a grid of pixels.
Figure 1B:
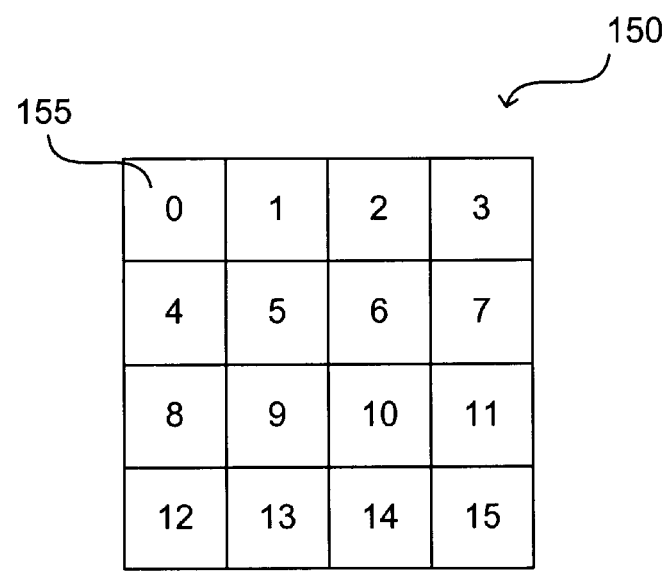
FIG. 1B is a representation of a memory device implementing a frame buffer as a grid of memory locations.
Figure 2:
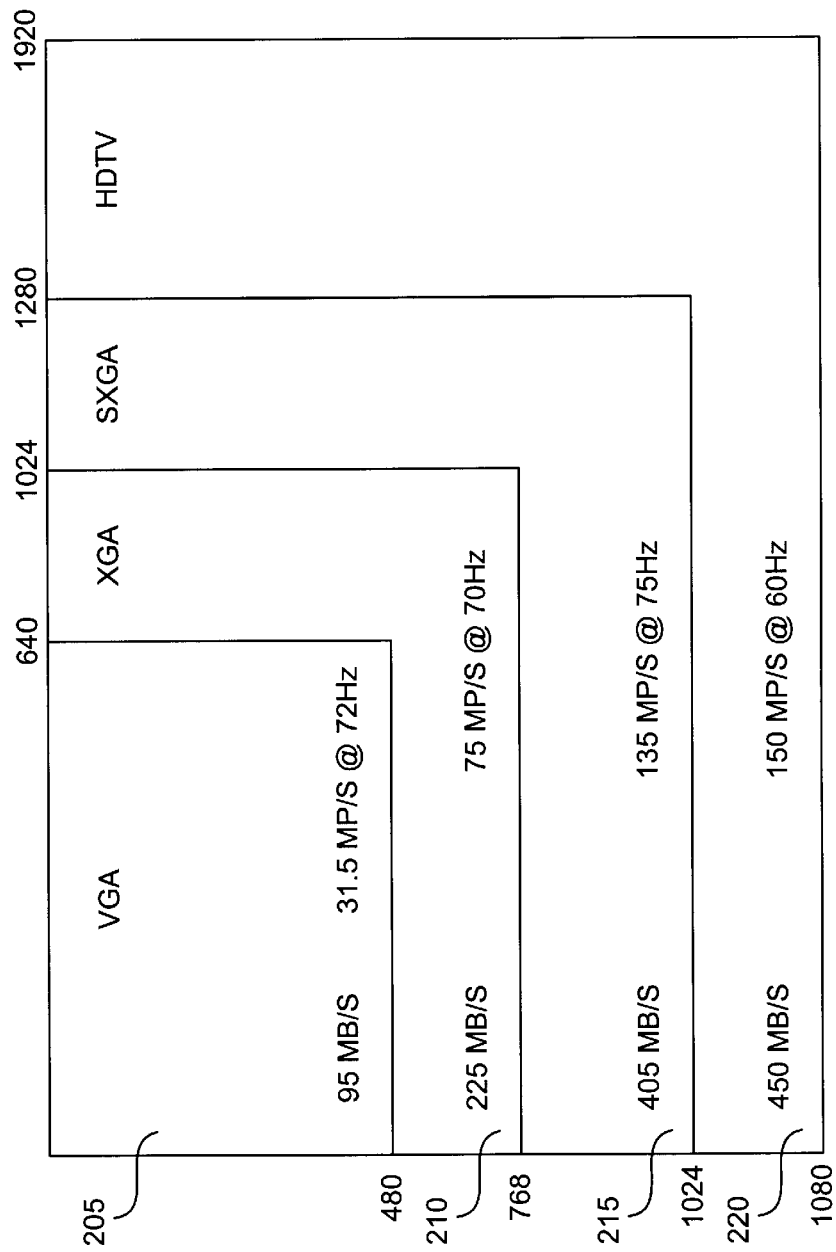
FIG. 2 is a representation of screen resolutions and typical data throughput requirements.
Figure 4:
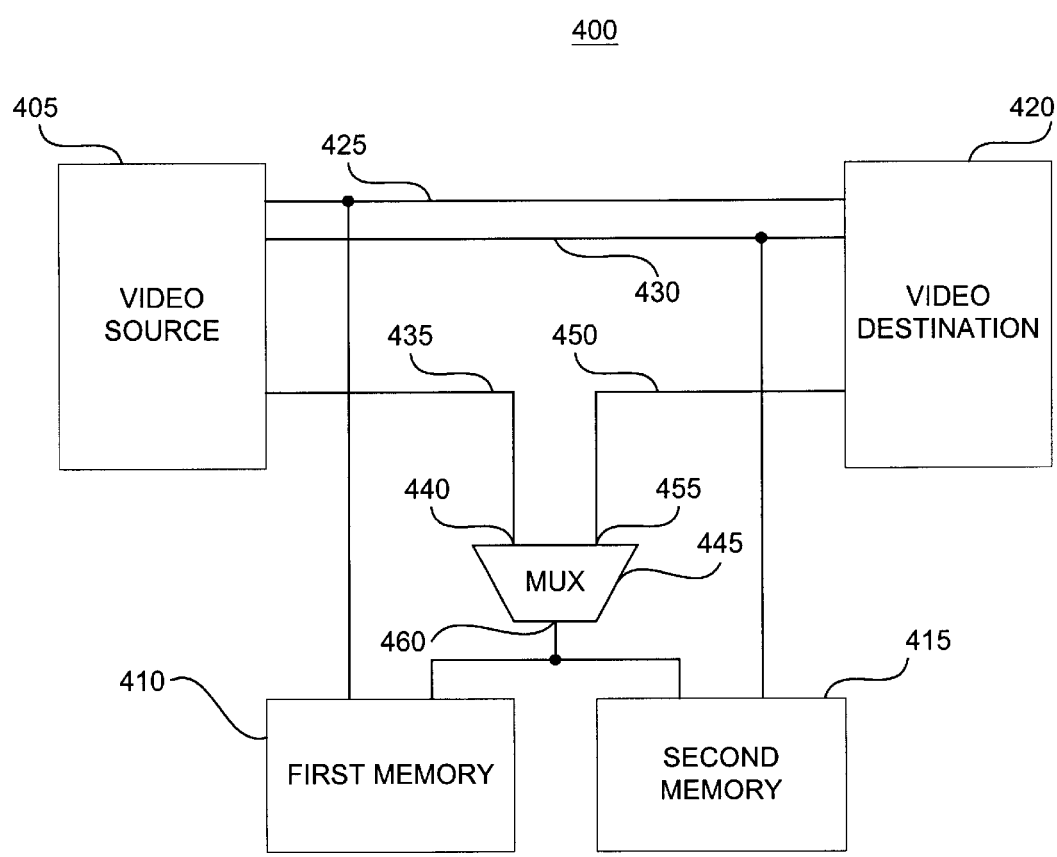
FIG. 4 is a block diagram of a typical frame buffer architecture capable of accessing pixel data for two pixels in parallel.

The present invention provides methods and apparatus for storing data using two-dimensional arrays mapped to memory locations, such as in DRAM. The two-dimensional arrays form a buffer and are referred to herein as buffer pages. Data corresponding to a buffer page is stored in a first order following the first dimension of the buffer page and retrieved in a second order following the second dimension. The memory locations corresponding to one buffer page are in the same physical memory page. The buffer page represents a memory mapping of data to memory locations. In one implementation, the buffer pages are for storing pixel data and these buffer pages are referred to as "pixel pages." As described below, a pixel page maps pixel data to memory locations for a region of pixels from multiple rows and columns of pixels. Pixel data is stored according to horizontal rows of pixels and retrieved according to vertical columns of pixels. While the description herein focuses on pixel pages and pixel data storage, the invention is applicable to other applications as well. This mapping can be advantageous in data applications that provide data in one order and retrieve data in a different order. In alternative implementations, buffer pages can be formed from arrays having more than two dimensions to accommodate accessing data in more than two orders.

The description below is generally divided into two sections for clarity: A. Two-dimensional Buffer Pages; and B. Illustrative Implementations of Pixel Pages.

A. Two-Dimensional Buffer Pages

Two-dimensional buffer pages are a useful memory mapping in a buffer for storing data in a first order and retrieving data in a second order. Data is stored along the first dimension according to the first order and data is retrieved along the second dimension according to the second order. Different address sequences are used in data storage and retrieval to follow the dimensions of the buffer pages.

1. Pixel Pages

In implementations using video data, the buffer pages are used in a frame buffer for storing pixel data. The buffer pages in video data implementations are referred to herein as pixel pages. Pixel data is supplied to the frame buffer according to the horizontal order of pixels in a frame, such as from left to right, top to bottom. Pixel data is provided by the frame buffer according to the vertical order of pixels in a frame, such as from top to bottom, left to right. Pixel pages are configured to support storing and retrieving pixel data in these two different orders. In an alternative implementation, pixel data is supplied to the frame buffer according to vertical columns of pixels and provided by the frame buffer according to horizontal rows of pixels.

Each pixel page is a two-dimensional mapping of pixels and pixel data to memory locations, aligning rows and columns within the pixel page with rows and columns in the frame of pixels. One dimension of the pixel page, referred to as pixel page rows, corresponds to horizontal rows of pixels in the frame, referred to as frame rows. A second dimension of the pixel page, referred to as pixel page columns, corresponds to vertical columns of pixels in the frame, referred to as frame columns. A pixel page has multiple pixel page rows and multiple pixel page columns. Each pixel page indicates memory locations from a single physical memory page so that consecutive accesses to locations from a single pixel page do not cause page misses. Accordingly, accessing consecutive locations corresponding to a pixel page along a pixel page row or along a pixel page column do not cause page misses. Page misses occur at the end of a pixel page row or pixel page column in making a transition to another pixel page. By storing pixel data along pixel page rows and retrieving data along pixel page columns, page misses can be reduced in processing pixel data that is to be stored in one order and retrieved in another order.

Figure 7:
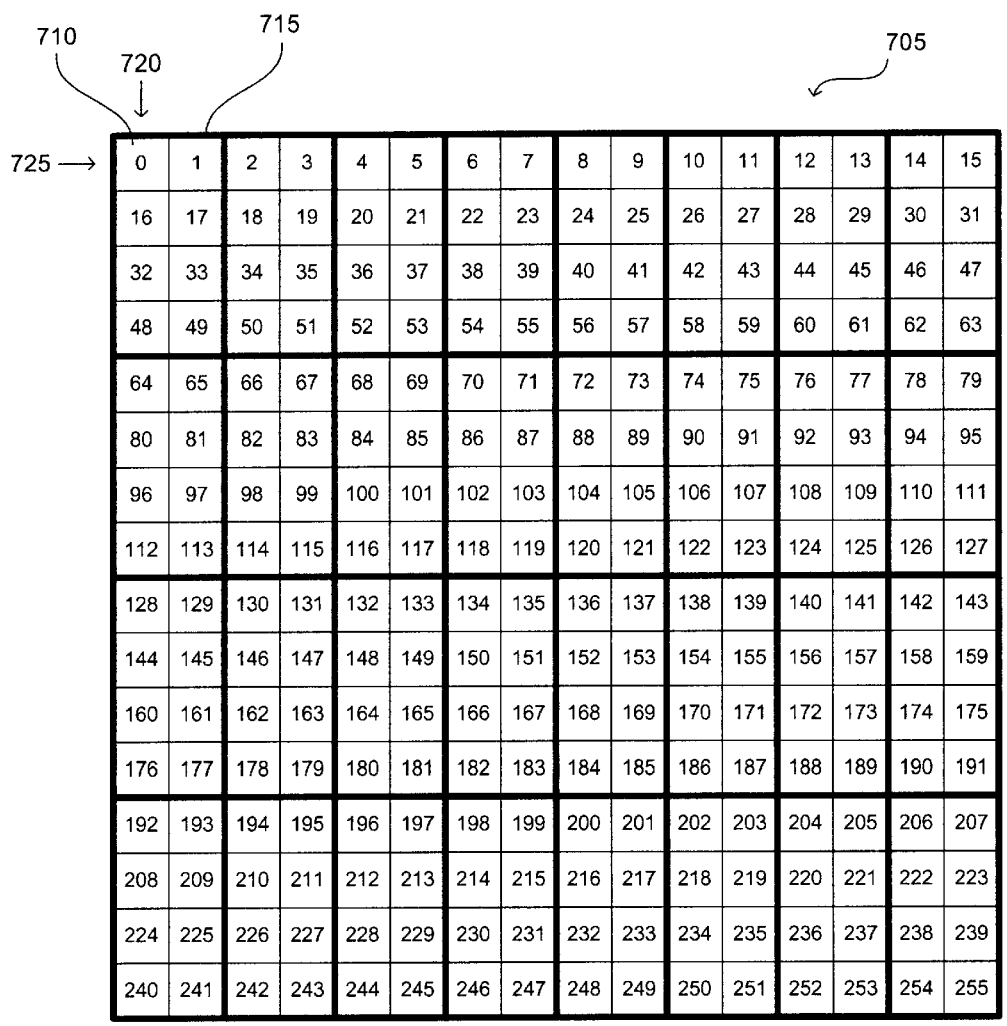
FIG. 7 is a representation of a frame of pixels according to the present invention.

FIG. 7 is a representation of a frame 705 of pixels 710. Frame 705 has 16 frame columns and 16 frame rows (16×16; 256 pixels) for simplicity, but other resolutions are possible. For example, as noted above, a frame in one typical HD resolution is 1920×1080 (2,073,600 pixels). Pixels 710 in frame 705 are sequentially numbered from 0 to 255. Frame 705 is divided into pixel pages 715, outlined in heavier lines. Each pixel page 715 includes eight pixels 710, in two pixel page columns 720 and four pixel page rows 725. Accordingly, a pixel page column 720 includes four pixels 710, and a pixel page row 725 includes two pixels 710. For example, pixels 0, 16, 32, and 48 are in one pixel page column 720 and pixels 0 and 1 are in one pixel page row 725. Frame 705 has 32 pixel pages 715, eight horizontally by four vertically. Pixel data for each pixel page 715 is stored in a respective page of physical memory. For frame 705, the first page of memory stores pixel data for the pixel page 715 including pixels 0, 1, 16, 17, 32, 33, 48, and 49. The second page of memory stores pixel data for the pixel page 715 including pixels 2, 3, 18, 19, 34, 35, 50, and 51, and so on.

In storing pixel data for frame 705, pixel data is stored for pixels 710 in horizontal row order (left to right, top to bottom): 0, 1, 2, 3, 4, and so on. Pixel data is stored following the pixel page rows 725 of pixel pages 715 (e.g., horizontally). A page miss occurs at the boundary of each pixel page 715, at the end of a pixel page row 725 (as described below, some page misses can be hidden using burst accessing, depending on the type of memory device). Because pixel pages 715 are two pixels 710 wide, a page miss would occur storing pixel data for every two pixels 710, i.e., storing pixel data for pixel 0, for pixel 2, pixel 4, etc. Storing one frame 705 of pixel data would cause a total of 128 page misses (8*16).

In retrieving pixel data for frame 705, pixel data is retrieved for pixels 710 in vertical column order (top to bottom, left to right): 0, 16, 32, 48, 64, and so on. Pixel data is retrieved following the pixel page columns 720 of the pixel pages 715 (e.g., vertically). A page miss occurs at the end of each pixel page column 720. Because pixel pages 715 are four pixels 710 tall, a boundary of a pixel page 715 occurs vertically every four pixels 710. Accordingly, a page miss would occur retrieving pixel data for every four pixels 710, i.e., retrieving pixel data for pixel 0, for pixel 64, for pixel 128, etc. Retrieving one frame 705 of pixel data would cause a total of 64 page misses (4*16).

The total page misses in processing one frame 705 using pixel pages 715 would be 192. By comparison, if pixel data were stored corresponding to horizontal frame rows of pixels, i.e., pixel data for 0, 1, 2, 3, 4, 5, 6, 7, and 8 were stored in the same memory page, a page miss would occur every 8 pixels for storing pixel data and every pixel for retrieving pixel data. Storing one frame would cause 32 page misses (2*16) and retrieving one frame would case 256 page misses (16*16). The total page misses in processing one frame would be 288. Accordingly, pixel pages can provide a significant speed improvement without changing the physical memory device.

Figure 8A:
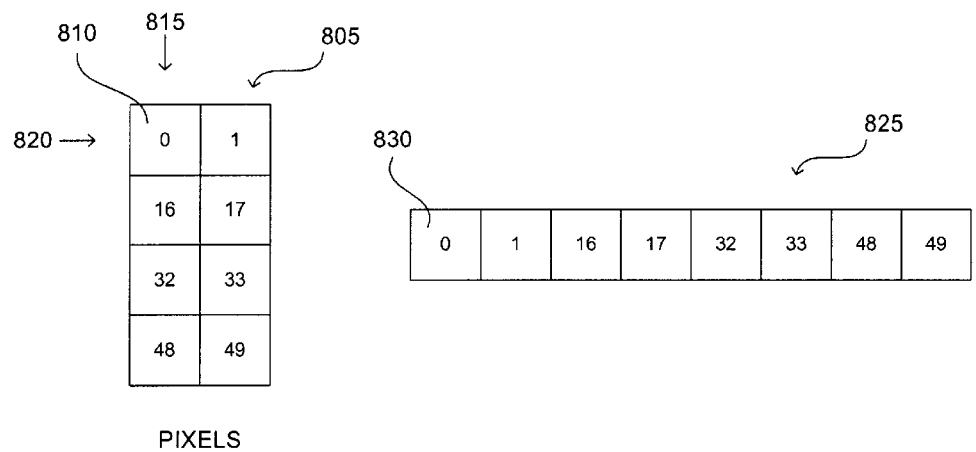
FIG. 8A is a representation of a pixel page having eight pixels in two pixel page columns and four pixel page rows, and a page of memory having eight memory locations according to the present invention.
Figure 8B:
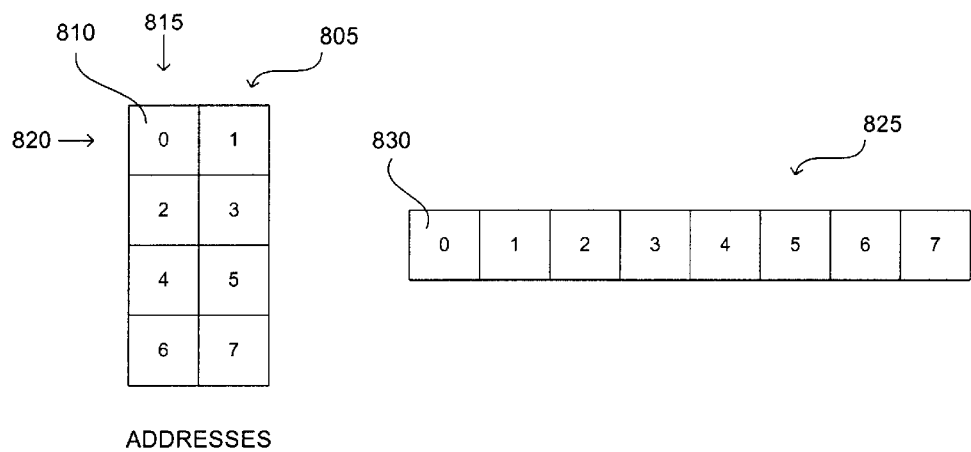
FIG. 8B is another representation of a pixel page and a memory page according to the present invention.

FIGS. 8A and 8B further illustrate the relationship between pixel pages and memory pages. FIG. 8A is a representation of a pixel page 805 having eight pixels 810 in two pixel page columns 815 and four pixel page rows 820, and a page of memory 825 having eight memory locations 830, based on the pixels 710 in FIG. 7. Memory page 825 stores pixel data for pixel page 805. Each pixel 810 of pixel page 805 is numbered with pixel numbers corresponding to the numbers of pixels 710 in FIG. 7. Each memory location 830 of memory page 825 is numbered according to the pixel 810 that corresponds to the pixel data stored in that location 830. FIG. 8B is another representation of pixel page 805 and memory page 825. Each memory location 830 has a memory address. In FIG. 8B, each memory location 830 of memory page 825 is numbered with the memory address of that location 830, and each pixel 810 of pixel page 805 is numbered according to the memory address of the memory location 830 storing pixel data for that pixel 810. Accordingly, FIGS. 8A and 8B show the address of the memory location 820 storing pixel data for a pixel 810. For example, pixel data for pixel 0 is stored at memory address 0, and pixel data for pixel 16 is stored at memory address 2.

2. Pixel Pages in HD Resolution

Figure 9:
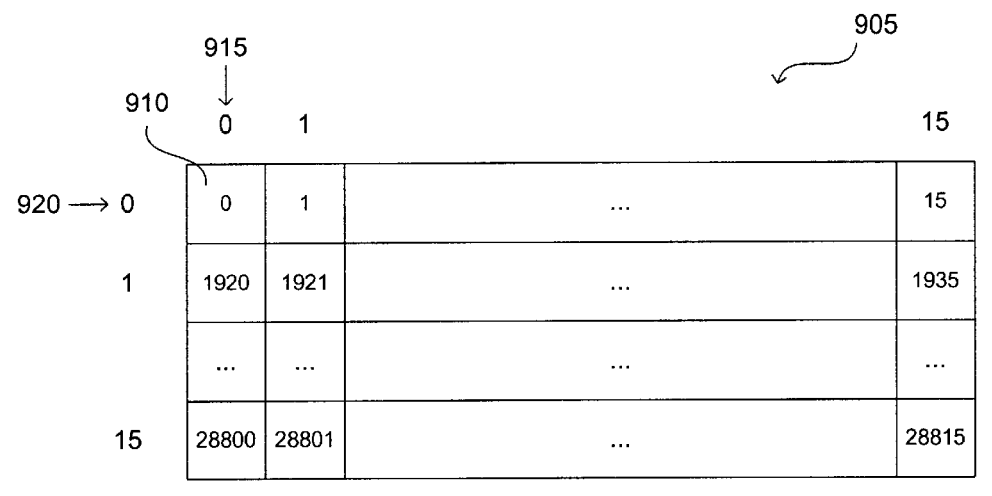

FIG. 9 is a representation of one implementation of a pixel page 905 of pixels 910 in an HD resolution implementation. Pixel page 905 includes 256 pixels 910, in 16 pixel page columns 915 (numbered 0 to 15) and 16 pixel page rows 920 (numbered 0 to 15). A pixel page column 915 includes 16 pixels 910 and a pixel page row 920 includes 16 pixels 910. For clarity, not every pixel 910 of pixel page 905 is shown in FIG. 9. Ellipses indicate intervening pixels 910. The first pixel page 905 for a frame includes the leftmost 16 pixels for each of the uppermost 16 frame rows (i.e., pixels 0–15, 1920–1935, and so on). As described above, an HD resolution frame has 2,073,600 pixels, in 1920 frame columns and 1080 frame rows. Each pixel page 905 is 16 pixels 910 wide, so one frame has at least 120 pixel pages 905 horizontally. Each pixel page 905 is 16 pixels 910 tall, so one frame has at least 68 pixel pages 905 vertically (though the pixel pages 905 in the 68$^{th}$ row of pixel pages 905 are not completely filled with valid screen pixels, where a "valid" screen pixel is a pixel in the frame for which pixel data has been provided from the video source). In total, one frame has at least 8160 pixel pages 905 allocated, where each allocated pixel page has a corresponding memory page. In an HD resolution implementation, pixel data is stored and retrieved in similar sequences to those described above. Pixel data is stored along horizontal frame rows, such as this sequence of pixels: 0, 1, 2, 3, 4, and so on. Pixel data is retrieved along vertical frame columns, such as this sequence of pixels: 0, 1920, 3840, 5760, and so on. Various geometries and page sizes can be used for pixel pages in other implementations, such as 8×32, 16×32, or 64×16.

Recalling the relationship illustrated in FIGS. 7, 8A and 8B, FIG. 10 is a table 1000 showing the relationships among a pixel, a frame row, a frame column, a pixel page, a pixel page row, a pixel page column, a memory page, and a memory address for an HD resolution implementation (1920×1080) using pixel pages 905 in FIG. 9. In FIG. 10, the pixel data for a frame is stored in a single memory device having 256 memory locations per memory page. In addition, FIG. 10 shows only a representative sample of pixels from a frame for clarity. As described above, an HD resolution frame has 2,073,600 pixels.

Column 1005 indicates the number of a pixel for which related information is shown in table 1000. Pixels in a frame are numbered from 0, left to right, top to bottom. For example, the first pixel in the frame is numbered 0, the last pixel of the first frame row is numbered 1919, and the first pixel of the second frame row is numbered 1920. Column 1010 indicates a frame row including the pixel in column 1005. Frame rows are numbered from 0, top to bottom. Column 1015 indicates a frame column including the pixel in column 1005. Frame columns are numbered from 0, left to right. Column 1020 indicates a pixel page including the pixel in column 1005. Pixel pages in a frame are numbered from 0, left to right, top to bottom. Column 1025 indicates a pixel page row including the pixel in column 1005. Pixel page rows are numbered from 0, from top to bottom within the pixel page including the pixel page row. Column 1030 indicates a pixel page column including the pixel in column 1005. Pixel page columns are numbered from 0, left to right within the pixel page including the pixel page column. Column 1035 indicates a memory page storing pixel data for the pixel in column 1005. Memory pages are numbered sequentially from 0. Column 1040 indicates a memory address of a memory location storing pixel data for the pixel in column 1005. For example, the first pixel of a frame is pixel 0, in frame row 0 and frame column 0, in pixel page row 0 and pixel page column 0 of pixel page 0, stored at memory address 0 in memory page 0.

In an HD resolution implementation using pixel pages 905 and a single memory device, the memory locations of a memory page can be considered to be divided into groups corresponding to the pixel page rows of the pixel page associated with the memory page. Accordingly, a memory page can be considered to store pixel data for a series of pixel page rows in a pixel page. However, pixel data for pixels in pixel page rows from different pixel pages is stored in different memory pages. For example, pixel data for the first 16 pixels of the first frame row (i.e., pixels 0 through 15, in the uppermost row) is stored in the first 16 memory locations of the first memory page (i.e., addresses 0 through 15 of address 0 through 255). Referring to table 1000 in FIG. 10, pixel 0 is in pixel page row 0 of pixel page 0 and pixel data for pixel 0 is stored at address 0. Pixel data for the second 16 pixels of the first frame row (i.e., pixels 16 through 31) is stored in the first 16 memory locations of the second memory page (i.e., addresses 256 through 271 of address 256 through 511). Referring to table 1000, pixel 16 is in pixel page 1 and pixel data for pixel 16 is stored at address 256. Pixel data for the first 16 pixels of the second frame row is stored in the second 16 memory locations in the first memory page. Referring to table 1000, pixel 1920 is in pixel page row 1 of pixel page 0 and pixel data for pixel 1920 is stored at address 16. Pixel data for the second 16 pixels of the second frame row is stored in the second group of 16 memory locations in the second memory page, and so on. This pattern continues for 16 rows of pixels through the first 120 pixel pages, filling the first 120 memory pages (recalling that a frame is 120 pixel pages wide). Pixel data for pixels in the next row of pixel pages is stored in another series of memory pages, such as the next 120 memory pages. In the 68$^{th}$ row of pixel pages, some addresses are unused because an HD resolution frame has 1080 frame rows but 68 rows of pixel pages include 1088 pixel page rows. Memory use and various implementations of addressing are further described below.

In addition, the address of pixel data for a pixel can be derived using the number of memory locations in a memory page (the page size, "PS"), the number of memory locations allocated to pixels in a pixel page row (the page width, "PW"), and which pixel page, pixel page row, and pixel page column includes the pixel:

address=PS*(pixel page)+PW*(pixel page row)+(pixelpage column)

Using the pixel pages 905 shown in FIG. 9 and memory pages having 256 memory locations, the address can be derived using this equation:

address=256 *(pixel page)+16 *(pixel page row)+(pixel page column)

For example, pixel 1936 is in pixel page 1, pixel page row 1, and pixel page column 0, so the address is 272 (256*1+ 16*1+0=272).

As described above, page misses occur when a memory location is accessed that is in a different memory page than the last memory location accessed. In a frame using pixel pages configured as shown in FIGS. 9 and 10, pixel data for 16 pixels can be stored before reaching the end of a pixel page row and causing a page miss, and pixel data for 16 pixels can be retrieved before reaching the end of a pixel page column and causing a page miss. As described above, a frame row has 1920 pixels and storing pixel data accesses 120 pixel pages for each frame row. Accordingly, storing pixel data for one frame causes 129,600 page misses (120*1080). In retrieving pixel data, a frame column has 1080 pixels and retrieving pixel data accesses 68 pixel pages for each frame column. Accordingly, retrieving pixel data for one frame causes 130,560 page misses (1920*68). In total, processing one frame using pixel pages that are 16×16 causes 260,160 page misses. By comparison, as described above, if pixel data were stored in a conventional manner (i.e., pixel data for 256 horizontally aligned pixels per memory page, using one memory device), storing pixel data for one frame would causes 8,640 page misses (8*1080). However, because pixel data for each vertically aligned pixel in a frame column would be stored in a different memory page, every retrieve operation would cause a page miss. Accordingly, retrieving pixel data for one frame would cause 2,073,600 page misses (1920*1080). In total, processing one frame using conventional horizontal storage would cause 2,082,240 page misses, nearly 10 times as many page misses. While the difference in page misses depends on the implementation (in particular, the memory page width) and the difference in geometry between the pixel page and the conventional storage method, pixel pages can provide a substantial improvement in performance.

3. Pixel Pages Using Two Memory Devices

As described above referring to FIGS. 3A, 3B, 3C, and 4, a frame buffer architecture using two memory devices can achieve a higher pixel rate and data rate than an architecture using a single memory device of the same speed. Pixel pages can be used with two memory devices in parallel as well. As described above, pixel data for half of the pixels in a frame is stored in one memory device and pixel data for the other half of the pixels is stored in the second device. Similarly, pixel data for half of the pixels in a pixel page is stored in the first memory device and pixel data for the other half of the pixels in the pixel page is stored in the second device.

Figure 11:
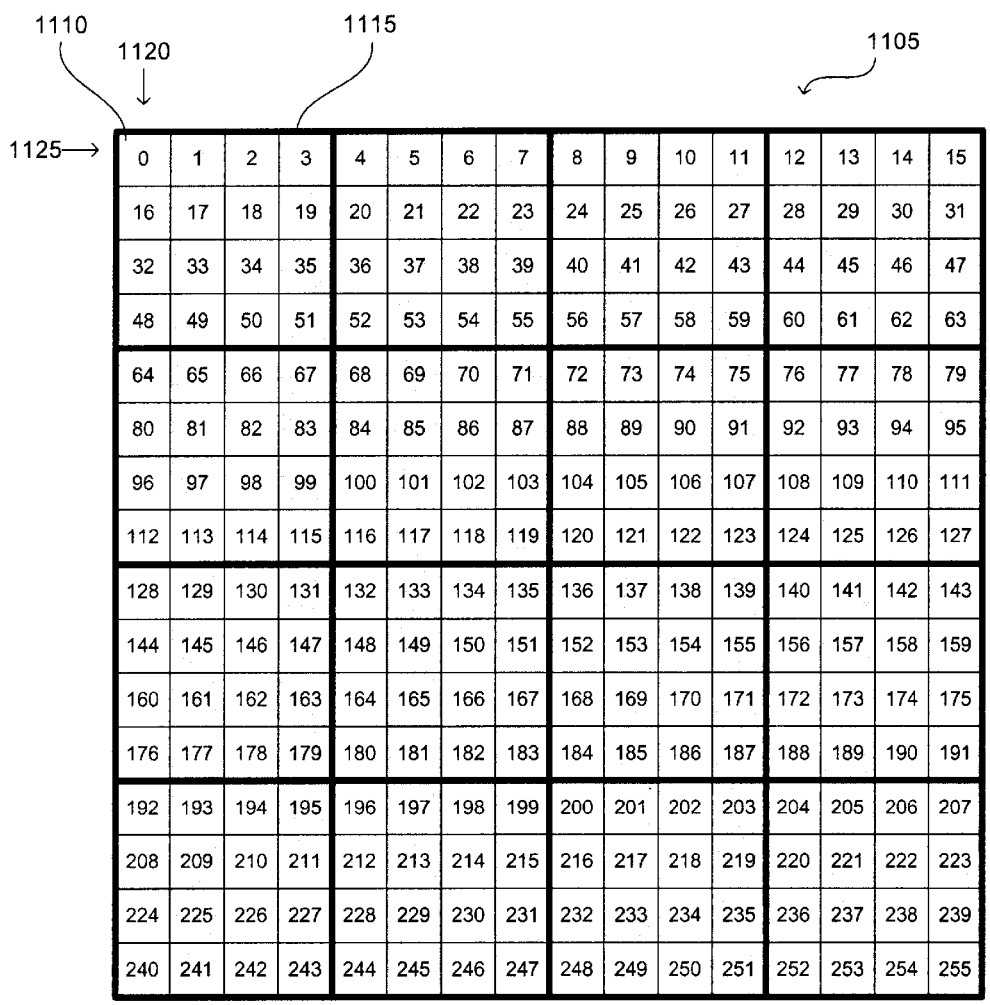
FIG. 11 is a representation of a frame of pixels according to the present invention.

FIG. 11 is a representation of a frame 1105 of pixels 1110, similar to frame 705 in FIG. 7. Frame 1105 has 16 frame columns and 16 frame rows (16×16; 256 pixels) for simplicity, but other resolutions are possible. For example, as noted above, a frame in one typical HD resolution is 1920×1080 (2,073,600 pixels). Similar to frame 705 in FIG. 7, pixels 1110 in frame 1105 are sequentially numbered from 0 to 255. However, in frame 1105, pixel data for half of the pixels 1110 is stored in a first memory device and pixel data for the other half of the pixels 1110 is stored in a second memory device (the memory devices are not shown in FIG. 11). Similar to FIGS. 3A, 3B, and 3C, pixels having pixel data stored in the first memory device are indicated by unshaded boxes, such as even-numbered pixels (e.g., pixel 0), and pixels having pixel data stored in the second memory device are indicated by shaded boxes, such as odd-numbered pixels (e.g., pixel 1).

Frame 1105 is divided into pixel pages 1115, outlined in heavier lines. Each pixel page 1115 includes 16 pixels, in four pixel page columns 1120 and four pixel page rows 1125. Accordingly, a pixel page column 1120 includes four pixels 1110, and a pixel page row 1125 includes four pixels 1110. Frame 1105 has 16 pixel pages 1115, four horizontally by four vertically.

Pixel data for half of each pixel page 1115 is stored in each of the two memory devices. Pixel data for a pixel page 1115 is stored in the same memory page in the respective memory devices. For example, half of the pixel data for the first pixel page 1115 is stored in the first memory page of the first memory device and the other half of the pixel data is stored in the first memory page of the second memory device. For frame 1105, the first pixel page 1115 includes pixels 0, 1, 2, 3, 16, 17, 18, 19, 32, 33, 34, 35, 48, 49, 50, and 51. The first page of memory in the first memory device stores pixel data for pixels 0, 2, 16, 18, 32, 34, 48, and 50. The first page of memory in the second memory device stores pixel data for pixels 1, 3, 17, 19, 33, 35, 49, and 51.

Furthermore, pixels 1110 in neighboring pixel page columns 1120 can be considered to be in horizontal pixel pairs. For example, pixels 0 and 1 are a pixel pair, pixels 2 and 3 are a pixel pair, pixels 16 and 17 are a pixel pair, and so on. Pixel data for respective pixels of a pixel pair is stored in memory locations in the respective memory devices having the same memory address. For example, pixel data for pixel 0 is stored at address 0 (i.e., the memory location having address 0) in the first memory device and pixel data for pixel 1 is stored at address 0 in the second memory device. One address can be used to access two memory locations by supplying the address to two memory devices, accessing one memory location in each memory device. For example, by supplying address 0 to the memory devices, pixel data stored in the first memory location of each memory device can be retrieved (i.e., pixel data for pixels 0 and 1). Accordingly, pixel data for a pixel pair can be stored or retrieved in parallel. Pixel data for a frame row of pixels in frame 1105 would be stored in eight operations, storing pixel data for two pixels at a time. Pixel data for two frame columns of pixels in frame 1105 would be retrieved in 16 operations, retrieving pixel data for two pixels at a time. Pixel data retrieved can be buffered temporarily.

Pixel page 1105 can further improve page miss performance. Frame 1105 has 16 pixel pages 1115, while in FIG. 7, frame 705 has 32 pixel pages 715. As described above, a page miss occurs when crossing the boundary of a pixel page, at the end of a pixel page row 1125 (storing) or pixel page column 1120 (retrieving). Storing one frame of pixel data would cause a total of 64 page misses (4*16). Retrieving one frame of pixel data would cause a total of 32 page misses (4*8). The total page misses in processing one frame using pixel pages would be 96.

4. Data System Using Buffer Pages

Figure 12:
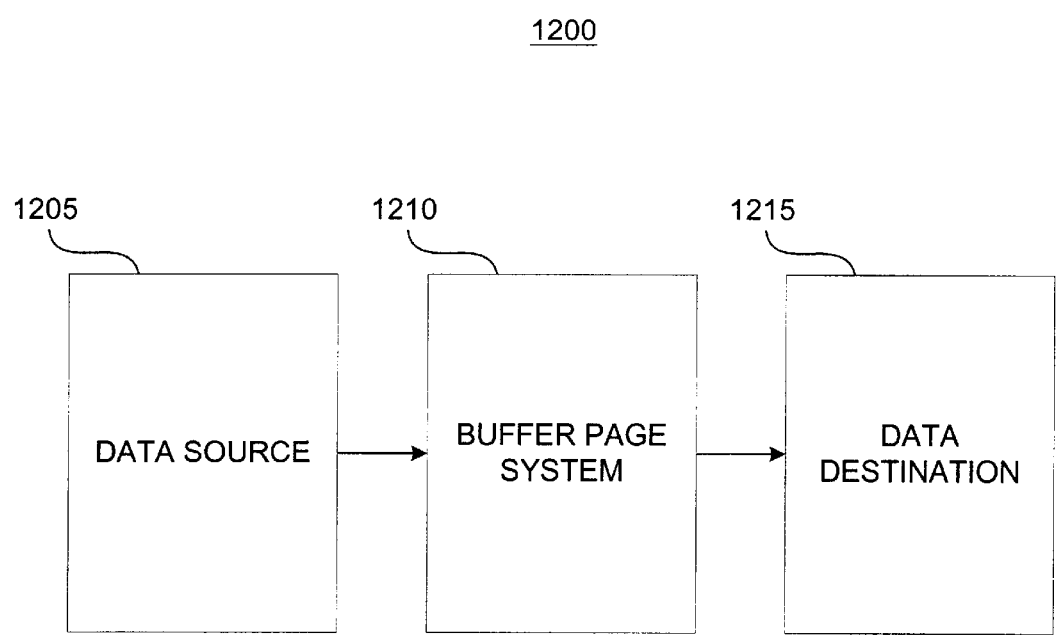
FIG. 12 is a block diagram of a data system according to the present invention.

FIG. 12 is a block diagram of a data system 1200. A data source 1205 provides data to a buffer page system 1210 in a first order. Buffer page system 1210 stores the data using buffer pages, as described above. Buffer page system 1210 retrieves the data in a second order and provides the retrieved data to a data destination 1215. For a video application, buffer page system 1210 can be used as a type of scan converter between data source 1205 and data destination 1215.

Data source 1205 can be a video source providing pixel data to buffer page system 1210 and data destination 1215 can be a display system. In this case, data source 1205 provides pixel data according to horizontal rows of pixels and data destination 1215 receives pixel data according to vertical columns of pixels, as described above. Buffer page system 1210 provides the conversion.

Data source 1205 can be implemented to provide pixel data according to various screen resolutions, such as an HD resolution of 1920×1080. While the discussion herein focuses on this HD resolution, alternative implementations can accommodate other resolutions. For an HD resolution signal, data source 1205 provides pixel data for a progressive signal (e.g., 1920×1080 p). Data source 1205 can be implemented to receive an interlaced signal (e.g., 1920×1080 i) and provide a progressive signal, such as by merging interlaced fields using a de-interlacer. In an alternative implementation, data source 1205 provides an interlaced signal, providing pixel data for half the screen pixels (i.e., first field) and then pixel data for the other half (i.e., second field). In another implementation, data source 1205 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 1205 provides pixel data at 1920×1080 p and 32 bits per pixel, the pixel rate is approximately 150 MP/S and the data rate from data source 1205 is approximately 600 MB/S. Accordingly, buffer page system 1210 stores pixel data from data source 1205 at a data rate of approximately 600 MB/S. To provide pixel data at a rate to support the same resolution, 1920×1080 p, buffer page system 1210 outputs pixel data to data destination 1215 at a data rate of approximately 600 MB/S.

Data destination 1215 can be a GLV system. One color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 12). Accordingly, it is advantageous for the GLV system to receive pixel data according to vertical columns of pixels, rather than horizontal rows. Buffer page system 1210 provides the pixel data to the GLV system corresponding to vertical columns of pixels. In alternative implementations, data destination 1215 can be some other video device that uses pixel data corresponding to vertical columns of pixels, such as a graphics card or a video image processor (e.g., for image transformations).

B. Illustrative Implementations of Buffer Pages

This section describes several additional illustrative implementations of buffer pages. However, the described implementations are illustrative and those skilled in the art will readily appreciate additional implementations are possible. The illustrative implementations are described in separate numbered and labeled sections. However, compatible aspects of the implementations can be combined in additional implementations.

1. Pixel Pages Using One Memory Device, 128 Pixel Pages by 128 Pixel Pages

In one HD implementation using one memory device, one pixel page is 16×16 and has 256 pixels. One frame has 16,384 pixel pages, 128 horizontally by 128 vertically, though only 8160 pixel pages include valid screen pixels. Accordingly, 16,384 memory pages are allocated to accommodate the 16,384 pixel pages. As described below, allocating numbers of pixel pages horizontally and vertically that are powers of 2 is convenient for addressing using bit fields.

Figure 5:
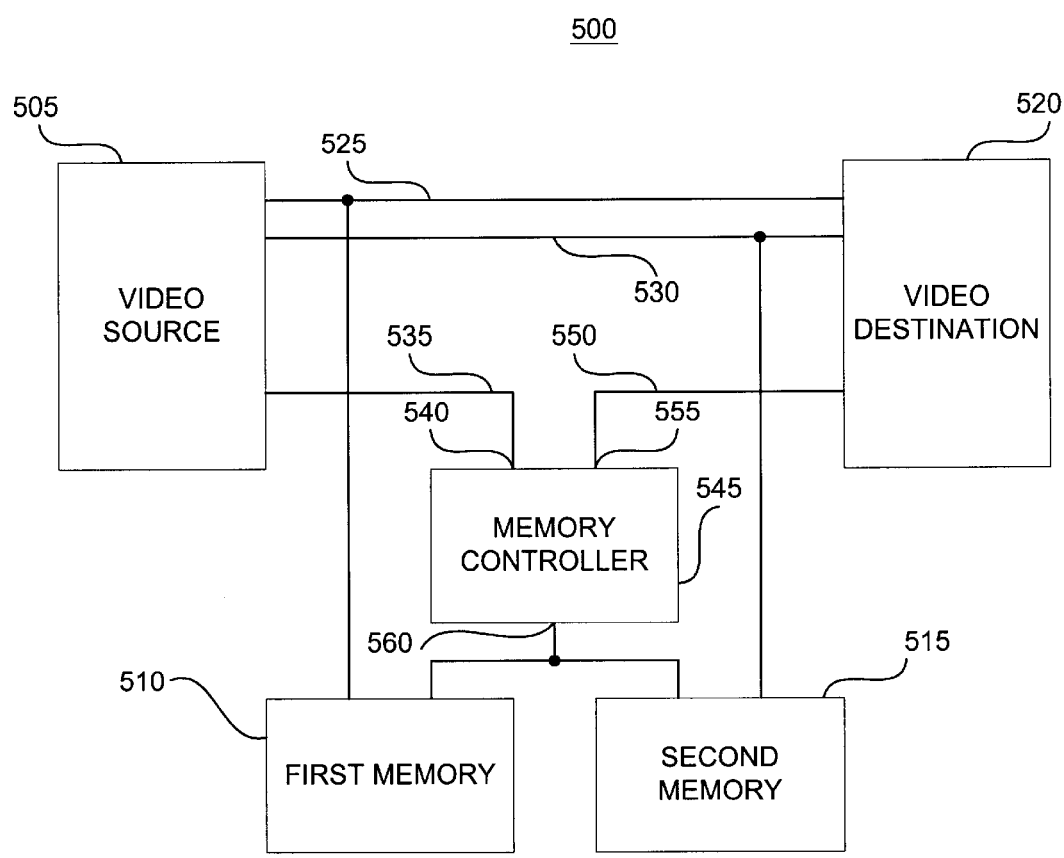
FIG. 5 is a block diagram of another implementation of a dual pixel frame buffer architecture.
Figure 13:
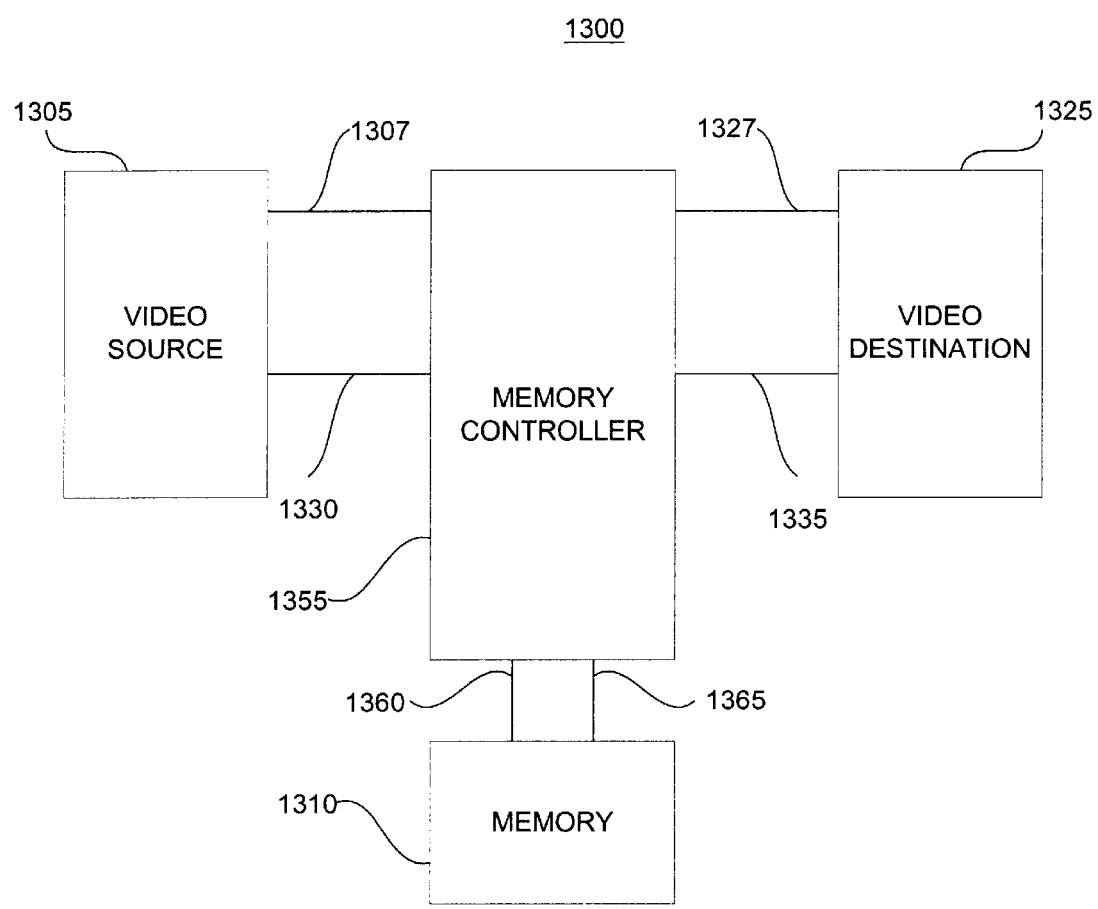
FIG. 13 is a block diagram of a frame buffer architecture according to the present invention.

FIG. 13 is a block diagram of a frame buffer architecture 1300. Architecture 1300 is similar to architectures 400 and 500 in FIGS. 4 and 5, respectively. However, architecture 1300 uses a single memory 1310 (also referred to herein as a memory device) and includes a memory controller 1355 centrally interconnecting video source 1305, video destination 1325, and memory 1310. Memory controller 1355 controls routing pixel data from video source 1305 to memory 1310 and routing pixel data from memory 1310 to video destination 1325. Memory controller 1355 controls the operation of memory 1310, such as the read or write state, and also generates addresses for storing pixel data to and retrieving data from memory 1310, as described below. Memory controller 1355 manages address generation to use the mapping of pixel pages. In an alternative implementation, separate address generators for storing and retrieving data provide addresses to memory controller 1355.

A video source 1305 provides pixel data to a memory 1310 and a video destination 1325 retrieves pixel data from memory 1310. Memory 1310 can be implemented using various memory devices, such as a 32-bit wide 16 MB SDRAM (e.g., 4M×32 SDRAM MT48LC4M32B2 by Micron Technology, Inc.). Alternatively, two 8 MB SDRAM's can be used in series and treated as a single memory space, using an address bit to select a device. The SDRAM is preferably fast enough to support the data rate needed for the screen resolution. Other types of memory can also be used, such as DDR SDRAM (double data rate SDRAM) or SGRAM (synchronous graphics RAM). Pixel data for each pixel is stored in a separate addressable memory location. Video source 1305 receives video data from another source (not shown), such as a broadcast source or a software application running on a computer system connected to video source 1305. Video destination 1325 provides pixel data to a display system, such as data destination 1215 in FIG. 12 implemented as a GLV system. In one implementation, video destination 1325 provides pixel data for one column of pixels at a time to a GLV system 1215. In one implementation, video source 1305 and video destination 1325 include FIFO buffers, such as to avoid drift. In another implementation, these FIFO buffers are included in memory controller 1355.

A first data bus 1307 is connected to video source 1305 and memory controller 1355. A second data bus 1327 is connected to video destination 1325 and memory controller 1355. Memory controller 1355 receives signals from video source 1305 and video destination 1325 through control lines 1330 and 1335, respectively, for addressing, such as indicating whether pixel data is to be stored to or retrieved from memory 1310, or horizontal and vertical synchronization signals have been received (e.g., to indicate the end of a frame row of pixels or the end of a frame, respectively). A memory data bus 1360 and a memory address bus 1365 are connected to memory controller 1355 and memory 1310. Memory 1310 also receives control signals (not shown) from memory controller 1355 to control whether memory 1310 will read in data (write mode) or read out data (read mode). In addition, while clock lines are not shown in FIG. 13, architecture 1300 operates based on clock cycles so that pixel data can be processed for one pixel per clock cycle in support of the desired pixel rate.

Figure 14:
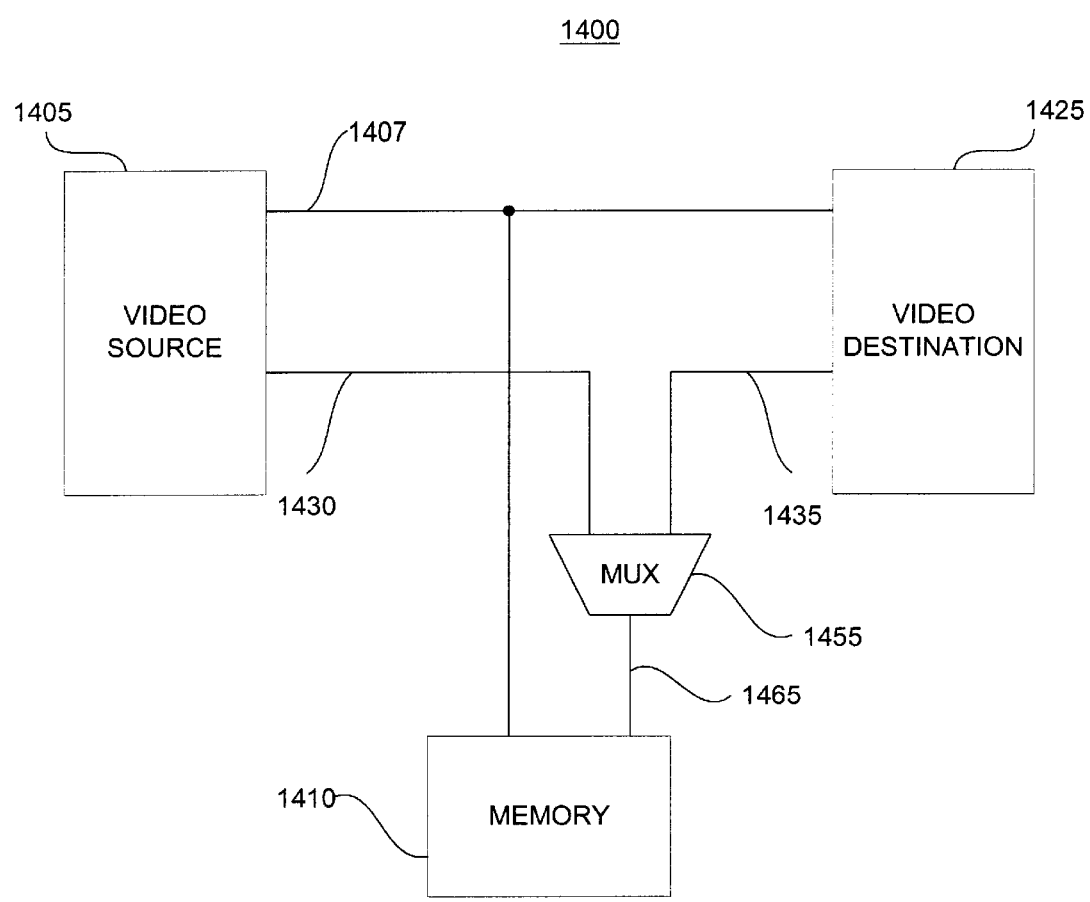
FIG. 14 is a block diagram of a frame buffer architecture including an address multiplexor according to the present invention.

In another implementation, memory controller 1355 is replaced by an address multiplexor. FIG. 14 is a block diagram of a frame buffer architecture 1400 including an address multiplexor 1455. Architecture 1400 operates similarly to architecture 1300, however, address generation is controlled by video source 1405 and video destination 1425 for storing and retrieving pixel data, respectively. In addition, video source 1405 and video destination 1425 share a common data bus 1407 for providing pixel data to memory 1410 and receiving pixel data from memory 1410. When storing pixel data, video source 1405 provides an address to address multiplexor 1455 through source address bus 1430, and address multiplexor 1455 passes the address to memory 1410. When retrieving pixel data, video destination 1425 provides an address to address multiplexor 1455 through destination address bus 1435, and address multiplexor 1455 passes the address to memory 1410. Address multiplexor 1455 receives a control signal (not shown), such as from video source 1405, to control which address bus to connect to memory address bus 1465. As in FIG. 13, while clock lines are not shown in FIG. 14, architecture 1400 operates based on clock cycles so that pixel data can be processed for one pixel per clock cycle in support of the desired pixel rate.

In operation of architecture 1300 of FIG. 13, memory 1310 reads in or stores a frame of pixels as pixel data from video source 1305 and outputs the pixel data to video destination 1320. Memory controller 1355 controls address generation to map pixel data to memory locations according to a desired pixel page geometry. As described above, pixel data for a frame of pixels from video source 1305 is stored according to horizontal rows of pixels, and then the pixel data is retrieved according to vertical columns of pixels and provided to video destination 1325. After the pixel data for the entire frame has been retrieved, pixel data for the next frame is stored, and so on. Some pixel data for the next frame may be buffered, such as in video source 1305, while pixel data for the previous frame is being retrieved. As described below, in alternative implementations, the storage and retrieval can be interleaved or occur in parallel.

Referring again to FIG. 7, for frame 705, video source 1305 in FIG. 13 would supply pixel data for horizontal pixels to memory 1310 through memory controller 1355 in this sequence (horizontal row order): 0, 1, 2, 3, 4, 5, . . . , 255. In contrast, for frame 705, memory 1310 would provide pixel data for pixels in this sequence (vertical column order): 0, 16, 32, 48, 64, . . . , 224, 240, 1, 17, 33, . . . , 225, 241, 2, 18, . . . , 239, 255. Accordingly, pixel data for the 256 pixels of frame 705 would be stored in 32 memory pages in memory 1310. Storing the pixel data would cause 128 page misses (8*16). Retrieving the pixel data would cause 64 page misses (4*16).

FIG. 15 is a table 1500, similar to table 1000 in FIG. 10, showing the relationships among a pixel, a frame row, a frame column, a pixel page, a pixel page row, a pixel page column, a memory page, and a memory address for an HD resolution implementation (1920×1080) using pixel pages 905 in FIG. 9. In FIG. 15, the pixel data for a frame is stored in a single memory device having 256 memory locations per memory page. In addition, FIG. 15 shows only a representative sample of pixels from a frame for clarity. As described above, an HD resolution frame has 2,073,600 pixels.

In table 1500, pixels, frame rows, frame columns, pixel pages, pixel page rows, pixel page columns, and memory pages are numbered in the same way as in table 1000. Column 1505 indicates the number of a pixel for which related information is shown in table 1500. Column 1510 indicates a frame row including the pixel in column 1505. Column 1515 indicates a frame column including the pixel in column 1505. Column 1520 indicates a pixel page including the pixel in column 1505. Column 1525 indicates a pixel page row including the pixel in column 1505. Column 1530 indicates a pixel page column including the pixel in column 1505. Column 1535 indicates a memory page storing pixel data for the pixel in column 1505. Column 1540 indicates a memory address of a memory location storing pixel data for the pixel in column 1505. For example, the first pixel of a frame is pixel 0, in frame row 0 and frame column 0, in pixel page row 0 and pixel page column 0 of pixel page 0, stored at memory address 0 in memory page 0. XXX indicates an invalid screen pixel, frame row, or frame column. Invalid screen pixels, frame rows, and frame columns are outside the dimensions of the screen resolution (e.g., frame rows beyond 1079 in HD resolution 1920×1080). Memory locations are allocated for invalid screen pixels, frame rows, and frame columns in allocated pixel pages, but these memory locations are not used.

As described below, it is convenient to have the number of pixel pages in each row and in each column be a power of 2 so that addresses can be generated by merging bit fields from counters. In an HD resolution of 1920×1080, each horizontal frame row has 1920 pixels. Each pixel page is 16 pixels wide and so 120 pixel pages can include a row of 1920 pixels horizontally (16*120=1920). The next largest power of 2 over 120 is 128, so 128 pixel pages are allocated horizontally to each frame. Each vertical frame column has 1080 pixels. Each pixel page is 16 pixels tall and so 68 pixel pages can include a column of 1080 pixels horizontally (16*68=1088). The next largest power of 2 over 68 is 128, so 128 pixel pages are allocated vertically to each frame. Each pixel page has a corresponding memory page including 256 memory locations. In total, 4,194,304 memory locations (16384*256) are allocated to the frame of 2,073,600 pixels. In alternative implementations, larger powers of two can be used, but will use more memory.

Some pixel pages at the end of each row of pixel pages do not include valid screen pixels. 128 pixel pages are allocated horizontally to the frame. Each pixel page is 16 pixels wide and so 128 pixel pages can include a row of 2048 pixels horizontally. However, an HD resolution frame is only 1920 pixels wide and so has valid screen pixels for 120 pixel pages, horizontally. As a result, eight pixel pages at the end of each row of pixel pages do not include valid screen pixels. For example, pixel 30719 (i.e., the last pixel of the first row of pixel pages) is in pixel page 119 and pixel data for pixel 30719 is stored at address 30719. Pixel 30720 (i.e., the first pixel of the second row of pixel pages) is in pixel page 128 and pixel data for pixel 30720 is stored at address 32768. Pixel pages 120 through 127 do not include valid screen pixels and so memory pages 120 through 127 and corresponding addresses 30720 through 32767 are not used.

Similarly, some pixel pages at the end of each column of pixel pages do not include valid screen pixels. 128 pixel pages are allocated vertically to the frame. Each pixel page is 16 pixels tall and so 128 pixel pages can include a column of 2048 pixels vertically. However, an HD resolution frame is only 1080 pixels tall and so has valid screen pixels for 67 pixel pages and 8 pixel page rows of a $68^{th}$ pixel page, vertically. As a result, eight pixel page rows in each of the pixel pages in the $68^{th}$ row of pixel pages (i.e., pixel pages 8576 through 8703) do not include valid screen pixels (and, as described above, the last eight pixel pages of the row, pixel pages 8696 through 8703). For example, pixel 2073599 (i.e., the last pixel of the last frame row) is in pixel page row 7 of pixel page 8695 and pixel data for pixel 2073599 is stored at address 2226047. Pixel page rows 8 through 15 of pixel page 8695 do not include valid screen pixels. However, memory page 8695 includes 256 memory locations with addresses from 2225920 through 2226175. Addresses 2226048 through 2226175 are not used (and address 2226176 through 2228223 are also not used, the addresses corresponding to the last eight pixel pages in the $68^{th}$ row of pixel pages). Furthermore, the remaining 60 rows of pixel pages do not include valid screen pixels. Accordingly, addresses 2228224 through 4194303 are not used.

Before describing the overall operation of storing pixel data to memory 1310, it will be useful to describe examples of implementations of how source addresses are calculated for storing pixel data. Memory controller 1355 generates source addresses to store pixel data for pixels according to horizontal rows of pixels. In an HD resolution implementation, video source 1305 stores pixel data for pixels in this sequence: 0, 1, 2, 3, 4, 5, and so on. Referring to FIG. 15, memory controller 1355 generates addresses in the following sequence (one address for each pixel): 0, 1, . . . , 15, 256, 257, . . . , 271, 512, . . . , 30479, 16, 17, and so on. As described above, pixel data for pixels in different pixel pages is stored in different memory pages.

Memory controller 1355 controls address generation to map pixel data to memory locations according to a desired pixel page geometry. In one implementation, memory controller 1355 includes a pixel counter. Memory controller 1355 increments the counter by 1 for pixel data for each pixel received from video source 1305 on first data bus 1307. For example, for pixel 0, the counter is 0. For pixel 1, the counter is 1. Memory controller 1355 also increments the counter at the end of each row to skip unused pixel pages. Memory controller 1355 generates an address for storing the pixel data by swapping the bit fields of the counter and outputs the address to memory address bus 1365.

Figure 16:
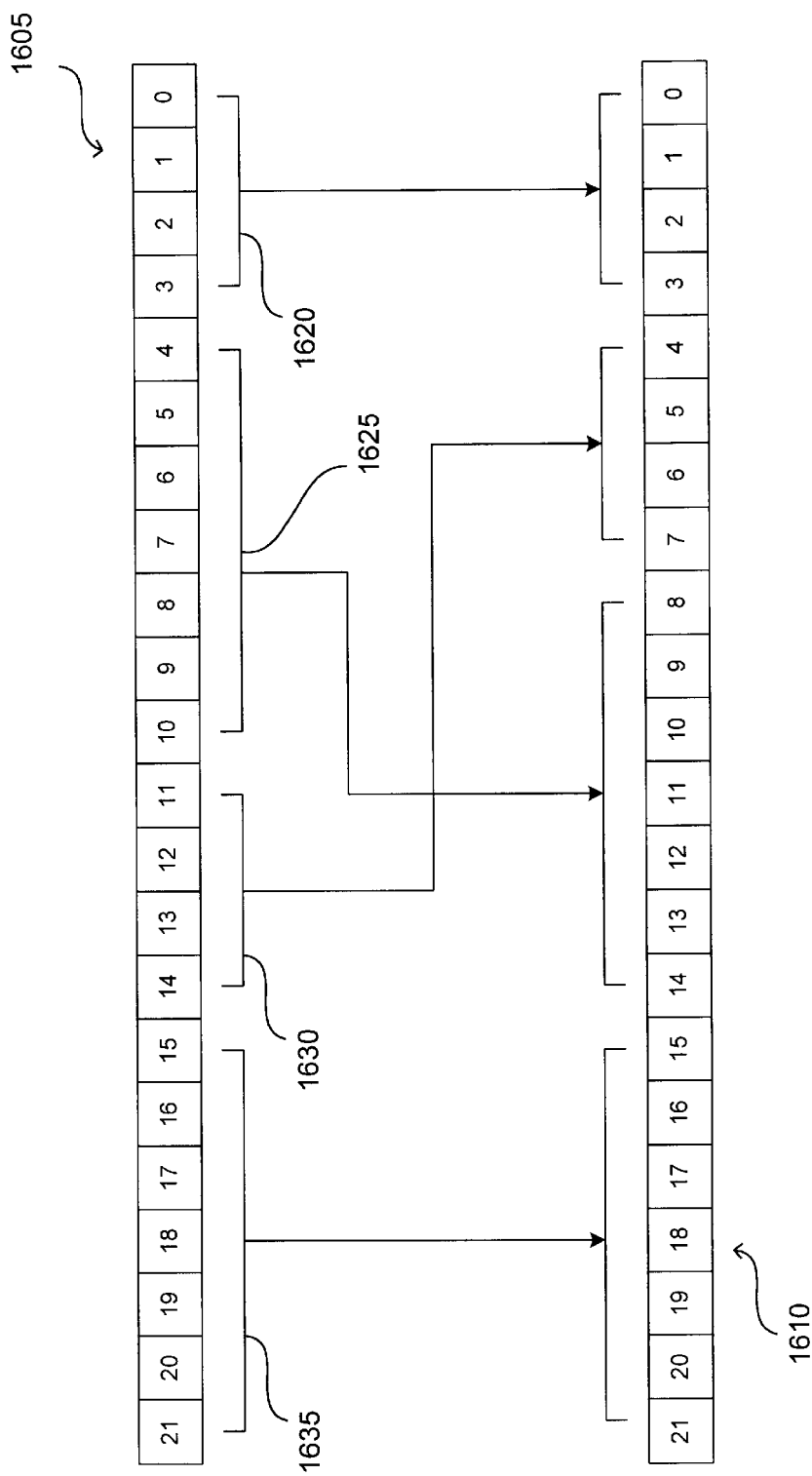
FIG. 16 is a representation of bits in a pixel counter in a memory controller according to the present invention.

FIG. 16 is a representation of bits in a pixel counter 1605 in memory controller 1355. The bits of counter 1605 are re-ordered to create an address 1610. Counter 1605 has 22 bits. Counter 1605 is incremented according to pixels in allocated pixel pages, rather than screen pixel numbers. As described above, 128 horizontal pixel pages (16 pixels wide) can include a row of 2048 pixels. Accordingly, pixel 1919 (i.e., the last pixel in the first frame row of pixels) is indicated by a value of 1919 and pixel 1920 (i.e., the first pixel in the second frame row of pixels) is indicated by a value of 2048 in counter 1605. Similarly, pixel 3840 is indicated by a counter value of 4096.

The lower 11 bits of pixel counter 1605, numbered 0 through 10 in FIG. 16, indicate a frame column of pixels. The lower 11 bits are further subdivided into two fields: four horizontal pixel bits 1620 (bits 0 through 3), and seven horizontal pixel page bits 1625 (bits 4 through 10). Horizontal pixel bits 1620 indicate one of 16 pixels horizontally in a pixel page row of a pixel page. Horizontal pixel bits 1620 also indicate a pixel page column. Horizontal pixel page bits 1625 indicate one of 128 pixel pages horizontally. As described above, 128 pixel pages can include a row of 2048 pixels, horizontally (128*16), so some of the pixel pages will not include valid screen pixels and the corresponding memory pages are not used. When incrementing pixel counter 1605, memory controller 1355 increments pixel counter 1605 to pass over these unused spaces. For example, memory controller 1355 increments pixel counter 1605 from 1919 to 2048 at the end of the first frame row of pixels.

The upper 11 bits of pixel counter 1605, numbered 11 through 21, indicate a frame row of pixels. The upper 11 bits are further subdivided into two fields: four vertical pixel bits 1630 (bits 11 through 14), and seven vertical pixel page bits 1635 (bits 15 through 21). Vertical pixel bits 1630 indicate one of 16 pixels vertically in a pixel page column of a pixel page. Vertical pixel bits 1630 also indicate a pixel page row. Vertical pixel page bits 1635 indicate one of 128 pixel pages vertically. As described above, 128 pixel pages can include a column of 2048 pixels, vertically (128*16), so some of the pixel pages will not include valid screen pixels and the corresponding memory locations are not used. When incrementing pixel counter 1605, memory controller 1355 increments and sets pixel counter 1605 to pass over these unused spaces. For example, pixel counter 1605 resets to 0 after the last pixel of the frame, rather than incrementing through $2^{22}-1$.

To calculate address 1610 from pixel counter 1605, memory controller 1355 rearranges the bit fields of counter 1605 as shown in FIG. 16, such as in an address register separate from counter 1605. Horizontal pixel bits 1620 remain in positions 0–3. Horizontal pixel page bits 1625 are shifted from positions 4–10 to positions 8–14. Vertical pixel bits 1630 are shifted from positions 11–14 to positions 4–7. Vertical pixel page bits 1635 remain in positions 15–21. Address 1610 has 22 bits, enough bits to address all $2^{22}$ locations in a 32-bit wide 16 MB SDRAM. Furthermore, bits 0–7 of address 1610 form a column address and bits 8–21 form a page address for the SDRAM. As described above, a GLV typically has 1088 pixels, creating an extra eight rows of pixels, so memory 1310 may store constant data (such as black) for these extra 8 rows of pixels when supplying pixel data to a GLV.

In alternative implementations, an address can be derived from a pixel counter. In one implementation, the address is mathematically derived from the counter value. In another implementation, the counter value is used as an index for a look-up-table of addresses.

Figure 17:
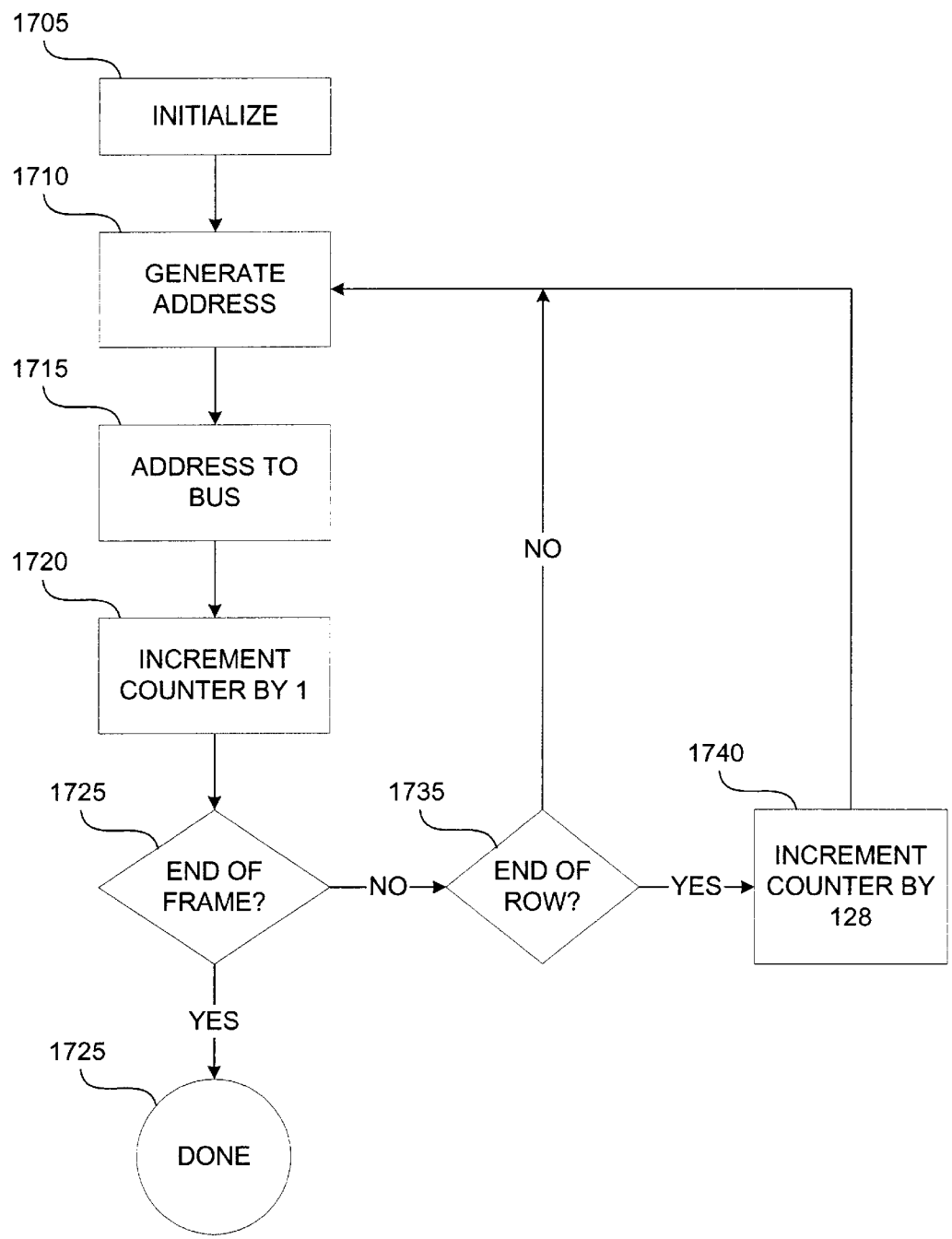
FIG. 17 is a flowchart of generating addresses for storing pixel data for a frame of pixels in an HD resolution implementation according to the present invention.

FIG. 17 is a flowchart of generating addresses for storing pixel data for a frame of pixels in an HD resolution implementation using architecture 1300 in FIG. 13. At the beginning of a frame, memory controller 1355 resets counter 1605 to 0, block 1705. Memory controller 1355 generates address 1610 as described above, block 1710. Memory controller 1355 provides address 1610 to memory address bus 1365, block 1715. Memory controller 1355 increments counter 1605 by 1, block 1720. Memory controller 1355 compares the value of counter 1605 to a maximum frame value to check if the last pixel in the frame has been processed, block 1725. The maximum frame value depends on the implementation (e.g., 2211712 for pixel 2073599 in a 1920×1080 HD resolution frame). If the maximum frame value has been reached, address generation for the current frame is complete, block 1730. If the maximum frame value has not been reached, memory controller 1355 compares the value of the low order 11 bits of counter 1605 to a maximum column value (e.g., 1920) to check if the last pixel in a horizontal row has been processed, block 1735. If the maximum column value has been reached, memory controller 1355 increments counter 1605 by 128 (e.g., from 1920 to 2048), block 1740, and returns to block 1710. In an alternative implementation, memory controller 1355 increments the counter by 128 based on video source 1305 receiving a horizontal synchronization signal. If the maximum column value has not been reached, memory controller 1355 proceeds with block 1710. When storing pixel data for a new frame, memory controller 1355 starts generating addresses again beginning with block 1705.

Figure 18:
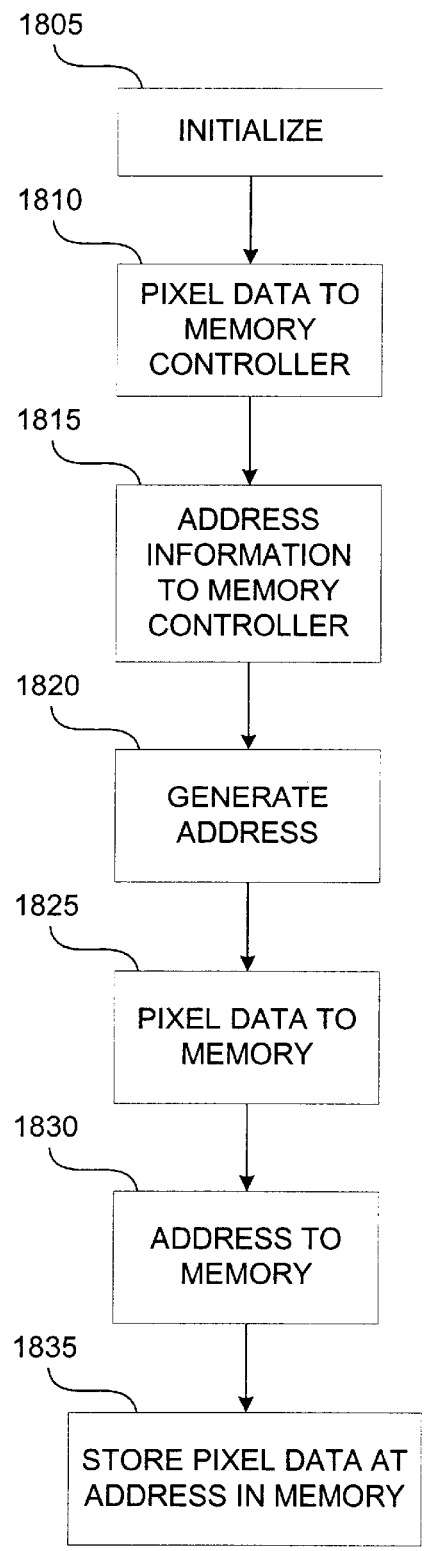
FIG. 18 is a flowchart of storing pixel data according to the present invention.

FIG. 18 is a flowchart of storing pixel data using architecture 1300 in FIG. 13. To store pixel data, memory 1310 is put in write mode and memory controller 1355 is set to provide pixel data from first data bus 1307 to memory 1310, block 1805. Video source 1305 provides pixel data for a first pixel to memory controller 1355 through first data bus 1307, block 1810. Video source 1305 also provides address information to memory controller 1355 through control line 1330, block 1815. The address information indicates that memory controller 1355 is to store data to memory 1310. Alternatively, video source 1305 provides the address information to memory controller 1355 once at the beginning of storage, such as at block 1805. Memory controller 1355 generates the source address as described above to store the pixel data, block 1820. In alternative implementations, video source 1305 can generate the addresses for storing pixel data and pass the addresses to memory controller 1355.

Memory controller 1355 passes the data from first data bus 1307 to memory 1310 through memory data bus 1360, block 1825. Memory controller 1355 provides the address to memory 1310 through memory address bus 1365, block 1830. Memory 1310 stores the pixel data on memory data bus 1360 at the address on memory address bus 1365, block 1835. To store pixel data for the next pixel, video source 1305 returns to block 1810, or to block 1805 to restore the state of architecture 1300 for storage.

Before describing the overall operation of retrieving pixel data from memory 1310, it will be useful to describe examples of implementations of how destination addresses are calculated for retrieving pixel data. Address generation for retrieving pixel data is similar to address generation for storing pixel data, as described above, however pixel data is retrieved corresponding to the vertical order of pixels. Accordingly, the sequence of pixels and corresponding addresses is different, but the correspondence between a pixel and the location storing the pixel data for that pixel is the same.

In an HD resolution implementation, video destination 1325 retrieves pixel data for pixels in this sequence: 0, 1920, 3840, . . . , 28800, 30720, . . . , 1, 1921, 3841, 5761, and so on. Memory controller 1355 generates a destination address for each pixel and provides the address to memory 1310. Referring to FIG. 15, memory controller 1355 generates addresses in the following sequence: 0, 16, 32, . . . , 240, 32768, . . . , 1, 17, and so on.

As described above, in one implementation, memory controller 1355 includes a pixel counter. Memory controller 1355 can use the same 22-bit counter 1605 and generate address 1610 from counter 1605 as described above referring to FIG. 16. Accordingly, address 1610 can be used as a source address (i.e., storing pixel data) or a destination address (i.e., retrieving pixel data) as appropriate. Alternatively, memory controller 1355 includes two counters 1605, using one for generating source addresses and one for generating destination addresses. Memory controller 1355 increments counter 1605 by 2048 for pixel data for each pixel to be retrieved from memory 1310. For example, for pixel 0, the counter is 0. For pixel 1920, the counter is 2048. Memory controller 1355 also increments the counter at the end of each frame column to skip unused pixel pages. Memory controller 1355 can increment the upper 11 bits (i.e., bits 11–21) and the lower 11 bits (i.e., bits 0–10) of counter 1605 separately to provide a row counter and a column counter. Alternatively, counter 1605 can be divided into two separate 11-bit counters. Incrementing the row counter by 1 (the upper 11 bits of counter 1605) is the same as incrementing counter 1605 by 2048. Incrementing the column counter (the lower 11 bits of counter 1605) by 1 is the same as incrementing counter 1605 by 1. Memory controller 1355 generates a destination address for retrieving the pixel data by swapping the bit fields of the counter 1605 as described above, and outputs the address to memory address bus 1365.

Figure 19:
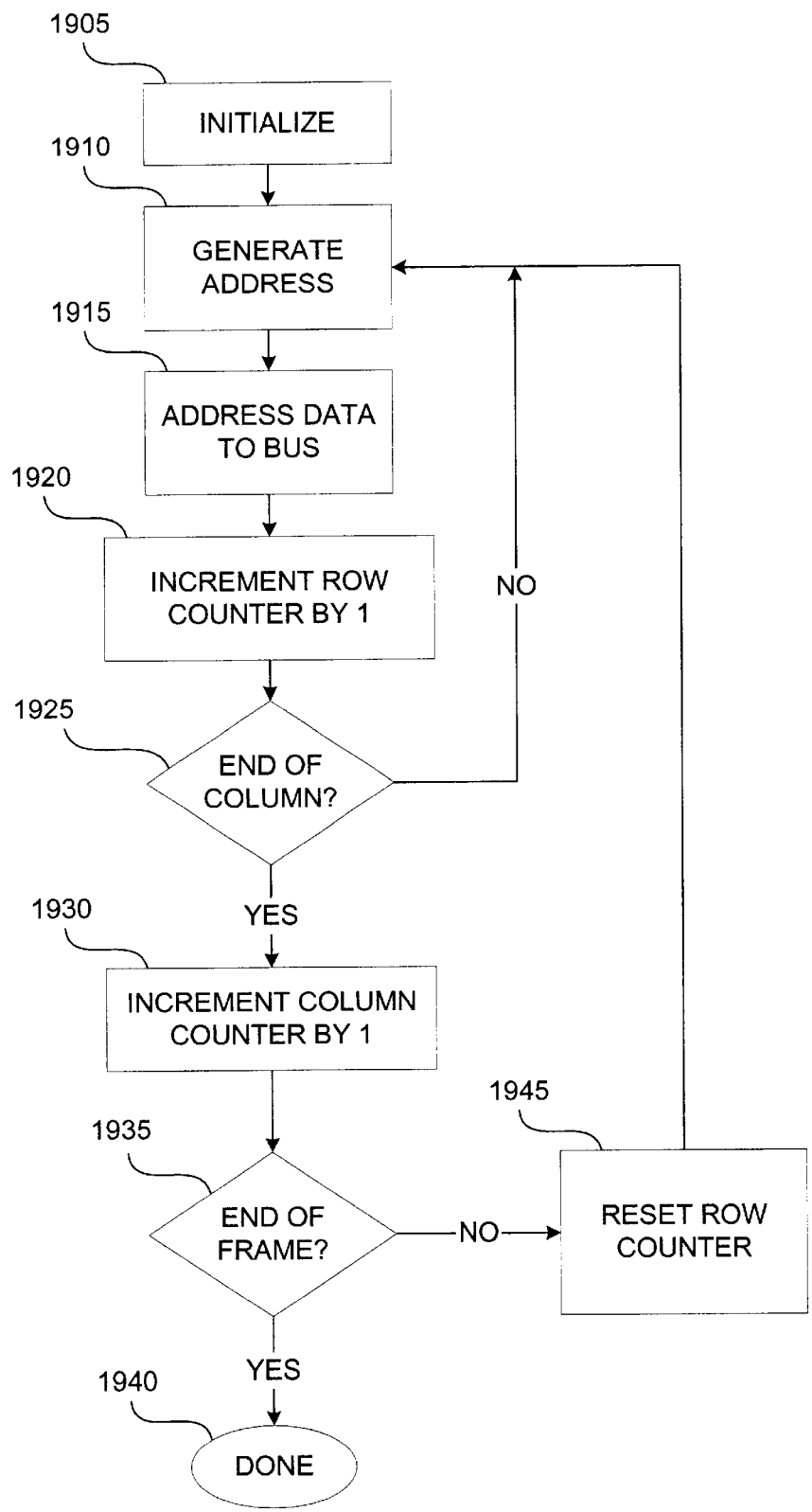
FIG. 19 is a flowchart of generating addresses for retrieving pixel data for a frame of pixels in an HD resolution implementation according to the present invention.

FIG. 19 is a flowchart of generating addresses for retrieving pixel data for a frame of pixels in an HD resolution implementation using architecture 1300 in FIG. 13. At the beginning of a frame, memory controller 1355 resets counter 1605 to 0, block 1905. Memory controller 1355 generates address 1610 as the destination address, as described above, block 1910. Memory controller 1355 provides the destination address to memory address bus 1365, block 1915. Memory controller 1355 increments the row counter of counter 1605 by 1, block 1920. Alternatively, memory controller 1355 increments counter 1605 by 2048. Memory controller 1355 compares the value of the row counter to a maximum row value (e.g., 1080) to check if the end of the vertical column has been reached, block 1925. If the row counter is less than the maximum row value, memory controller 1355 proceeds to block 1910. If the row counter is greater than or equal to the maximum row value, memory controller 1355 increments the column counter of counter 1605 by 1, block 1930. Memory controller 1355 compares the value of the column counter to a maximum column value (e.g., 1920) to check if the end of the frame has been reached, block 1935. If the maximum column value has been reached, address generation for the current frame is complete, block 1940. If the maximum column value has not been reached, memory controller 1355 resets the row counter to 0, block 1945, and proceeds to block 1910. When retrieving pixel data for a new frame, memory controller 1355 starts generating addresses again beginning with block 1905.

Figure 20:
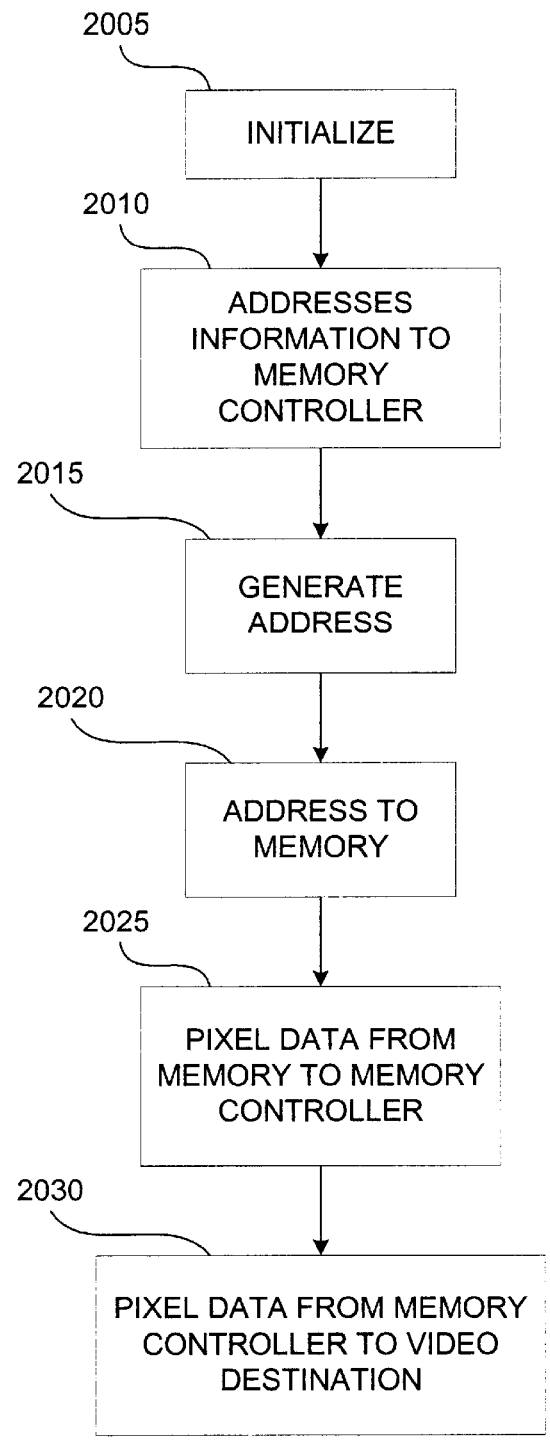
FIG. 20 is a flowchart of retrieving pixel data according to the present invention.

FIG. 20 is a flowchart of retrieving pixel data. To retrieve pixel data, memory 1310 is put in read mode and memory controller 1355 is set to provide pixel data from memory 1310 to second data bus 1327, block 2005. Video destination 1325 provides address information to memory controller 1355 through control line 1335, block 2010. The address information indicates that memory controller 1355 is to read data from memory 1310. Alternatively, video destination 1325 provides the address information to memory controller 1355 once at the beginning of retrieval, such as at block 2005. Memory controller 1355 generates the destination address as described above to retrieve the pixel data, block 2015. In alternative implementations, video destination 1325 can generate the addresses for retrieving pixel data and pass the addresses to memory controller 1355.

Memory controller 1355 provides the destination address to memory 1310 through memory address bus 1365, block 2020. Memory 1310 provides the pixel data stored at the address on memory address bus 1365 to memory controller 1355 through memory data bus 1360, block 2025. Memory controller 1355 provides the pixel data to video destination 1325 through second data bus 1327, block 2030. To retrieve pixel data for the next pixel, video destination returns to block 2010, or to block 2005 to restore the state of architecture 1300 for retrieval.

2. Pixel Pages Using One Memory Device, 120 Pixel Pages by 68 Pixel Pages

In another HD implementation using one memory device, one frame has 8160 pixel pages, 120 horizontally by 68 vertically. One pixel page is 16×16 and has 256 pixels. 8160 pixel pages can include 2,088,960 pixels, which is close to the 2,073,600 pixels in an HD resolution of 1920×1080. This allocation of pixel pages conserves memory use.

The structure and operation of this implementation is similar to architecture 1300 in FIG. 13, as described above, however, address generation is different, as described below. In implementations for different screen resolutions, a number of pixel pages can be allocated to match the number of pixels in each frame row and column. For example, for resolution 1280×720, 3600 pixel pages can be allocated (80 horizontally, 45 vertically; 16×16 pixel pages).

FIG. 21 is a table 2100, similar to table 1000 in FIG. 10 and table 1500 in FIG. 15, showing the relationships among a pixel, a frame row, a frame column, a pixel page, a pixel page row, a pixel page column, a memory page, and a memory address for an HD resolution implementation (1920×1080) using pixel pages 905 in FIG. 9. In FIG. 21, the pixel data for a frame is stored in a single memory device having 256 memory locations per memory page. In addition, FIG. 21 shows only a representative sample of pixels from a frame for clarity. As described above, an HD resolution frame has 2,073,600 pixels.

In table 2100, pixels, frame rows, frame columns, pixel pages, pixel page rows, pixel page columns, and memory pages are numbered in the same way as in table 1000. Column 2105 indicates the number of a pixel for which related information is shown in table 2100. Column 2110 indicates a frame row including the pixel in column 2105. Column 2115 indicates a frame column including the pixel in column 2105. Column 2120 indicates a pixel page including the pixel in column 2105. Column 2125 indicates a pixel page row including the pixel in column 2105. Column 2130 indicates a pixel page column including the pixel in column 2105. Column 2135 indicates a memory page storing pixel data for the pixel in column 2105. Column 2140 indicates a memory address of a memory location storing pixel data for the pixel in column 2105. For example, the first pixel of a frame is pixel 0, in frame row 0 and frame column 0, in pixel page row 0 and pixel page column 0 of pixel page 0, stored at memory address 0 in memory page 0. XXX indicates an invalid screen pixel, frame row, or frame column. Invalid screen pixels, frame rows, and frame columns are outside the dimensions of the screen resolution (e.g., frame rows beyond 1079 in HD resolution 1920×1080). Memory locations are allocated for invalid screen pixels, frame rows, and frame columns in allocated pixel pages, but these memory locations are not used.

As shown in table 2100, pixel 30720 (i.e., the first pixel of the 17$^{th}$ frame row) is in pixel page 120, while in table 1500 pixel 30720 is in pixel page 128. Pixel data for pixel 30720 is stored at address 30720, while in table 1500 pixel data for pixel 30720 is stored at address 32768. As described above, when 128 pixel pages are allocated horizontally, addresses 30720 through 32767 are not used. When 120 pixel pages are allocated horizontally, as in this implementation, these addresses are used. A similar pattern applies to each horizontal row of pixel pages. Accordingly, allocating 120 pixel pages horizontally uses less memory than allocating 128 pixel pages. A similar savings occurs by allocating 68 pixel pages vertically rather than 128 pixel pages. However, as described above, eight pixel page rows in each of the pixel pages in the 68$^{th}$ row of pixel pages do not include valid screen pixels.

Because memory addresses are used differently in this implementation, address generation is different from that described above referring to FIGS. 16, 17, and 19. Memory controller 1355 uses a pixel counter and several state variables to generate an address. Storing and retrieving pixel data is similar to that described above referring to FIGS. 18 and 20, respectively. Pixel data is again stored according to horizontal rows of pixels and retrieved according to vertical columns of pixels. Accordingly, pixel data for the same sequences of pixels is stored and retrieved as those described above. The sequences of addresses are different.

Figure 22:
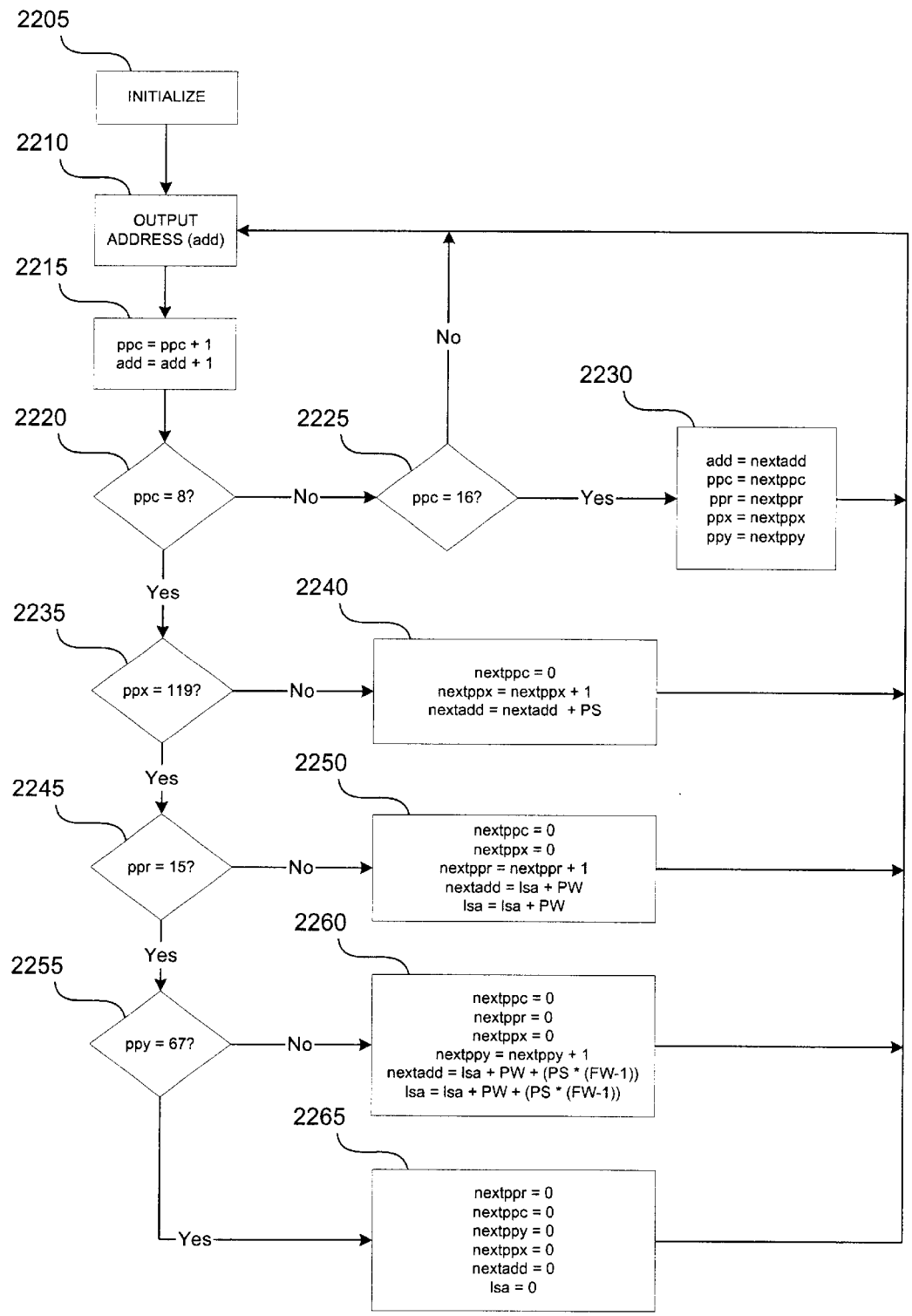
FIG. 22 is a flowchart of generating source addresses for storing pixel data according to the present invention.

FIG. 22 is a flowchart of generating source addresses for storing pixel data. One implementation uses architecture 1300 and allocates 120 pixel pages horizontally and 68 pixel pages vertically. Several counter variables are shown in FIG. 22. These counter variables can be values stored in memory or separate counters. "add" is the address generated and output at block 2210. "ppc" counts pixel page columns. "ppr" counts pixel page rows. "ppx" counts pixel pages horizontally. "ppy" counts pixel pages vertically. "nextadd," "nextppc," "nextppr," "nextppx," "nextppy" are holding variables for assignment. "lsa" holds the left side address for the beginning of a frame row, i.e., the address to start from when generating addresses at the beginning of a row of pixels. Three constants are also shown in FIG. 22. "FW" is the frame width, indicating the number of pixel pages allocated horizontally. FW is 120 in this implementation. "PW" is the page width, indicating the number of memory locations allocated to pixels in one pixel page row. PW is 16 in this implementation. "PS" is the page size, indicating the number of memory locations allocated to pixels in a pixel page. PS is 256 in this implementation. When using a single memory device, PW indicates the number of pixels in a pixel page row, and PS indicates the number of pixels in a pixel page.

At the beginning of storing pixel data for a frame, memory controller 1355 resets the variables add, ppc, ppr, ppx, ppy, nextadd, nextppc, nextppr, nextppx, nextppy, and lsa to 0, block 2205. FW, PW, and PS do not change from frame to frame. Memory controller 1355 outputs the value of add as the address, block 2210. Memory controller 1355 increments ppc and add by 1, block 2215. Memory controller 1355 compares ppc with 8, block 2220. 8 is used because each pixel page is 16 pixels wide and so 8 is the horizontal middle of the pixel page. In some implementations, the amount of time required to perform some of the calculations in FIG. 22 may be more than the amount of time between blocks, and so using 8 as a branching point allows more time for some calculations to complete. Accordingly, processing may move from one block to another in FIG. 22 before the calculation shown in a block has completed. Alternatively, a value other than the horizontal middle of the pixel page can be used.

If ppc does not equal 8, memory controller 1355 checks if the end of a pixel page has been reached by comparing ppc with 16, block 2225. If ppc does not equal 16, the end of the pixel page has not been reached, and memory controller 1355 proceeds to block 2210. If ppc equals 16, the end of the pixel page has been reached. Memory controller 1355 prepares for the next pixel page by assigning counter variables the values of corresponding holding variables, block 2230, and proceeds to block 2210.

Returning to block 2220, if ppc equals 8, memory controller 1355 checks if the last pixel page in the row of pixel pages has been reached by comparing ppx with 119, block 2235. If ppx does not equal 119, the last pixel page in the row has not been reached. Memory controller 1355 prepares holding variables for the end of the pixel page row (to be used in block 2230), block 2240, and proceeds to block 2210.

If ppx equals 119, the last pixel page in the row has been reached, and memory controller 1355 checks if the last pixel page row in the pixel page has been reached by comparing ppr with 15, block 2245. If ppr does not equal 15, the last pixel page row has not been reached. Memory controller 1355 prepares holding variables for the end of the pixel page row (to be used in block 2230), block 2250, and proceeds to block 2210.

If ppr equals 15, the last pixel page row has been reached, and memory controller 1355 checks if the last pixel page in the column of pixel pages has been reached by comparing ppy with 67, block 2255. If ppy does not equal 67, the last pixel page in the column has not been reached. Memory controller 1355 prepares holding variables for the end of the pixel page row (to be used in block 2230), block 2260, and proceeds to block 2210. If ppy equals 67, the last pixel page in the column has been reached. Memory controller 1355 prepares holding variables for the end of the pixel page row (to be used in block 2230), block 2265, and proceeds to block 2210. FIG. 22 shows a continuous loop and so memory controller 1355 continues to follow FIG. 22 from frame to frame for storing pixel data. If memory controller 1355 needs to re-start address generation for storing pixel data, such as to re-initialize the state of address generation, memory controller 1355 starts generating addresses again beginning with block 2205.

Figure 23:
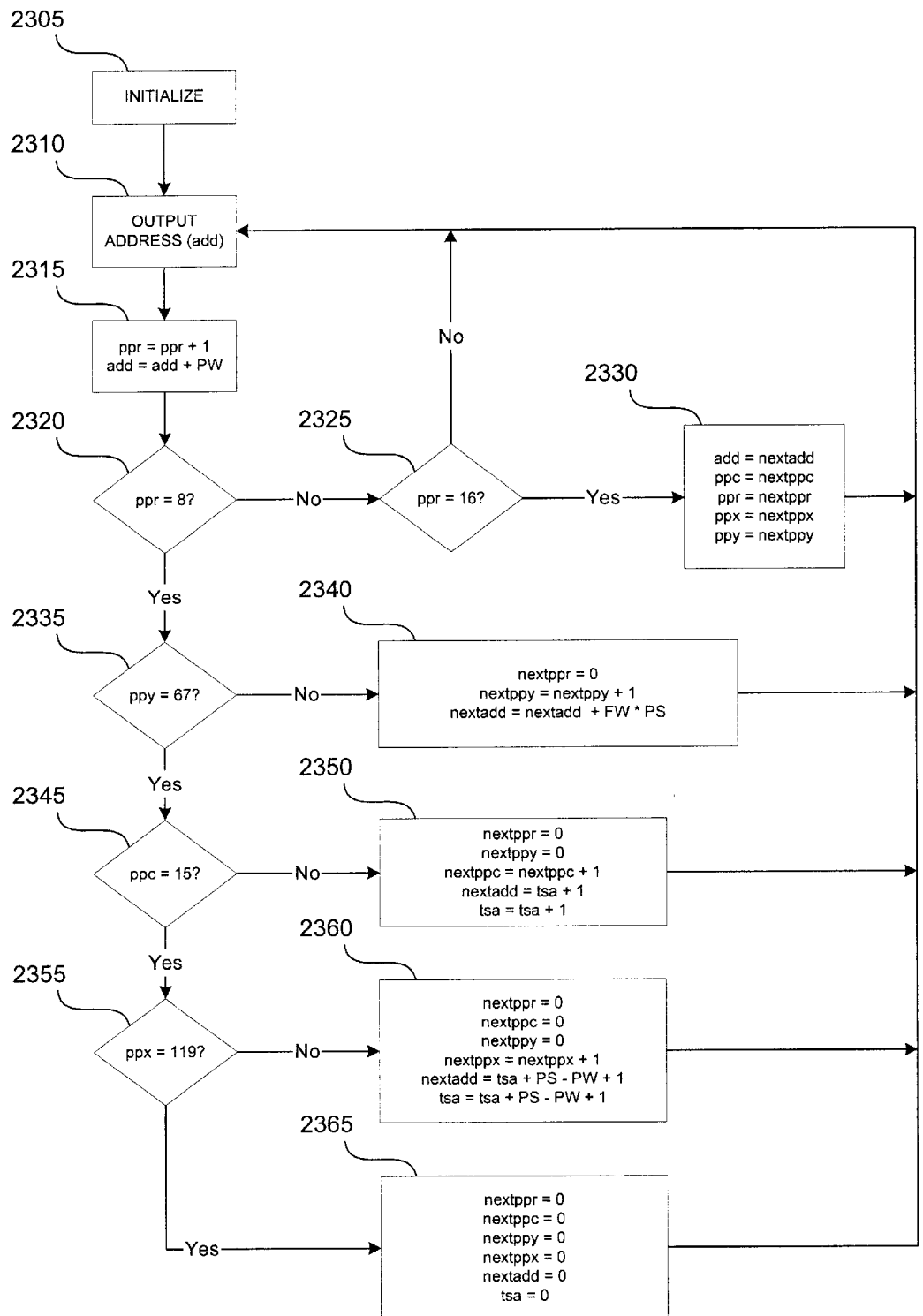
FIG. 23 is a flowchart of generating destination addresses for retrieving pixel data according to the present invention.

FIG. 23 is a flowchart of generating destination addresses for retrieving pixel data. One implementation uses architecture 1300 and allocates 120 pixel pages horizontally and 68 pixel pages vertically. As in FIG. 22, several variables and constants are shown in FIG. 23. "add" is the address generated and output at block 2310. "ppc" counts pixel page columns. "ppr" counts pixel page rows. "ppx" counts pixel pages horizontally. "ppy" counts pixel pages vertically. "nextadd," "nextppc," "nextppr," "nextppx," "nextppy" are holding variables for assignment. "tsa" holds the top side address for the beginning of a frame column, i.e., the address to start from when generating addresses at the beginning of a column of pixels. "FW" is the frame width, indicating the number of pixel pages allocated horizontally. FW is 120 in this implementation. "PW" is the page width, indicating the number of memory locations allocated to pixels in one pixel page row. PW is 16 in this implementation. "PS" is the page size, indicating the number of memory locations allocated to pixels in a pixel page. PS is 256 in this implementation.

At the beginning of retrieving pixel data for a frame, memory controller 1355 resets the variables add, ppc, ppr, ppx, ppy, nextadd, nextppc, nextppr, nextppx, nextppy, and tsa to 0, block 2305. FW, PW, and PS do not change from frame to frame. Memory controller 1355 outputs the value of add as the address, block 2310. Memory controller 1355 increments ppr by 1 and add by PW, block 2315. Memory controller 1355 compares ppr with 8, block 2320. 8 is used because each pixel page is 16 pixels tall and so 8 is the vertical middle of the pixel page. As described above referring to FIG. 22, using 8 as a branching point allows more time for some calculations to complete.

If ppr does not equal 8, memory controller 1355 checks if the end of a pixel page has been reached by comparing ppr with 16, block 2325. If ppr does not equal 16, the end of the pixel page has not been reached, and memory controller 1355 proceeds to block 2310. If ppr equals 16, the end of the pixel page has been reached. Memory controller 1355 prepares for the next pixel page by assigning counter variables the values of corresponding holding variables, block 2330, and proceeds to block 2310.

Returning to block 2320, if ppr equals 8, memory controller 1355 checks if the last pixel page in the column of pixel pages has been reached by comparing ppy with 67, block 2335. If ppy does not equal 67, the last pixel page in the column has not been reached. Memory controller 1355 prepares holding variables for the end of the pixel page column (to be used in block 2330), block 2340, and proceeds to block 2310.

If ppy equals 67, the last pixel page in the column has been reached, and memory controller 1355 checks if the last pixel page column in the pixel page has been reached by comparing ppc with 15, block 2345. If ppc does not equal 15, the last pixel page column has not been reached. Memory controller 1355 prepares holding variables for the end of the pixel page column (to be used in block 2330), block 2350, and proceeds to block 2310.

If ppc equals 15, the last pixel page column has been reached, and memory controller 1355 checks if the last pixel page in the row of pixel pages has been reached by comparing ppx with 119, block 2355. If ppx does not equal 119, the last pixel page in the row has not been reached. Memory controller 1355 prepares holding variables for the end of the pixel page column (to be used in block 2330), block 2360, and proceeds to block 2310. If ppx equals 119, the last pixel page in the row has been reached. Memory controller 1355 prepares holding variables for the end of the pixel page column (to be used in block 2330), block 2365, and proceeds to block 2310. Similar to FIG. 22, FIG. 23 shows a continuous loop and so memory controller 1355 continues to follow FIG. 23 from frame to frame for retrieving pixel data. If memory controller 1355 needs to re-start address generation for retrieving pixel data, such as to re-initialize the state of address generation, memory controller 1355 starts generating addresses again beginning with block 2305.

In alternative implementations, addresses generation for storing and retrieving pixel data can be different from that described above. For example, blocks 2220 and 2225 in FIG. 22 could be combined into a multi-branch block with outgoing paths depending on the value of ppc: one for ppc=8, one for ppc=16, and one for other values of ppc. In any case, the address generation used accommodates the storage pattern created by the pixel pages and the sequences for storing and retrieving data described above.

3. Pixel Pages Using Two Memory Devices, 64 Pixel Pages by 128 Pixel Pages

In another HD implementation, two memory devices are used for storing pixels. Pixel data is stored and retrieved for two pixels at a time. Using two memory devices rather than one can provide increased memory bandwidth. In this implementation, one pixel page is 32×16 and has 512 pixels. Similar to FIG. 11, pixel data for half of the pixels in each pixel page is stored in each of the two memory devices. One frame has 8192 pixel pages, 64 horizontally by 128 vertically, though only 4080 pixel pages include valid screen pixels. As described below, allocating numbers of pixel pages horizontally and vertically that are powers of 2 is convenient for addressing using bit fields.

Figure 24:
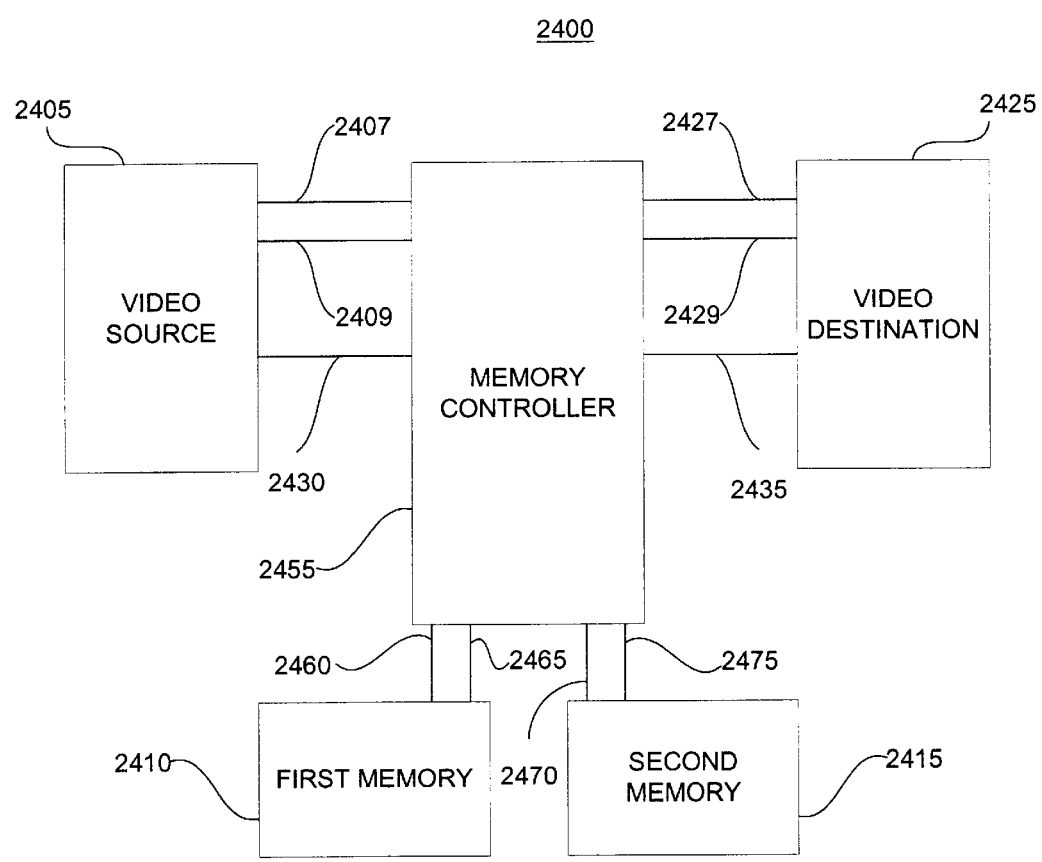
FIG. 24 is a block diagram of a dual pixel frame buffer architecture according to the present invention.

FIG. 24 is a block diagram of a dual pixel frame buffer architecture 2400. Architecture 2400 is similar to architectures 400 and 500 in FIGS. 4 and 5, respectively, however, architecture 2400 includes a memory controller 2455 centrally interconnecting video source 2405, video destination 2425, first memory 2410 and second memory 2415. Memory controller 2455 controls routing pixel data from video source 2405 to memories 2410 and 2415 and routing pixel data from memories 2410 and 2415 to video destination 2425. Memory controller 2455 controls the operation of memories 2410 and 2415, such as the read or write state, and also generates addresses for storing pixel data to and retrieving data from memories 2410 and 2415, as described below. In an alternative implementation, separate address generators for storing and retrieving data provide addresses to memory controller 2455. In another alternative implementation, a separate memory controller is provided for and connected to each memory and generates addresses for the connected memory.

Memory controller 2455 operates to provide the mapping of pixel pages from pixels to memory locations. In aspects other than address generation, architecture 2400 operates similarly to dual pixel architectures 400 and 500, as described above. In alternative implementations, an architecture structurally similar to architecture 400 or architecture 500 can be used (e.g., an architecture including address multiplexors and having address generation controlled by video source and video destination), with the same modifications as described below to address generation to take advantage of pixel pages.

A video source 2405 provides pixel data to a first memory 2410 and to a second memory 2415 in parallel and a video destination 2425 retrieves pixel data from first memory 2410 and from second memory 2415 in parallel. First memory 2410 and second memory 2415 are separate memory devices, such as two 32-bit wide 8 MB SDRAM's (e.g., 2M×32 SDRAM MT48LC2M32B2 by Micron Technology, Inc.). The SDRAM is preferably fast enough to support the data rate needed for the screen resolution, such as 125 MHz or 150 MHz. Other types of memory can also be used, such as DDR SDRAM (double data rate SDRAM) or SGRAM (synchronous graphics RAM). Memories 2410 and 2415 each store half the pixel data of a particular frame.

Video source 2405 receives video data from another source (not shown), such as a broadcast source or a software application running on a computer system connected to video source 2405. Video source 2405 outputs pixel data for pixels two at a time, a first pixel on a first data bus 2407 and a second pixel on a second data bus 2409.

Video destination 2425 provides pixel data to a display system (not shown in FIG. 24), such as data destination 1215 in FIG. 12 implemented as a GLV system. Video destination 2425 receives pixel data for pixels two at a time, a first pixel on a third data bus 2427 and a second pixel on a fourth data bus 2429. Video destination 2425 retrieves pixel data for two columns of pixels in parallel, so video destination 2425 buffers pixel data while sending pixel data to data destination 1215 one column at a time. In another implementation, video destination 2425 provides pixel data for two columns of pixels at a time to data destination 1215. In this case, data destination 1215 buffers the second column while displaying the first. First data bus 2407 and second data bus 2409 are connected to video source 2405 and memory controller 2455. Third data bus 2427 and fourth data bus 2429 are connected to video destination 2425 and memory controller 2455. Memory controller 2455 receives signals from video source 2405 and video destination 2425 through control lines 2430 and 2435, respectively, for addressing, such as indicating whether pixel data is to be stored to or retrieved from memories 2410 and 2415, or horizontal and vertical synchronization signals have been received (e.g., to indicate the end of a frame row of pixels or the end of a frame, respectively). A first memory data bus 2460 and a first memory address bus 2465 are connected to memory controller 2455 and first memory 2410. A second memory data bus 2470 and a second memory address bus 2475 are connected to memory controller 2455 and second memory 2415. First memory 2410 and second memory 2415 also receive control signals (not shown) from memory controller 2455 to control whether memories 2410 and 2415 will read in data (write mode) or read out data (read mode). In addition, while clock lines are not shown in FIG. 24, architecture 2400 operates based on clock cycles so that pixel data can be processed for two pixels per clock cycle in support of the desired pixel rate.

In operation, memories 2410 and 2415 read in or store complementary halves of a frame of pixels as pixel data from video source 2405 and output the pixel data to video destination 2425. Memory controller 2455 controls address generation to map pixel data to memory locations according to a desired pixel page geometry. Architecture 2400 stores and retrieves pixel data similarly to architecture 1300 in FIG. 13, however, two pixels are processed at a time. As described above, pixel data for a frame of pixels from video source 2405 is stored two pixels at a time according to horizontal rows of pixels, and then the pixel data is retrieved two pixels at a time according to vertical columns of pixels and provided to video destination 2425. After the pixel data for the entire frame has been retrieved, pixel data for the next frame is stored, and so on. Some pixel data for the next frame may be buffered, such as in video source 2405, while pixel data for the previous frame is being retrieved. As described below, in alternative implementations, the storage and retrieval can be interleaved or occur in parallel.

Referring again to FIG. 11, for frame 1105, video source 2405 in FIG. 24 would supply pixel data for horizontal pixel pairs to first data bus 2407 and second data bus 2409 in this sequence (first data bus-second data bus): 0–1, 2–3, 4–5, ..., 254–255. Because of memory controller 2455, first memory 2410 would receive this sequence of pixel data: 0, 2, 4, ..., 254. Second memory 2415 would receive this sequence: 1, 3, 5, ..., 255. In contrast, for frame 1105, first memory 2410 would provide pixel data for pixels in this sequence: 0, 16, 32, ..., 238, 254. Second memory 2415 would provide pixel data for pixels in this sequence: 1, 17, 33, ..., 239, 255. Because of memory controller 2455, video destination 2425 would receive pixel data for pixel pairs from third data bus 2427 and fourth data bus 2429 in this sequence (third data bus-fourth data bus): 0–1, 16–17, 32–33, ... 238–239, 254–255. Accordingly, pixel data for the 256 pixels of frame 705 would be stored in 16 memory pages in memories 2410 and 2415. Storing the pixel data would cause 64 page misses (4*16). Retrieving the pixel data would cause 32 page misses (4*8).

Figure 25:
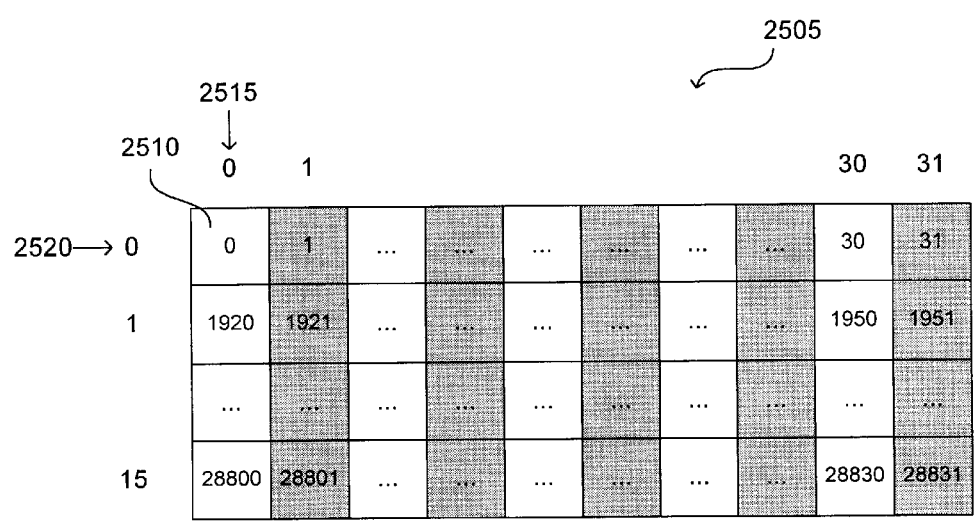
FIG. 25 is a representation of one implementation of a pixel page of pixels in an HD resolution implementation using two memory devices according to the present invention.

FIG. 25 is a representation of one implementation of a pixel page 2505 of pixels 2510 in an HD resolution implementation using two memory devices. Pixel page 2505 is similar to pixel page 905 in FIG. 9, but pixel page 2505 is twice as wide as pixel page 905, and the pixel data is divided between two memory devices, such as memories 2410 and 2415 in FIG. 24. Similar to FIG. 11, unshaded boxes indicate pixels for which pixel data is stored in one memory device and shaded boxes indicate pixels for which pixel data is stored in the other memory device. For example, pixel 0 is stored in first memory 2410 and pixel 1 is stored in second memory 2415. Pixel page 2505 includes 512 pixels 2510, in 32 pixel page columns 2515 (numbered 0 to 31) and 16 pixel page rows 2520 (numbered 0 to 15). A pixel page column 2515 includes 16 pixels 2510 and a pixel page row 2520 includes 32 pixels 2510. For clarity, not every pixel 2510 of pixel page 2505 is shown in FIG. 25. Ellipses indicate intervening pixels 2510.

FIG. 26 is a table 2600, similar to table 1000 in FIG. 10, showing the relationships among a pixel, a frame row, a frame column, a pixel page, a pixel page row, a pixel page column, a memory page, a memory address, and a memory device for an HD resolution implementation (1920×1080) using pixel pages 2505 in FIG. 25. In FIG. 26, the pixel data for a frame is stored in two memory devices, each having 256 memory locations per memory page. In addition, FIG. 26 shows only a representative sample of pixels from a frame for clarity. As described above, an HD resolution frame has 2,073,600 pixels.

In table 2600, pixels, frame rows, frame columns, pixel pages, pixel page rows, pixel page columns, and memory pages are numbered in the same way as in table 1000. Column 2605 indicates the number of a pixel for which related information is shown in table 2600. Column 2610 indicates a frame row including the pixel in column 2605. Column 2615 indicates a frame column including the pixel in column 2605. Column 2620 indicates a pixel page including the pixel in column 2605. Column 2625 indicates a pixel page row including the pixel in column 2605. Column 2630 indicates a pixel page column including the pixel in column 2605. Column 2635 indicates a memory page storing pixel data for the pixel in column 2605. Column 2640 indicates a memory address of a memory location storing pixel data for the pixel in column 2605. Column 2645 indicates which memory device stores pixel data for the pixel in column 2605. The two memory devices are numbered 0 and 1. XXX indicates an invalid screen pixel, frame row, or frame column. Invalid screen pixels, frame rows, and frame columns are outside the dimensions of the screen resolution (e.g., frame rows beyond 1079 in HD resolution 1920× 1080). Memory locations are allocated for invalid screen pixels, frame rows, and frame columns in allocated pixel pages, but these memory locations are not used.

As described above, two pixels have pixel data stored at the same address in different devices. For example, the first pixel of a frame is pixel 0, in frame row 0 and frame column 0, in pixel page row 0 and pixel page column 0 of pixel page 0, stored at memory address 0 in memory page 0 of memory device 0. The second pixel of a frame (horizontally) is pixel 1, in frame row 0 and frame column 1, in pixel page row 0 and pixel page column 1 of pixel page 0, stored at memory address 0 in memory page 0 of memory device 1.

As described above, it is convenient to have the number of pixel pages in each row and in each column be a power of 2 so that addresses can be generated by merging bit fields from counters, however, some memory locations are not used. Some pixel pages at the end of each row of pixel pages do not include valid screen pixels. 64 pixel pages are allocated horizontally to the frame. Each pixel page is 32 pixels wide and so 64 pixel pages can include a row of 2048 pixels horizontally. However, an HD resolution frame is only 1920 pixels wide and so has valid screen pixels for 60 pixel pages, horizontally. As a result, four pixel pages at the end of each row of pixel pages do not include valid screen pixels. For example, pixel 30719 (i.e., the last pixel of the first row of pixel pages) is in pixel page 59 and pixel data for pixel 30719 is stored at address 15359. Pixel 30720 (i.e., the first pixel of the second row of pixel pages) is in pixel page 64 and pixel data for pixel 30720 is stored at address 16384. Pixel pages 60 through 63 do not include valid screen pixels and so memory pages 60 through 63 and corresponding addresses 15360 through 16383 are not used in each memory device.

Similarly, some pixel pages at the end of each column of pixel pages do not include valid screen pixels. 128 pixel pages are allocated vertically to the frame. Each pixel page is 16 pixels tall and so 128 pixel pages can include a column of 2048 pixels vertically. However, an HD resolution frame is only 1080 pixels tall and so has valid screen pixels for 67 pixel pages and 8 pixel page rows of a $68^{th}$ pixel page, vertically. As a result, eight pixel page rows in each of the pixel pages in the $68^{th}$ row of pixel pages (i.e., pixel pages 4288 through 4351) do not include valid screen pixels. For example, pixel 2073599 (i.e., the last pixel of the last frame row) is in pixel page row 7 of pixel page 4347 and pixel data for pixel 2073599 is stored at address 1112959. Pixel page rows 8 through 15 of pixel page 4347 do not include valid screen pixels. However, memory page 4347 includes 256 memory locations with addresses from 1112832 through 1113087. Addresses 1112960 through 1113087 are not used in each memory device. Furthermore, the remaining 60 rows of pixel pages do not include valid screen pixels. Accordingly, addresses 1114112 through 2097151 are not used.

Architecture 2400 stores pixels using a process similar to that described above referring to FIGS. 16, 17, and 18. However, in this implementation, video source 32405 provides pixel data for a horizontal pixel pair to memory controller 2455. Memory controller 2455 stores pixel data for one of the pixels in first memory 2410 and pixel data for the other pixel in second memory 2415. Pixel data for two pixels is stored in parallel in two memories using the same address. Referring to FIG. 11, pixel data for pixel 0 and pixel 1 would be stored at the same time at the same address in first memory 2410 and second memory 2415, respectively. In addition, address generation is different from that described above.

Memory controller 2455 generates one source address for storing pixel data for each horizontal pixel pair. In an HD resolution implementation, video source 2405 stores pixel data for pixels in this sequence: 0, 1, 2, 3, 4, 5, and so on. Referring to FIG. 26, memory controller 2455 generates addresses in the following sequence (one address for each pixel pair): 0, 1, . . . , 15, 256, 257, . . . , 271, 512, . . . , 15119, 16, 17, and so on. As described above, pixel data for pixels in different pixel pages is stored in different memory pages.

In one implementation, memory controller 2455 includes a pixel counter. Memory controller 2455 increments the counter by 1 for pixel data for each pixel received from video source 2405 on data buses 2407 and 2409. For example, for pixel 0, the counter is 0. For pixel 2, the counter is 2. Because pixel data for two pixels is stored in parallel, memory controller 2455 increments the pixel counter twice (or by 2) for each clock cycle. Alternatively, the pixel counter counts pixel pairs and so increments by one for each pixel pair. Memory controller 2455 also increments the counter at the end of each row to skip unused pixel pages. Memory controller 2455 generates an address for storing the pixel data by swapping the bit fields of the counter and outputs the address to memory address buses 2465 and 2475.

To generate a series of source addresses for a frame of pixels, memory controller 2455 uses a process similar to that described above referring to FIG. 17. However, instead of incrementing the counter by one at block 1720, memory controller 2455 increments the counter by two.

Figure 27:
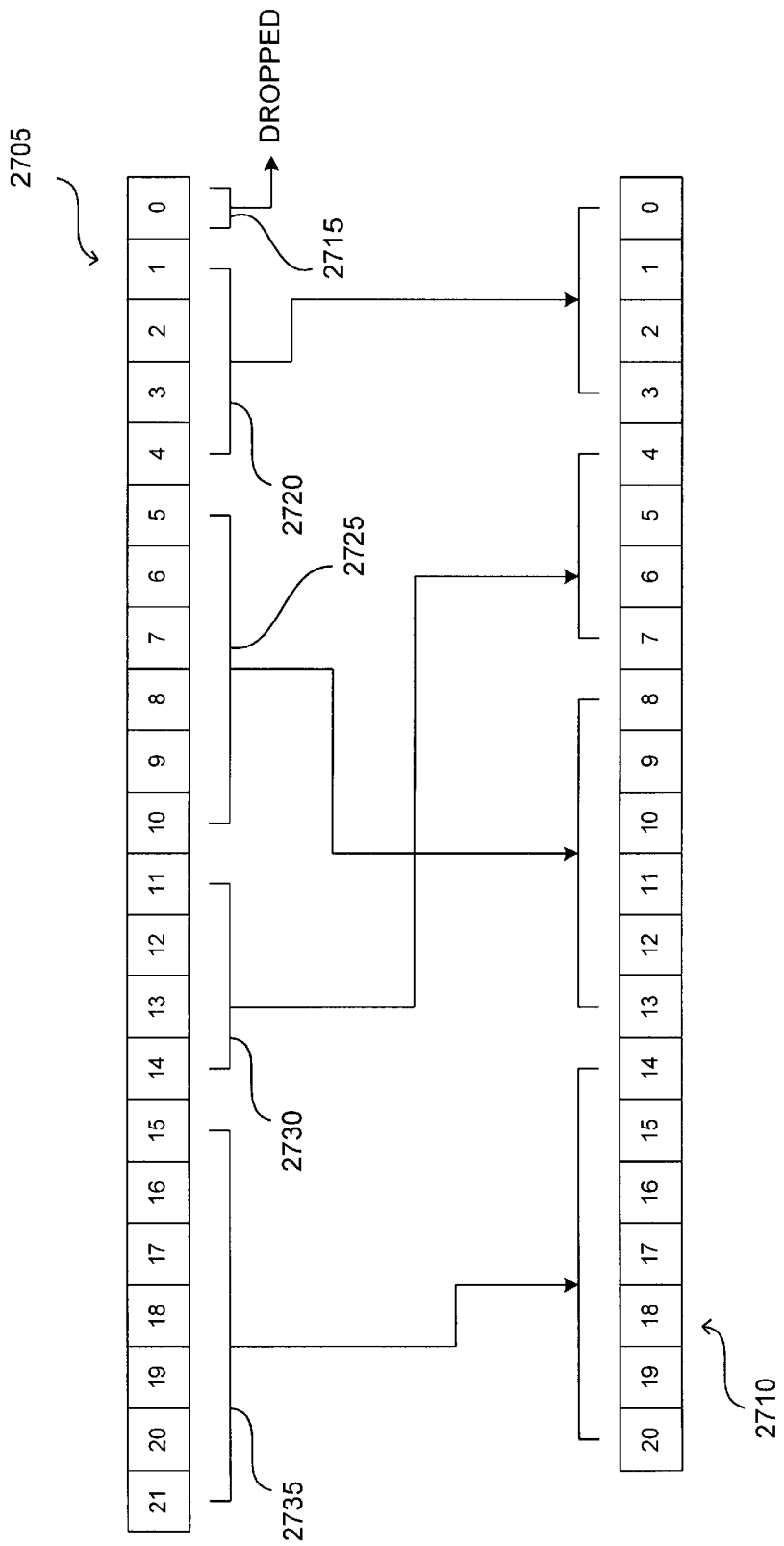
FIG. 27 is a representation of bits in a pixel counter in a memory controller according to the present invention.

FIG. 27 is a representation of bits in a pixel counter 2705 in memory controller 2455. The bits of counter 2705 are re-ordered to create an address 2710. Counter 2705 has 22 bits. Counter 2705 is incremented according to pixels in allocated pixel pages, rather than screen pixel numbers. As described above, 64 horizontal pixel pages (32 pixels wide) can include a row of 2048 pixels. Accordingly, pixel 1920 (i.e., the leftmost pixel in the second frame row from the top of the frame) is indicated by a value of 2048 in counter 2705. Similarly, pixel 3840 is indicated by a counter value of 4096.

The lower 11 bits of pixel counter 2705, numbered 0 through 10 in FIG. 27, indicate a frame column of pixels. The lower 11 bits are further subdivided into three fields: a device bit 2715 (bit 0), four horizontal pixel pair bits 2720 (bits 1 through 4), and six horizontal pixel page bits 2725 (bits 5 through 10). Device bit 2715 indicates one of the pixels of a pixel pair and whether pixel data for the pixel is stored in first memory 2410 or second memory 2415. Device bit 2715 is not used in address 2710 because the pixel data for the respective pixels of a pixel pair is stored at the same address in the respective memories. In an alternative implementation, the address includes device bit 2715 and memories 2410 and 2415 can ignore this bit of the address. Horizontal pixel pair bits 2720 indicate one of 16 pixel pairs horizontally in a pixel page row of a pixel page. For example, pixels 0 and 1 are in pixel pair 0. Device bit 2715 and horizontal pixel pair bits 2720 in combination also indicate a pixel page column. Horizontal pixel page bits 2725 indicate one of 64 pixel pages horizontally. As described above, 64 pixel pages can include a row of 2048 pixels, horizontally (64*32), so some of the pixel pages will not include valid screen pixels and the corresponding memory pages are not used. When incrementing pixel counter 2705, memory controller 2455 increments pixel counter 2705 to pass over these unused spaces. For example, memory controller 2455 increments pixel counter 2705 from 1919 to 2048 at the end of the first frame row of pixels.

The upper 11 bits of pixel counter 2705, numbered 11 through 21, indicate a frame row of pixels. The upper 11 bits are further subdivided into two fields: four vertical pixel bits 2730 (bits 11 through 14), and seven vertical pixel page bits 2735 (bits 15 through 21). Vertical pixel bits 2730 indicate one of 16 pixels vertically in a pixel page column of a pixel page. Vertical pixel bits 2730 also indicate a pixel page row. Vertical pixel page bits 2735 indicate one of 128 pixel pages vertically. As described above, 128 pixel pages can include a column of 2048 pixels, vertically (128*16), so some of the pixel pages will not include valid screen pixels and the corresponding memory pages are not used. When incrementing pixel counter 2705, memory controller 2455 increments and sets pixel counter 2705 to pass over these unused spaces. For example, pixel counter 2705 resets to 0 after the last pixel of the frame, rather than incrementing through $2^{22}-1$.

To calculate address 2710 from pixel counter 2705, memory controller 2455 rearranges the bit fields of counter 2705 as shown in FIG. 27, such as in an address register separate from counter 2705. Memory controller 2455 drops device bit 2705. Horizontal pixel pair bits 2720 are shifted from positions 1–4 to positions 0–3. Horizontal pixel page bits 2725 are shifted from positions 5–10 to positions 8–13. Vertical pixel bits 2730 are shifted from positions 11–14 to positions 4–7. Vertical pixel page bits 2735 are shifted from positions 15–21 to positions 14–20. Address 2710 has 21 bits, enough bits to address all $2^{21}$ locations in a 32-bit wide 8 MB SDRAM. Furthermore, bits 0–7 of address 2710 form a column address and bits 8–20 form a page address for the SDRAM.

Architecture 2400 retrieves pixel data using a process similar to that described above referring to FIGS. 19 and 20. However, in this implementation, video destination 2425 retrieves pixel data for a horizontal pixel pair through memory controller 2455. Memory controller 2455 retrieves pixel data for one of the pixels from first memory 2410 and pixel data for the other pixel from second memory 2415. Pixel data for two pixels is retrieved in parallel from two memories using the same address. Referring to FIG. 11, pixel data for pixel 0 and pixel 1 would be retrieved at the same time from the same address in first memory 2410 and second memory 2415, respectively. As described above, in one implementation video destination 2425 buffers pixel data retrieved to provide pixel data for one column of pixels at a time to data destination 1215 in FIG. 12.

Address generation for retrieving pixel data is similar to address generation for storing pixel data, as described above, however pixel data is retrieved corresponding to the vertical order of pixels. Accordingly, the sequence of pixels and corresponding addresses is different, but the correspondence between a pixel and the location storing the pixel data for that pixel is the same.

In an HD resolution implementation, memory controller 2455 provides video destination 2425 pixel data for pixels on third data bus 2427 and fourth data bus 2429 in this sequence (third data bus-fourth data bus): 0–1, 1920–1921, 3840–3841, . . . , 28800–28801, 30720–30721, . . . , 2–3, 1922–1923, 3842–3843, and so on. Memory controller 2455 generates a destination address for each pixel pair and provides the address to memories 2410 and 2415. Referring to FIG. 26, memory controller 2455 generates addresses in the following sequence: 0, 16, 32, . . . , 240, 16384, . . . , 1, 17, and so on.

As described above, in one implementation, memory controller 2455 includes a pixel counter. Memory controller 2455 can use the same 22-bit counter 2705 and generate address 2710 from counter 2705 as described above referring to FIG. 27. Accordingly, address 2710 can be used as a source address (i.e., storing pixel data) or a destination address (i.e., retrieving pixel data) as appropriate. Alternatively, memory controller 2455 includes two counters 2705, using one for generating source addresses and one for generating destination addresses. Memory controller 2455 increments counter 2705 by 2048 for pixel data for each pixel to be retrieved from memory 2410 (recalling that pixel counter 2705 counts according to pixels in allocated pixel pages, rather than screen pixel number). For example, for pixel 0, the counter is 0. For pixel 1920, the counter is 2048. Memory controller 2455 also increments the counter at the end of each frame column to skip unused pixel pages. Memory controller 2455 can increment the upper 11 bits (i.e., bits 11–21) and the lower 11 bits (i.e., bits 0–10) of counter 2705 separately to provide a row counter and a column counter. Alternatively, counter 2705 can be divided into two separate 11-bit counters. Incrementing the row counter by 1 (the upper 11 bits of counter 2705) is the same as incrementing counter 2705 by 2048. Incrementing the column counter (the lower 11 bits of counter 2705) by 1 is the same as incrementing counter 2705 by 1. Memory controller 2455 generates a destination address for retrieving the pixel data by swapping the bit fields of counter 2705 as described above, and outputs the address to memory address buses 2465 and 2475.

4. Pixel Pages Using Two Memory Device, 60 Pixel Pages by 68 Pixel Pages

In another HD implementation using two memory devices, one frame has 4080 pixel pages, 60 horizontally by 68 vertically. One pixel page is 32×16 and has 512 pixels. Pixel data is stored and retrieved for two pixels at a time.

4080 pixel pages can include 2,088,960 pixels, which is close to the 2,073,600 pixels in an HD resolution of 1920× 1080. This allocation of pixel pages conserves memory use.

The structure and operation of this implementation is similar to architecture 2400 in FIG. 24, as described above, however, address generation is different. Address generation is similar to that described above referring to FIGS. 21, 22, and 23, modified to use pixel pages mapping to two memory devices as shown in FIG. 25. In implementations for different screen resolutions, a number of pixel pages can be allocated to match the number of pixels in each frame row and column.

FIG. 28 is a table 2800, similar to table 2600 in FIG. 26, showing the relationships among a pixel, a frame row, a frame column, a pixel page, a pixel page row, a pixel page column, a memory page, a memory address, and a memory device for an HD resolution implementation (1920×1080) using pixel pages 2505 in FIG. 25. In FIG. 28, the pixel data for a frame is stored in two memory devices, each having 256 memory locations per memory page. In addition, FIG. 28 shows only a representative sample of pixels from a frame for clarity. As described above, an HD resolution frame has 2,073,600 pixels.

In table 2800, pixels, frame rows, frame columns, pixel pages, pixel page rows, pixel page columns, and memory pages are numbered in the same way as in table 1000. Column 2805 indicates the number of a pixel for which related information is shown in table 2800. Column 2810 indicates a frame row including the pixel in column 2805. Column 2815 indicates a frame column including the pixel in column 2805. Column 2820 indicates a pixel page including the pixel in column 2805. Column 2825 indicates a pixel page row including the pixel in column 2805. Column 2830 indicates a pixel page column including the pixel in column 2805. Column 2835 indicates a memory page storing pixel data for the pixel in column 2805. Column 2840 indicates a memory address of a memory location storing pixel data for the pixel in column 2805. Column 2845 indicates which memory device stores pixel data for the pixel in column 2805. XXX indicates an invalid screen pixel, frame row, or frame column. Invalid screen pixels, frame rows, and frame columns are outside the dimensions of the screen resolution (e.g., frame rows beyond 1079 in HD resolution 1920× 1080). Memory locations are allocated for invalid screen pixels, frame rows, and frame columns in allocated pixel pages, but these memory locations are not used.

As shown in table 2800, pixel 30720 (i.e., the first pixel of the $17^{th}$ frame row) is in pixel page 60, while in table 2600 pixel 30720 is in pixel page 64. Pixel data for pixel 30720 is stored at address 15360, while in table 2600 pixel data for pixel 30720 is stored at address 16384. As described above, when 64 pixel pages are allocated horizontally, addresses 15360 through 16383 are not used. When 60 pixel pages are allocated horizontally, as in this implementation, these addresses are used. A similar pattern applies to each horizontal row of pixel pages. Accordingly, allocating 60 pixel pages horizontally uses less memory than allocating 64 pixel pages. A similar savings occurs by allocating 68 pixel pages vertically rather than 128 pixel pages. However, as described above, eight pixel page rows in each of the pixel pages in the $68^{th}$ row of pixel pages do not include valid screen pixels.

Storing and retrieving pixel data is similar to that described above referring to FIGS. 18 and 20, respectively. Pixel data is again stored according to horizontal rows of pixels and retrieved according to vertical columns of pixels. Accordingly, pixel data for the same sequences of pixels is stored and retrieved as those described above. The sequences of addresses are different.

Because memory addresses are used differently in this implementation, address generation is different from that described above referring to FIGS. 17, 19, and 27, but is similar to that described above referring to FIGS. 22 and 23. Memory controller 2455 uses a pixel counter and several state variables to generate an address based on the pixel counter value as described above referring to FIGS. 22 and 23, however, some constants and thresholds are changed to accommodate using two memory devices and pixel pages 2505 as shown in FIG. 25.

Referring to FIG. 22 for generating addresses to store pixel data, one of the three constants is different in this implementation. The frame width (FW) is 60, rather than 120, because the frame is 60 pixel pages wide. The page width (PW) and the page size (PS) remain 16 and 256, respectively, because each pixel page row uses 16 memory locations in each memory device and each memory page has 256 memory locations. In block 2215, ppc is incremented by 2, rather than 1, because pixel data for two horizontally neighboring pixels is stored in parallel. In block 2220, to check for the horizontal middle of the pixel page, ppc is compared to 16, rather than 8, because a pixel page is 32 pixels wide, rather than 16. Similarly, in block 2225, to check for the end of the pixel page, ppc is compared to 32 rather than 16. In block 2235, to check for the horizontally last pixel page in the current row of pixel pages, ppx is compared with 59, rather than 119, because the frame is 60 pixel pages wide, rather than 120. In other respects, memory controller 2455 generates source addresses for storing pixel data in this implementation as shown in FIG. 22 and described above.

Referring to FIG. 23 for generating addresses to retrieve pixel data, the frame width is again changed to 60, rather than 120, and the page width and page size remain 16 and 256, respectively. In block 2345, to check for the last pixel page column in the pixel page, ppc is compared to 30, rather than 15, because the pixel page has 32 pixel page columns, rather than 16. In block 2350, nextppc is incremented by 2, rather than 1, because pixel data for two horizontally neighboring pixels is retrieved in parallel. In block 2355, to check for the last pixel page in the frame, ppx is compared to 59, rather than 119, because the frame is 60 pixel pages wide, rather than 120. In other respects, memory controller 2455 generates destination addresses for retrieving pixel data in this implementation as shown in FIG. 23 and described above.

5. Pixel Pages Using Four Memory Devices and Memory Bank Alternation

Increasing from one memory device to two memory devices in a frame buffer can provide an improvement in memory bandwidth. Similarly, increasing from the two memory devices of architecture 2400 in FIG. 24 to four memory devices can provide a further increase in bandwidth. Furthermore, by dividing four memory devices into two banks of two memory devices each, pixel data can be stored and retrieved in parallel. Pixel data can be stored in one bank of memory devices and, during the same clock cycle, pixel data can be retrieved from the other bank.

Figure 29:
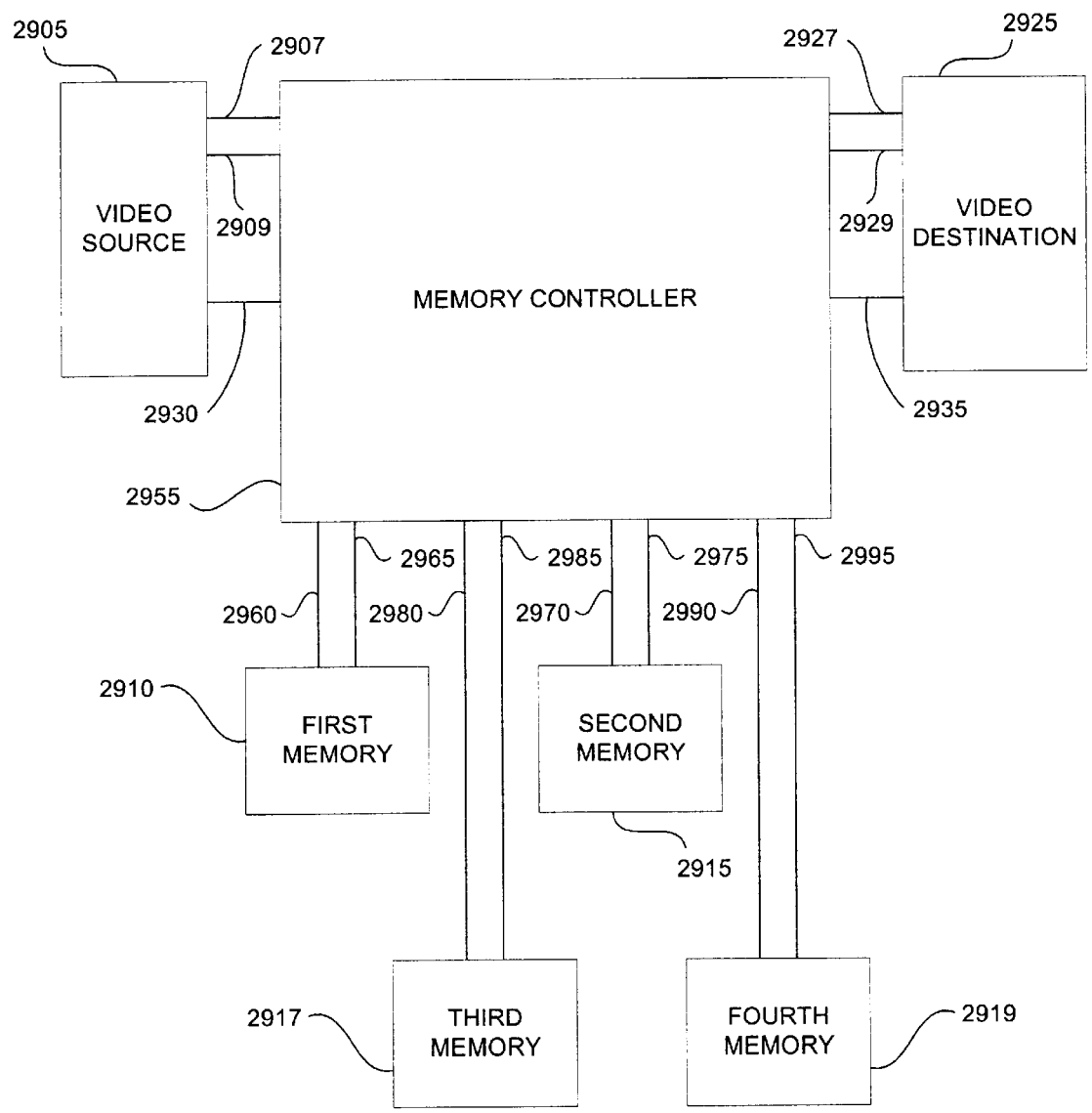
FIG. 29 is a block diagram of a dual pixel frame buffer architecture having four memory devices according to the present invention.

FIG. 29 is a block diagram of a dual pixel frame buffer architecture 2900 having four memory devices: first memory 2910, second memory 2915, third memory 2917, and fourth memory 2919. The memory devices are used in two alternating banks for storing and retrieving pixel data a frame at a time. Pixel data can be stored and retrieved as described above referring to using two memory devices. In an alternative implementation, each bank includes one memory device and pixel data for one pixel is stored while pixel data for one pixel is retrieved. Pixel pages can be allocated according to a power of 2 or to conserve memory space. Accordingly, the operation of storing and retrieving pixel data is similar to that described above for a two memory device implementation, however, the storing and retrieving occurs in parallel using respective memory banks.

For example, a first frame of pixel data is stored, two pixels at a time, in first memory 2910 and second memory 2915, as described above. A second frame of pixel data is then stored in third memory 2917 and fourth memory 2919. While the second frame is being stored, the first frame of pixel data is retrieved from first memory 2910 and second memory 2915, two pixels at a time, as described above. Accordingly, pixel data for the first frame is retrieved at the same time pixel data for the second frame is stored (i.e., during the same clock cycle). During every clock cycle, pixel data for one frame is stored and pixel data previously stored is retrieved. For the next frames, the memory banks are switched. The third frame of pixel data is stored in first memory 2910 and second memory 2915, while the second frame of pixel data is retrieved from third memory 2917 and fourth memory 2919. This alternation between memory banks continues as long as frames are supplied to video source 2905. Because of the increased memory size and simultaneous storage and retrieval, an HD resolution implementation of architecture 2900 using four 32-bit wide 8 MB SDRAM's can be implemented allocating 64 pixel pages horizontally and 128 pixel pages vertically to each frame in each memory and without internally dividing each of the memory devices into sections, as described below referring to FIG. 32.

Architecture 2900 is similar to architecture 2400 in FIG. 24. In architecture 2900, memory controller 2955 controls address generation and routing pixel data to and from memories 2910, 2915, 2917, and 2919 in parallel. Architecture 2900 also has additional memory data buses 2980, 2990 and memory address buses 2985, 2995. Memory controller 2955 has two states: (A) connecting data buses 2907 and 2909 to memories 2910 and 2915, respectively, and data buses 2927 and 2929 to memories 2917 and 2919, respectively; and (B) connecting data buses 2907 and 2909 to memories 2917 and 2919, respectively, and data buses 2927 and 2929 to memories 2910 and 2915, respectively. Accordingly, in state A while memory data buses 2960 and 2970 are providing pixel data to be stored to first memory 2910 and second memory 2915, respectively, memory data buses 2980 and 2990 are providing pixel data retrieved from third memory 2917 and fourth memory 2919, respectively. Conversely, in state B while memory data buses 2960 and 2970 are providing pixel data retrieved from first memory 2910 and second memory 2915, respectively, memory data buses 2980 and 2990 are providing pixel data to be stored to third memory 2917 and fourth memory 2919, respectively. Memory controller 2955 receives a control signal to switch between states, such as from video source 2905 on control line 2930. Video source 2905 toggles the control signal after completing storing pixel data for a frame. In one implementation, memory controller 2955 is connected to a flip-flop that is triggered by a vertical synchronization signal supplied by video source 2905. In addition, while clock lines are not shown in FIG. 29, architecture 2900 operates based on clock cycles so that pixel data can be processed for four pixels per clock cycle in support of the desired pixel rate. In an alternative implementation, separate address generators for storing and retrieving data provide addresses to memory controller 2955. In another alternative implementation, a separate memory controller is provided for and connected to each bank of memory devices and generates addresses for the connected memory devices.

Figure 30:
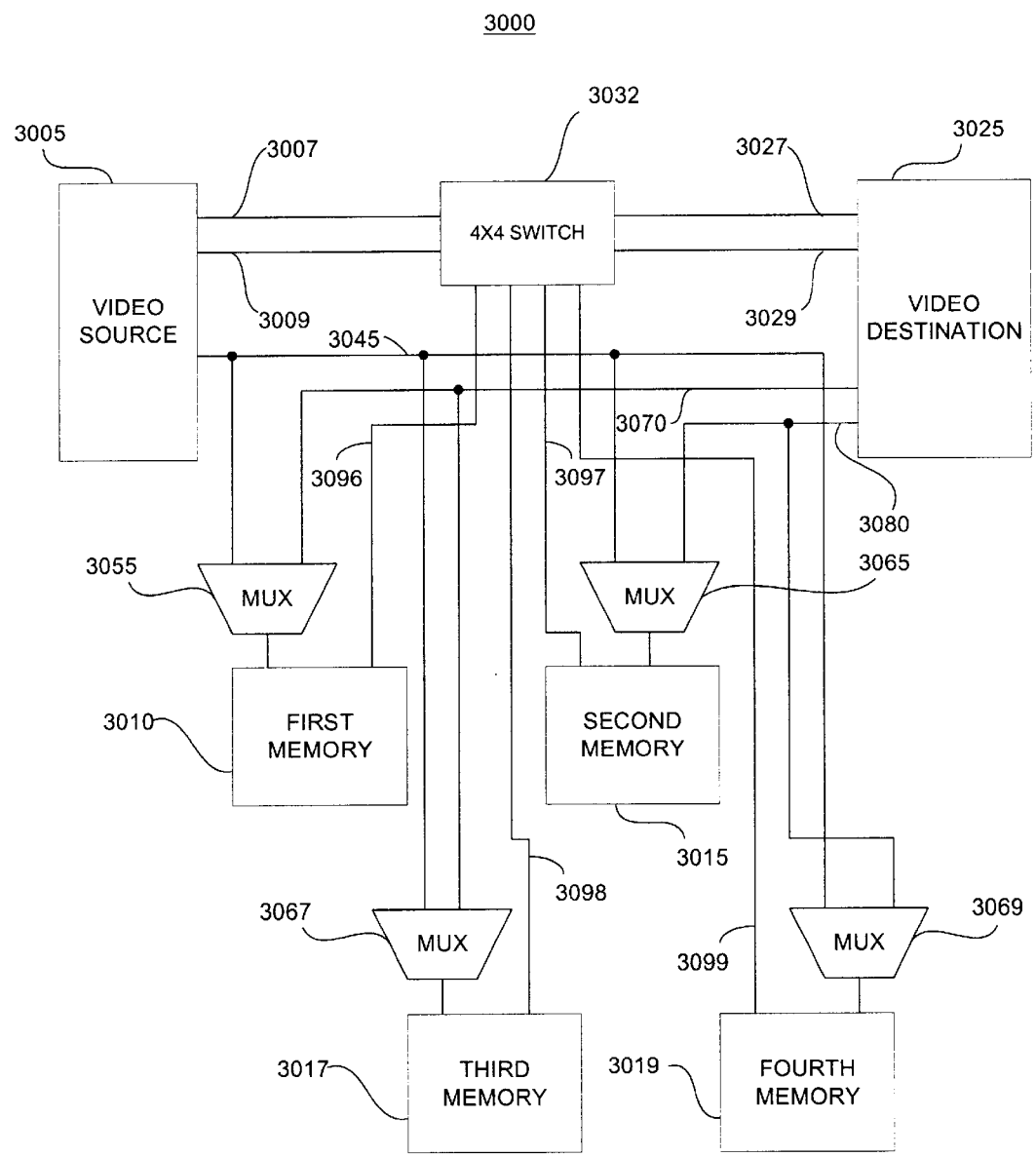
FIG. 30 is a block diagram of a frame buffer architecture including a 4×4 data switch and four address multiplexors according to the present invention.

In an alternative implementation, memory controller 2955 is replaced by address multiplexors and a data switch. FIG. 30 is a block diagram of a frame buffer architecture 3000 including a 4×4 data switch 3032 and four address multiplexors 3055, 3065, 3067, and 3069. Architecture 3000 operates similarly to architecture 2900, however, address generation is controlled by video source 3005 and video destination 3025 for storing and retrieving pixel data, respectively. Architectures 2900 and 3000 are related similarly to how architectures 1300 and 1400 of FIGS. 13 and 14, respectively, are related. In another implementation, a pair of memory controllers can be used to replace pairs of address multiplexors 3055, 3065 and 3067, 3069.

Addresses are generated by video source 3005 and video destination 3025 and passed to memories 3010, 3015, 3017, 3019 through address multiplexors 3055, 3065, 3067, and 3069, respectively. Address multiplexors 3055, 3065, 3067, and 3069 receive control signals to select an input, such as from video source 3005.

4×4 data switch 3032 controls routing pixel data among video source 3005, memories 3010, 3015, 3017, 3019, and video destination 3025. 4×4 switch 3032 is connected to memories 3010, 3015, 3017, and 3019 by memory buses 3096, 3097, 3098, and 3099, respectively. 4×4 data switch 3032 has states A and B, as described above for memory controller 2955: (A) connecting data buses 3007 and 3009 to memories 3010 and 3015, respectively, and data buses 3027 and 3029 to memories 3017 and 3019, respectively; and (B) connecting data buses 3007 and 3009 to memories 3017 and 3019, respectively, and data buses 3027 and 3029 to memories 3010 and 3015, respectively. 4×4 switch 3032 receives a control signal (not shown) to switch between states, such as from video source 3005. States A and B can also be used to control the input selection of address multiplexors 3055, 3065, 3067, and 3069.

Figure 31:
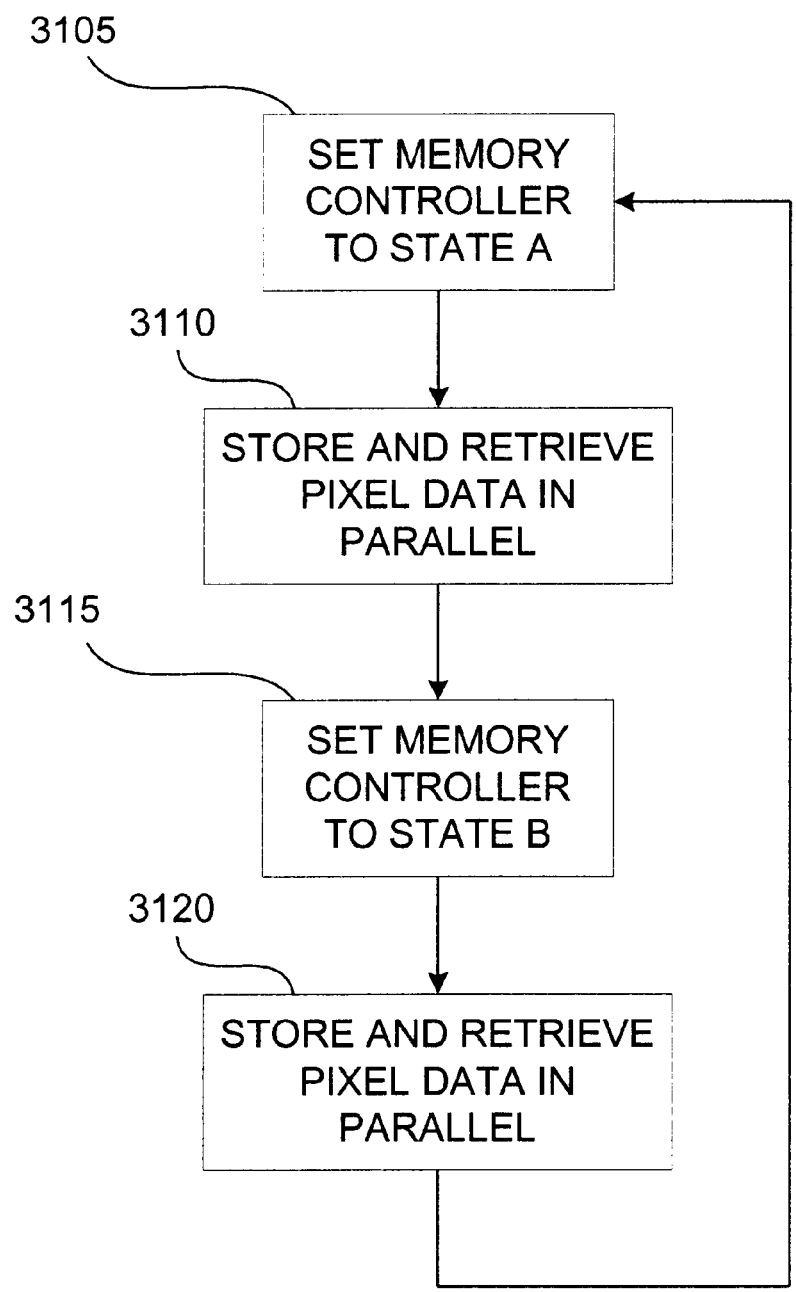
FIG. 31 is a flowchart of storing and retrieving pixel data in parallel using bank alternation according to the present invention.

FIG. 31 is a flowchart of storing and retrieving pixel data in parallel using bank alternation, such as in architecture 2900 of FIG. 29. When a first frame of pixel data becomes available to video source 2905, video source 2905 sets memory controller 2955 to state A (pixel data to be stored to first memory 2910 and second memory 2915, pixel data to be retrieved from third memory 2917 and fourth memory 2919), block 3105. Memory controller 2955 stores the first frame of pixel data, two pixels at a time, in first memory 2910 and second memory 2915, as described above, and memory controller 2955 retrieves pixel data from third memory 2917 and fourth memory 2919, as described above, block 3110. Initially, pixel data has not been stored in memories 2917 and 2919, and so pixel data retrieved during the first loop may not produce a desirable image. After a frame of pixel data has been stored, video source 2905 sets memory controller 2955 to state B (pixel data to be retrieved from first memory 2910 and second memory 2915, pixel data to be stored to third memory 2917 and fourth memory 2919), block 3115. Memory controller 2955 stores a frame of pixel data and retrieves pixel data for another frame according to the state of memory controller 2955, as described above, block 3120. After a frame of pixel data has been stored, video source 2905 returns to block 3105 and sets memory controller 2955 to state A. When a new frame is not available to video source 2905, storing and retrieving pixels from architecture 2900 is complete. When a new frame later becomes available, video source 2905 begins at block 3105 again.

6. Pixel Pages Using Memory Sections

In another implementation, the memory address space is divided into two sections. This division applies to each memory device. As described above referring to double-buffering, one section of each memory is used for storing pixel data and the other section for retrieving pixel data. The sections switch roles with each frame. The operation of architecture 2400 of FIG. 24 modified to use memory sections is described below, through other architectures can also use memory sections as described below, such as architecture 1300 of FIG. 13.

Memories 2410 and 2415 each store pixel data for complementary halves of two frames at a time. Memories 2410 and 2415 are divided in half. For example, where memories 2410 and 2415 are 32-bit wide 8 MB SDRAM's, a first section of addresses (0 through 1,048,575) is for one frame and a second section of addresses (1,048,576 through 2,097,151) is for another frame. As described above, in HD resolution, half of one frame has 1,036,800 pixels and so a 32-bit wide 8 MB SDRAM is sufficiently large for half of each of two frames. However, where 8192 32×16 pixel pages are allocated to each frame (64×128 pixel pages for the frame), half of each of two frames does not fit into a 32-bit 8 MB SDRAM, and so either less pixel pages would be allocated, such as 4080 (60×68), or a larger memory (e.g., 16 MB) would be required.

While one frame is being stored in one section, another frame is being retrieved from the other section, such as in alternating series of read and write operations. After processing these frames has completed, pixel data for a new frame is read into the section storing the frame just read out, and pixel data for the frame just stored is read out. In this way, the sections alternate between reading and writing. To generate addresses for storing pixels, memory controller 2455 alternates between beginning at address 0 and the middle of the available address space (e.g., 1,048,576) with each frame to alternate between the two sections of memory. Similarly, memory controller 2455 alternates between starting at address 0 and the middle of the available address space with each frame to be retrieved.

In addition, pixel data can be stored and retrieved in alternation for blocks of pixels smaller than an entire frame. For example, in one implementation, memory controller 2455 includes two FIFO buffers: a source FIFO buffer for pixel data to be stored, and a destination FIFO buffer for pixel data retrieved. As memory controller 2455 receives pixel data from video source 2405, memory controller 2455 fills its source FIFO buffer. At regular intervals, such as when the FIFO buffer is full or after pixel data for a number of pixels has been placed in the FIFO buffer, memory controller 2455 stores pixel data for a block of pixels from its FIFO buffer, such as the first 32 pixels in the FIFO buffer, generating appropriate addresses for a series of write operations. After this block has been stored, memory controller 2455 retrieves pixel data for a block of pixels, such as 32 pixels, generating appropriate addresses for a series of read operations from memories 2410 and 2415, and stores the pixel data in its destination FIFO buffer. At regular intervals, such as when the FIFO buffer is full or after pixel data for a number of pixels has been placed in the FIFO buffer, memory controller 2455 provides pixel data from the destination FIFO buffer to video destination 2425. After retrieving the block of pixel data, memory controller 2455 stores the next block of pixel data, and so on. Memory controller 2455 preserves the counter values for address generation between blocks to accommodate this block-based processing.

In another implementation, video source 2405 and video destination 2425 control use of memory sections. Video source 2405 and video destination 2425 each include a FIFO buffer. As video source 2405 receives pixel data, video source 2405 fills its FIFO buffer. At regular intervals, such as when the FIFO buffer is full or after pixel data for a number of pixels has been placed in the FIFO buffer, video source 2405 causes pixel data for a block of pixels from its FIFO buffer, such as the first 32 pixels in the FIFO buffer, to be stored and memory controller 2455 generates the appropriate addresses for a series of write operations. After this block has been stored video source 2405 passes control to video destination 2425. Video destination 2425 causes memory controller 2455 to generate addresses, retrieves pixel data for a block of pixels, such as 32 pixels, in a series of read operations from memories 2410 and 2415, and stores the pixel data in its own FIFO buffer. Video destination 2425 then passes control back to video source 2405, and so on. Memory controller 2455 preserves the counter values for address generation between blocks to accommodate this block-based processing.

Figure 32:
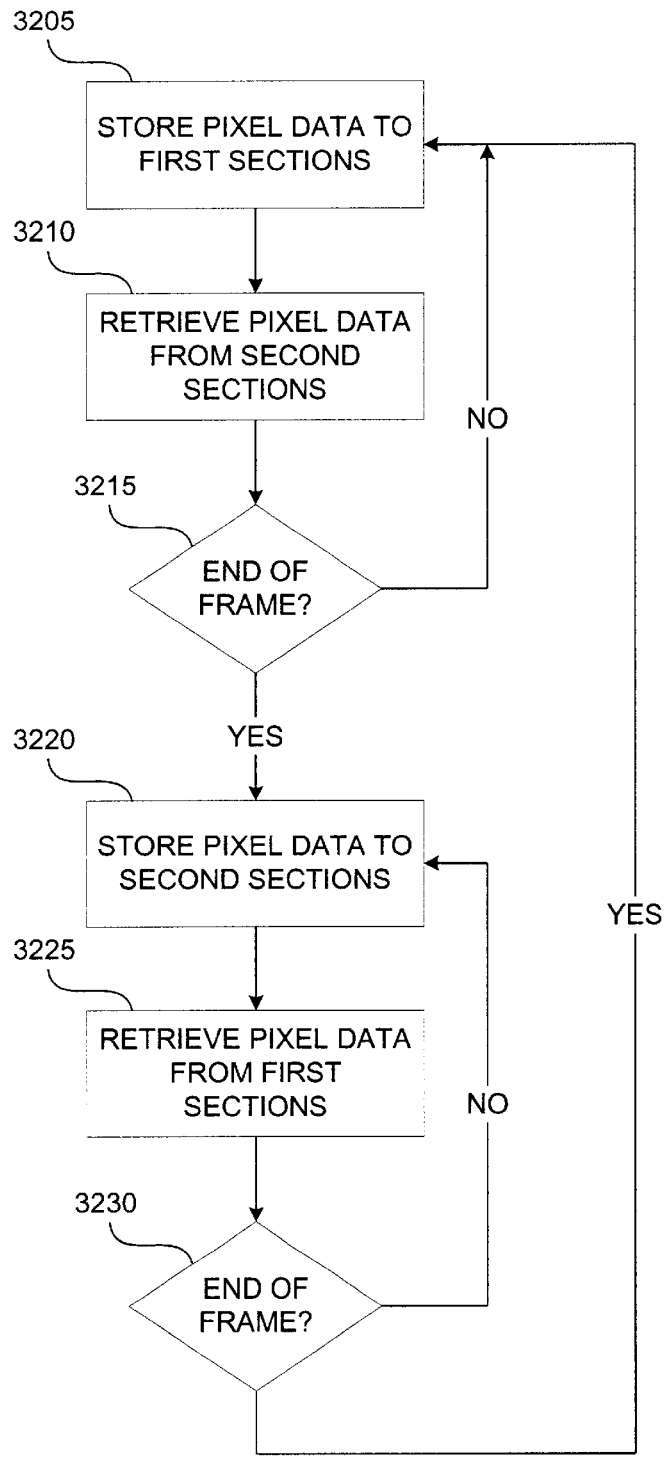
FIG. 32 is a flowchart of reading and writing blocks of pixels using memory sections according to the present invention.

FIG. 32 is a flowchart of reading and writing blocks of pixels using memory sections. When memory controller 2455 has received pixel data for a block of pixels from a first frame, such as 32 pixels, memory controller 2455 stores the pixel data in the first sections (e.g., starting from address 0) of memories 2410 and 2415 in a series of write operations, block 3205. Memory controller 2455 retrieves pixel data for a block of pixels from a previous frame, such as 32 pixels, from the second sections (e.g., starting from the middle of the memory address space, such as 1,048,576) of memories 2410 and 2415, block 3210. Initially, while the very first frame is being stored to the first sections, the second sections will have undefined data and so pixel data retrieved from the second sections during this first iteration will most likely not produce a desirable image, but this situation will only last while the first frame is being stored. Memory controller 2455 checks whether the end of the frame being stored has been reached, such as based on a vertical synchronization signal, block 3215. If the end of the frame has not been reached, memory controller 2455 returns to block 3205 and stores pixel data for the next block of pixels in the first sections of memories 2410 and 2415. If the end of the frame has been reached, memory controller 2455 stores pixel data for the next block of pixels from the next frame in the second sections of memories 2410 and 2415, block 3220. Memory controller 2455 retrieves pixel data for a block of pixels from the first sections of memories 2410 and 2415, block 3225. Memory controller 2455 checks whether the end of the frame being stored has been reached, block 3230. If the end of the frame has not been reached, memory controller 2455 returns to block 3220 and stores pixel data for the next block of pixels in the second sections of memories 2410 and 2415. If the end of the frame has been reached, memory controller 2455 returns to block 3205 and stores pixel data for the first block of pixels from the next frame in the first sections of memories 2410 and 2415. This alternation continues until memory controller 2455 does not receive pixel data from video source 2405.

7. Pixel Pages Using Burst Accessing

Many types of SDRAM provide burst accessing or a burst mode. Burst accessing is a well known technique in memory devices for accessing memory locations that are in the same page. One type of conventional burst accessing is sequential burst accessing. In sequential burst accessing, memory locations are accessed that have consecutive addresses (e.g., addresses 0, 1, 2, 3). Another type of burst accessing is interleaved burst accessing. In interleaved burst accessing, a series of tightly grouped memory locations are accessed (e.g., addresses 1, 0, 3, 2).

Using one type of sequential burst accessing, an initial starting address is supplied with information indicating a burst access and a burst length. For example, a request can be made to access the first eight locations of a page of memory (e.g., starting address 0 and burst length 8). The SDRAM accesses a series of locations beginning with the starting address. The SDRAM generates a series of column addresses internally by incrementing from the supplied starting address by one for each location to be accessed. The additional addresses are not externally supplied to the SDRAM and so the address bus is available during the burst accessing. The SDRAM stops the burst accessing after accessing a number of locations equal to the supplied burst length. Typical burst lengths include 2, 4, and 8. Because the address bus for the SDRAM is available during the burst access, the address bus can be used for other instructions to the SDRAM.

A single SDRAM can have multiple banks, such as two or four. For example, 2M×32 SDRAM MT48LC2M32B2 by Micron Technology, Inc., has four banks. The memory locations are divided among the available banks. Each bank is a separate physical unit and one page can be active in each bank. In an SDRAM having four banks, four pages can be active at the same time. As described above, a delay occurs between requesting a new page to become active and when the new page is active. This delay can be avoided or hidden in an SDRAM using multiple banks. While accessing an active page in a first bank, a request is made to activate a page in a second bank. During the time needed to bring the second page active, the first page continues to be accessed. By properly timing the request to activate the second page, when the second page is first accessed, the second page will already be active. In order to activate the second page while accessing the first page, the request can be made while a burst access is being made to the first page. As described above, during burst accessing the address bus is available. The request to activate the second page can be made while the address bus is available. At the end of the burst access to the first page, the second page is active in the second bank and the second page can be accessed without a delay after the last access to the first page. Accordingly, sequential burst accessing can be used to avoid page misses when accessing a series of memory locations having consecutive addresses.

In one implementation, pixel data for horizontally adjacent pixel pages is stored in different banks of the SDRAM. For example, in an HD implementation using pixel pages 905 in FIG. 9, pixel data for the pixel page including pixel 0 is in a first bank (e.g., bank 0). Pixel data for the pixel page including pixel 16 is in a second bank (e.g., bank 1). Pixel data for the pixel page including pixel 32 is in the first bank. This pattern continues throughout the pixel pages 905 of the frame. Alternatively, different bank allocations can be used, such as using four banks throughout the frame, or two banks in the first half of the frame and two banks in the second half of the frame. Accordingly, while a page in one bank is being accessed using a burst access, a page in a different bank is being activated to be accessed.

For example, referring to FIGS. 9 and 15, a pixel page 905 is 16 pixels wide and so the 16 pixels in a pixel page row have sequential memory addresses. Pixel data for pixels 0–15 are stored at addresses 0–15. Accordingly, using a burst length of 8 locations, pixel data for pixels 8–15 can be stored using a single memory access command requesting a burst access beginning with address 8. The memory device would store pixel data to the memory locations having addresses 8–15 over 8 clock cycles. During those 8 clock cycles, the data bus of the memory device would be busy, but during the last 7 of the 8 clock cycles the address bus would be free. Another memory access command can be supplied to the memory device using the address bus requesting to store data at address 256, in a new page in a different bank. Because of the burst accessing, the delay in switching between memory pages would be hidden and so a delay for a page miss would not occur at the boundary of the first pixel page. Accordingly, the page misses in storing pixel data can be hidden. However, this burst accessing would not hide page misses in retrieving pixel data using pixel pages because the pixel data is retrieved from addresses that are not consecutive (recalling that, as described above, locations storing pixel data for vertically adjacent pixels do not have consecutive addresses).

8. Pixel Pages Using Alternating Sweeping

Returning to FIG. 12, in an alternative implementation, data destination 1215 is a GLV system that displays one column at a time, sweeping from left to right and right to left alternately with each frame projected. In this case, the address generation for retrieving pixel data from memory used in the memory controller or video destination (such as memory controller 1355 in FIG. 13, or video destination 1425 in FIG. 14) is modified. In one implementation, based on the counter systems described above, when scanning left to right in HD resolution, a column counter increments from 0 to 1919. When scanning from right to left the counter decrements from 1919 to 0. The video destination uses the row counters in the same way as described above. The counter system of the video source for storing pixels is also unchanged.

9. Pixel Pages Using Different Input and Rates

The rates at which pixels are stored and retrieved are different in some implementations. For example, referring to FIG. 29, in one implementation, memory controller 2955 stores pixel data for 32-pixel blocks and retrieves pixel data for 64-pixel blocks in the same amount of time (e.g., retrieving pixel data for two pixels every clock cycle and storing pixel data for two pixels every other clock cycle). In this case, memory controller 2955 causes a frame to be displayed twice. Memory controller 2955 retrieves pixel data for an entire frame in the same time that video source 2905 has provided half of the pixel data for a new frame. Memory controller 2955 then retrieves pixel data for the same frame again while video source 2905 provides pixel data for the second half of the new frame. In one HD resolution implementation, the input pixel rate would be 150 MP/S and the output pixel rate would be 300 MP/S, for a total of 450 MP/S. Accordingly, a four memory device architecture, such as architecture 2900 in FIG. 29, can be used, such as with four 150 MHz or faster SDRAM's.

Various illustrative implementations of the present invention have been described. The above description focuses on HD resolution video data displayed using a GLV system, but the methods and apparatus can be applied to different resolutions and different devices, as well as data other than video data. Similarly, the pixel data for a pixel is described above as being 32 bits, but different depths are also possible with modification to the size of the addressed memory locations. In addition, while implementations using pixel pages based on two orders of accessing have been described, buffer pages can be formed to accommodate three or more orders of accessing as well. The present invention can be implemented in electronic circuitry, computer hardware, software, or in combinations of them. For example, a frame buffer using pixel pages can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A buffer page system, comprising:
    a data source, providing data elements in a first order;
    a data destination, receiving data elements in a second order;
    at least one memory device, each memory device having a plurality of memory pages including a plurality of memory locations, each memory location having an address; and
    where each data element corresponds to an entry in one of a plurality of buffer pages,
    where each buffer page has a plurality of entries along a first dimension corresponding to the first order and a plurality of entries along a second dimension corresponding to the second order,
    where data elements are stored according to the first order using blocks of buffer pages, each block having a number of buffer pages equal to a power of 2,
    where data elements are stored to the memory device in the first order and retrieved from the memory device in the second order, and
    where at least one memory page stores data elements in multiple locations according to the first order and stores data elements in multiple locations according to the second order;
    where at least one buffer page does not include any data elements;
    where the buffer pages are pixel pages, each pixel page having a plurality of pixel page rows and a plurality of pixel page columns;
    a first number of pixel pages are allocated horizontally to include all of the pixels in a horizontal row of pixels in the frame, and the first number is a power of 2,
    a second number of pixel pages are allocated vertically to include all of the pixels in a vertical column of pixels in the frame, and
    a total number of pixel pages are allocated to include all of the pixels in the frame, and the total number is equal to the product of the first number and the second number.

2. The buffer page system of claim 1, where each memory page corresponds to a respective pixel page.

3. The buffer page system of claim 1, where a data element is pixel data corresponding to a pixel in a frame of pixels, the frame having horizontal rows of pixels and vertical columns of pixels.

4. The buffer page system of claim 1, where each row of the frame includes 1920 pixels and each column of the frame includes 1080 pixels.

5. The buffer page system of claim 1, where each pixel has 32 bits of pixel data.

6. The buffer page system of claim 1, where the first number is 128.

7. The buffer page system of claim 1, where the first number is 64.

8. The buffer page system of claim 1, where the second number is a power of 2.

9. The buffer page system of claim 8, where the second number is 128.

10. The buffer page system of claim 1, further comprising a memory controller for generating addresses for storing and retrieving data elements.

11. A buffer page system, comprising:
    a data source, providing data elements in a first order;
    a data destination, receiving data elements in a second order;
    at least one memory device, each memory device having a plurality of memory pages including a plurality of memory locations, each memory location having an address; and
    where each data element corresponds to an entry in one of a plurality of buffer pages,
    where each buffer page has a plurality of entries along a first dimension corresponding to the first order and a plurality of entries along a second dimension corresponding to the second order,
    where data elements are stored according to the first order using blocks of buffer pages, each block having a number of buffer pages equal to a power of 2,
    where data elements are stored to the memory device in the first order and retrieved from the memory device in the second order, and
    where at least one memory page stores data elements in multiple locations according to the first order and stores data elements in multiple locations according to the second order;
    where at least one buffer page does not include any data elements;
    where the buffer pages are pixel pages, each pixel page having a plurality of pixel page rows and a plurality of pixel page columns;
    the buffer page system further comprising a counter for generating addresses for storing and retrieving pixel data.

12. The buffer page system of claim 11, where the counter counts pixels.

13. The buffer page system of claim 11, where addresses are generated by rearranging bit fields of the counter.

14. The buffer page system of claim 13, where:
    bits 0–3 of an address are bits 0–3 of the counter,
    bits 4–7 of the address are bits 11–14 of the counter,
    bits 8–14 of the address are bits 4–10 of the counter, and
    bits 15–21 of the address are bits 15–21 of the counter.

15. The buffer page system of claim 13, where:
    bits 0–3 of an address are bits 1–4 of the counter,
    bits 4–7 of the address are bits 11–14 of the counter,
    bits 8–13 of the address are bits 5–10 of the counter, and
    bits 14–20 of the address are bits 15–21 of the counter.

16. The buffer page system of claim 11, further comprising a source counter for generating addresses for storing pixel data, and a destination counter for generating addresses for retrieving pixel data.

17. A pixel page system, comprising:
    a video source providing pixel data for pixels in a frame, the frame having rows of pixels and columns of pixels;
    a video destination;
    a first memory having a plurality of memory locations;
    a second memory having a plurality of memory locations;
    a memory controller connected to the first memory and the second memory;
    a first data bus connected to the memory controller;

a second data bus connected to the memory controller;

a source address line connected to the video source and the memory controller;

a destination address line connected to the video destination and the memory controller; and where each pixel corresponds to an entry in one of a plurality of pixel pages, and at least one pixel page includes multiple pixels from a row in the frame and multiple pixels from a column in the frame, where pixel data is stored according to horizontal rows of pixels using blocks of pixel pages, each block having a number of pixel pages equal to a power of 2, and where each entry in a pixel page corresponds to a memory location;

a first number of pixel pages are allocated horizontally to include all of the pixels in a horizontal row of pixels in the frame, and the first number is a power of 2, a second number of pixel pages are allocated vertically to include all of the pixels in a vertical column of pixels in the frame, and the second number is a power of 2, a total number of pixel pages are allocated to include all of the pixels in the frame, and the total number is equal to the product of the first number and the second number.

18. The pixel page system of claim 17, where the memory controller generates addresses for storing and retrieving pixel data.

19. The pixel page system of claim 17, further comprising a counter for generating addresses for storing and retrieving pixel data.

20. The pixel page system of claim 19, where addresses are generated by rearranging bit fields of the counter.

21. A method of storing pixel data, comprising:

receiving pixel data for a frame of pixels, where the frame includes multiple horizontal rows of pixels; and storing the pixel data in a memory system according to pixel pages, where each pixel page corresponds to a respective page of memory, where at least one pixel page includes pixels from multiple horizontal rows of pixels, and where pixel data is stored according to horizontal rows of pixels using blocks of pixel pages, each block having a number of pixel pages equal to a power of 2; and a first number of pixel pages are allocated horizontally to include all of the pixels in a horizontal row of pixels in the frame, and the first number is a power of 2, a second number of pixel pages are allocated vertically to include all of the pixels in a vertical column of pixels in the frame, and the second number is a power of 2, a total number of pixel pages are allocated to include all of the pixels in the frame, and the total number is equal to the product of the first number and the second number.

22. The method of claim 21, further comprising a counter for generating addresses for storing and retrieving pixel data.

23. The method of claim 22, where addresses are generated by rearranging bit fields of the counter.

24. The method of claim 21, further comprising:

providing pixel data from a video source to a memory controller;

generating a source address in the memory controller, where the source address is a memory address for storing the pixel data;

providing the pixel data to the memory system;

providing the source address to the memory system; and storing the pixel data in the memory system at the source address.

25. A method of storing pixel data, comprising:

receiving pixel data for a frame of pixels, where the frame includes multiple horizontal rows of pixels; and storing the pixel data in a memory system according to pixel pages, where each pixel page corresponds to a respective page of memory, where at least one pixel page includes pixels from multiple horizontal rows of pixels, and where pixel data is stored according to horizontal rows of pixels using blocks of pixel pages, each block having a number of pixel pages equal to a power of 2;

the method further comprising a counter for generating addresses for storing and retrieving pixel data; and the method further comprising:

generating an address;

providing the address to a memory bus;

incrementing the counter by 1;

checking for the end of the frame of pixels;

checking for the end of a row of pixels; and incrementing the counter by 128.

26. A method of retrieving pixel data, comprising:

generating addresses for retrieving from a memory system pixel data for a frame of pixels according to pixel pages, where the frame includes multiple horizontal rows of pixels, where each pixel page corresponds to a respective page of memory, where at least one pixel page includes pixels from multiple horizontal rows of pixels, and where pixel data is stored in the memory system according to horizontal rows of pixels using blocks of pixel pages, each block having a number of pixel pages equal to a power of 2; and retrieving the pixel data from the memory system using the generated addresses;

a first number of pixel pages are allocated horizontally to include all of the pixels in a horizontal row of pixels in the frame, and the first number is a power of 2, a second number of pixel pages are allocated vertically to include all of the pixels in a vertical column of pixels in the frame, and the second number is a power of 2, a total number of pixel pages are allocated to include all of the pixels in the frame, and the total number is equal to the product of the first number and the second number.

27. The method of claim 26, further comprising a counter for generating addresses for storing and retrieving pixel data.

28. The method of claim 27, where the counter includes a row counter and a column counter.

29. The method of claim 27, where addresses are generated by rearranging bit fields of the counter.

30. The method of claim 26, further comprising:

generating a destination address in a memory controller, where the destination address is a memory address for retrieving pixel data;

providing the destination address to the memory system;

providing pixel data from the memory system stored at the destination address to the memory controller.

31. A method of retrieving pixel data, comprising:

generating addresses for retrieving from a memory system pixel data for a frame of pixels according to pixel pages, where the frame includes multiple horizontal rows of pixels, where each pixel page corresponds to a respective page of memory, where at least one pixel page includes pixels from multiple horizontal rows of pixels, and where pixel data is stored in the memory system according to horizontal rows of pixels using blocks of pixel pages, each block having a number of pixel pages equal to a power of 2; and retrieving the pixel data from the memory system using the generated addresses;

the method further comprising a counter for generating addresses for storing and retrieving pixel data;

where the counter includes a row counter and a column counter;

the method further comprising:
generating an address;
providing the address to a memory bus;
incrementing the row counter by 1;
checking for the end of a column of pixels;
incrementing the column counter by 1;
checking for the end of the frame of pixels; and
resetting the row counter.

32. A system for storing pixel data, comprising:

means for receiving pixel data for a frame of pixels, where the frame includes multiple horizontal rows of pixels; and means for storing the pixel data in a memory system according to pixel pages, where each pixel page corresponds to a respective page of memory, where at least one pixel page includes pixels from multiple horizontal rows of pixels, and where pixel data is stored according to horizontal rows of pixels using blocks of pixel pages, each block having a number of pixel pages equal to a power of 2;

where:
a first number of pixel pages are allocated horizontally to include all of the pixels in a horizontal row of pixels in the frame, and the first number is a power of 2,
a second number of pixel pages are allocated vertically to include all of the pixels in a vertical column of pixels in the frame, and the second number is a power of 2,
a total number of pixel pages are allocated to include all of the pixels in the frame, and the total number is equal to the product of the first number and the second number.

33. A system for retrieving pixel data, comprising:

means for generating addresses for retrieving from a memory system pixel data for a frame of pixels according to pixel pages, where the frame includes multiple horizontal rows of pixels, where each pixel page corresponds to a respective page of memory, where at least one pixel page includes pixels from multiple horizontal rows of pixels, and where pixel data is stored in the memory system according to horizontal rows of pixels using blocks of pixel pages, each block having a number of pixel pages equal to a power of 2; and means for retrieving the pixel data from the memory system using the generated addresses;

where:
a first number of pixel pages are allocated horizontally to include all of the pixels in a horizontal row of pixels in the frame, and the first number is a power of 2,
a second number of pixel pages are allocated vertically to include all of the pixels in a vertical column of pixels in the frame, and the second number is a power of 2,
a total number of pixel pages are allocated to include all of the pixels in the frame, and the total number is equal to the product of the first number and the second number.

34. A system for storing pixel data, comprising:

means for receiving pixel data for a frame of pixels, where the frame includes multiple horizontal rows of pixels;

means for storing the pixel data in a memory system according to pixel pages, where each pixel page corresponds to a respective page of memory, where at least one pixel page includes pixels from multiple horizontal rows of pixels, and where pixel data is stored according to horizontal rows of pixels using blocks of pixel pages, each block having a number of pixel pages equal to a power of 2;

a counter for generating addresses for storing and retrieving pixel data;

means for generating an address;
means for providing the address to a memory bus;
means for incrementing the counter by 1;
means for checking for the end of the frame of pixels;
means for checking for the end of a row of pixels; and
means for incrementing the counter by 128.

35. A system for retrieving pixel data, comprising:

means for generating addresses for retrieving from a memory system pixel data for a frame of pixels according to pixel pages, where the frame includes multiple horizontal rows of pixels, where each pixel page corresponds to a respective page of memory, where at least one pixel page includes pixels from multiple horizontal rows of pixels, and where pixel data is stored in the memory system according to horizontal rows of pixels using blocks of pixel pages, each block having a number of pixel pages equal to a power of 2;

means for retrieving the pixel data from the memory system using the generated addresses;

a counter for generating addresses for storing and retrieving pixel data;

where the counter includes a row counter and a column counter;

means for generating an address;
means for providing the address to a memory bus;
means for incrementing the row counter by 1;
means for checking for the end of a column of pixels;
means for incrementing the column counter by 1;
means for checking for the end of the frame of pixels; and
means for resetting the row counter.

* * * * *

UNITED STATES PATENT AND TRADEMARK OFFICE
CERTIFICATE OF CORRECTION

PATENT NO. : 6,791,557 B2
DATED : September 14, 2004
INVENTOR(S) : Champion

It is certified that error appears in the above-identified patent and that said Letters Patent is hereby corrected as shown below:

Column 41,
Line 39, insert after "page columns;" beginning a new paragraph -- where: --.

Column 43,
Line 15, insert after "memory locations;" beginning a new paragraph -- where: --.

Column 44,
Line 38, insert after "addresses;" beginning a new paragraph -- where: --.

Signed and Sealed this

Second Day of August, 2005

JON W. DUDAS
*Director of the United States Patent and Trademark Office*